United States Patent
Dosaka et al.

(10) Patent No.: US 8,077,492 B2
(45) Date of Patent: Dec. 13, 2011

(54) SEMICONDUCTOR MEMORY DEVICE

(75) Inventors: Katsumi Dosaka, Chiyoda-ku (JP);
Kazutami Arimoto, Chiyoda-ku (JP);
Kazunori Saito, Chiyoda-ku (JP);
Hideyuki Noda, Chiyoda-ku (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 448 days.

(21) Appl. No.: 12/268,017

(22) Filed: Nov. 10, 2008

(65) Prior Publication Data
US 2009/0070525 A1    Mar. 12, 2009

Related U.S. Application Data

(63) Continuation of application No. 11/517,441, filed on Sep. 8, 2006, now Pat. No. 7,463,501.

(30) Foreign Application Priority Data

Sep. 12, 2005    (JP) .................................. 2005-263674

(51) Int. Cl.
*G11C 15/00*    (2006.01)
(52) U.S. Cl. .................. 365/49.1; 365/49.16; 365/49.17; 365/49.18
(58) Field of Classification Search .................. 365/49.1, 365/49.16, 49.17, 49.18
See application file for complete search history.

(56) References Cited

U.S. PATENT DOCUMENTS

| | | | |
|---|---|---|---|
| 6,690,595 B1 * | 2/2004 | Srinivasan et al. | 365/49.17 |
| 6,728,124 B1 * | 4/2004 | Ichiriu et al. | 365/49.15 |
| 6,807,077 B2 | 10/2004 | Noda et al. | |
| 7,050,317 B1 | 5/2006 | Lien et al. | |
| 7,283,380 B1 * | 10/2007 | Srinivasan et al. | 365/49.17 |
| 7,463,501 B2 * | 12/2008 | Dosaka et al. | 365/49.1 |
| 7,730,234 B2 * | 6/2010 | Cho | 710/33 |
| 2005/0285862 A1 | 12/2005 | Noda et al. | |
| 2006/0143428 A1 | 6/2006 | Noda et al. | |

FOREIGN PATENT DOCUMENTS

| | | |
|---|---|---|
| JP | 10-74141 A | 3/1998 |
| JP | 2004-171658 A | 6/2004 |
| JP | 2004-520668 | 7/2004 |
| JP | 2004-358719 A | 12/2004 |
| WO | WO 02/43068 A2 | 5/2002 |

* cited by examiner

*Primary Examiner* — Pho M Luu
(74) *Attorney, Agent, or Firm* — Buchanan Ingersoll & Rooney PC

(57) ABSTRACT

A CAM (Content Addressable Memory) cell includes first and second data storage portions storing data, horizontal port write gates for storing data applied through a match line pair in the data storage portions in a data write through a horizontal port, and search/read gates for driving the match lines of the match line pair in accordance with the data stored in the data storage portions in a search operation and in a data read through the horizontal port. The match lines are used as horizontal bit line pair, or signal lines for accessing the horizontal port. As the first and second data storage portions are used, it becomes possible to store ternary data, and accordingly, a write mask function of inhibiting a data write at a destination of data transfer is realized. Further, as the CAM cell is used, an arithmetic/logic operation following a search process can be executed selectively, and high speed data writing/reading becomes possible.

6 Claims, 29 Drawing Sheets

WRITE TO MC MASKED
WHEN BOTH ARE H

SEMICONDUCTOR MEMORY DEVICE

CROSS REFERENCE TO RELATED APPLICATION

This application is a continuation of U.S. application Ser. No. 11/517,441 filed Sep. 8, 2006 now U.S. Pat. No. 7,463,501, issued Dec. 9, 2008, which claims the benefit of application No. 2005-263674 filed in Japan on Sep. 12, 2005, the contents of which are hereby incorporated by reference.

BACKGROUND OF THE INVENTION

1. Field of the Invention

The present invention relates to a semiconductor memory device and, specifically, to a content addressable memory (CAM) storing ternary data. More specifically, the present invention relates to a CAM having an orthogonal transformation function of transposing rows and columns of a multi-bit data arrangement.

Particularly, the present invention relates to a semiconductor memory device realizing the orthogonal transformation function of transforming arrangement between external data and the processed data, in a semiconductor signal processing device having a parallel operation processing function.

2. Description of the Background Art

Recently, along with wide spread use of portable terminal equipment, digital signal processing allowing high speed processing of a large amount of data such as voice and image comes to have higher importance. For such digital signal processing, generally, a DSP (Digital Signal Processor) is used as a dedicated semiconductor device. Digital signal processing of voice and image data includes data processing such as filtering, which frequently requires arithmetic operations with repetitive sum-of-products operations. Therefore, a general DSP is configured to have a multiplication circuit, an adder circuit and a register for storing data before and after the operations. When such a dedicated DSP is used, the sum-of-products operation can be executed in one machine cycle, enabling a high-speed arithmetic/logic operation.

In the DSP, data words are processed successively. Therefore, when the amount of data to be processed is very large, even a dedicated DSP is insufficient to achieve dramatic improvement in performance. By way of example, when the data to be operated includes 10,000 sets and an operation of each data set can be executed in one machine cycle, at least 10,000 cycles are necessary to finish the operation. Therefore, when data are processed serially using a dedicated DSP and the amount of data increases, the time of processing increases in proportion thereto, and therefore, it becomes difficult to achieve high speed processing.

An SIMD (Single Instruction Multiple Data) processor has been known in which a plurality of data items are processed in parallel in accordance with one same instruction, in order to process a large amount of data at high speed. In the SIMD processor, in accordance with a common instruction, different data items are processed in parallel in a plurality of element processors. An arrangement using a content addressable memory (CAM) for searching and executing a process on a data item that satisfies certain conditions in an SIMD processor is disclosed in Reference 1 (Japanese Patent National Publication No. 2004-520668: WO2002/043068).

In Reference 1, a memory cell is formed of an N channel MOS transistor (insulated gate type field effect transistor), and complementary data are stored in the memory cell. Data writing/reading to and from the memory cell is executed by using a bit line. The bit line is also used as a search line, and the search line is driven dependent on match/mismatch between the search data and the stored data. As the search line, two search lines are provided, and a "1-match line" indicating that data "1" matches, and a "0-match" line that is driven when data "0" match between the search data and the stored data are provided. Using these two search lines, which of the data "1" and "0" matches is determined.

Reference 1 also shows an arrangement in which the bit/search line is selectively connected to a storage node of a memory cell in accordance with a write enable signal, in order to realize a write mask, by selectively writing data to each of the memory cells. According to Reference 1, a parallel memory array of CAM cells storing data in parallel and allowing a search of parallel data, and a serial bit array orthogonal to the parallel memory array are arranged, and data are transmitted to the parallel memory array in accordance with the data stored in the serial bit array, so that selective parallel writing to bits at specific positions of the parallel data word becomes possible.

Further, Reference 2 (Japanese Patent Laying-Open No. 10-074141) shows an arrangement aimed at high speed processing such as DCT (Discrete Cosine Transform) of image data. In the arrangement shown in Reference 2, image data are input in a bit-parallel and word-serial sequence, that is, by the word (pixel data) unit, and thereafter, the data are converted to word-parallel and bit-serial data by a serial/parallel converter circuit and written to a memory array. Then, the data are transferred to processors (ALUs) arranged corresponding to the memory array, and parallel operations are executed. The memory array is divided into blocks corresponding to image data blocks, and in each block, pixel data forming the corresponding image block are stored word by word in each row.

In the arrangement shown in Reference 1, a CAM is used as a subclass associative processor of SIMD processor. The CAM has a full NMOS structure in which only the N channel MOS transistor is used as a component, and the bit line is also used as the search line. Data writing to the CAM cell can be masked using the write enable signal. At the time of searching, search data is transferred to the bit line, and by a search gate in the CAM cell, the match line is driven. The write enable signal simply controls connection between the bit line and the storage node in the CAM cell. When the data read from the CAM cell is to be stored at a transfer destination, it is impossible to mask the data writing of transferred data bits at the destination. Reference 1 is silent about the write mask function of masking a data write at the destination of data transfer.

The CAM cell shown in Reference 1 has a full NMOS configuration, and in addition, the bit line also serves as the search line. Therefore, when data is written or read through the bit line, the search gate in the CAM cell is also rendered conductive. The search gate of the CAM cell is coupled to a low-side power supply node of a flip-flop storing data, and dependent on the data stored in the flip-flop, the search line is driven to the low-side power supply voltage level. Therefore, at the time of data writing or reading to or from the CAM cell through the bit line, the search gate is rendered conductive (complementary data are transmitted to the bit line pair), the low-side power supply node of the flip-flop of the CAM cell is connected to the match line, and current consumption in writing or reading increases (the match line is maintained at the low-side power supply voltage level).

Further, in the CAM cell structure, a pair of match lines is used, and by the 1-match line and the 0-match line, search is performed using the complementary data as the search data. The search gate is coupled to the low-side power supply node of the memory cell, and therefore, in searching operation, the match line is precharged to the high-side power supply voltage level. Further, the CAM cell has the full NMOS structure, and therefore, the bit/search line is precharged to the low-side power supply voltage level. Consequently, the precharge voltage level of the bit line differs in data reading/writing and in a searching operation, and therefore, voltage control of the bit line is complicated.

Reference 1 shows a CAM processor, and the data stored in the CAM are processed. Reference 1, however, does not discuss necessity of processing such as transformation of the sequence of data arrangement in the CAM in data processing.

In the arrangement shown in Reference 2, data are transferred on the word-by-word (data corresponding to one pixel) basis between the memory block and the corresponding processor. To implement filtering such as DCT, the same process is performed on the transferred word in the corresponding processor in each block. The results of arithmetic/logic operations are again written to the memory array, subjected to parallel/serial conversion so that the bit-serial and word-parallel data are converted to bit-parallel and word-serial data, and the resultant data are output successively line by line of the image screen. In common processing, bit positions of data are not converted, and common arithmetic/logic operations are executed on the transferred data in parallel by each of the processors.

In the arrangement described in Reference 2, pixel data of one line of an image screen are stored in one row of memory cells, and image blocks aligned along the row direction are subjected to parallel processing. Therefore, when the number of pixels per line increases to realize very fine images, the memory array arrangement would be of an impermissible size. Assume that data of one pixel consists of 8 bits and one line has 512 pixels, the number of memory cells of one row of memory cells will be 8×512=4 k bits, increasing a load on a row selecting line (word line) to which one row of memory cells are connected. Thus, it becomes difficult to select at high speed a memory cell and transfer data between the operating portion and the memory cell, hindering high speed processing.

Further, References 1 and 2 do not address how to execute parallel processing when the data of the object of processing have different word configurations.

The inventors' group has already proposed a configuration allowing high speed operation even when the data of the object of processing have different word configurations (Japanese Patent Application Nos. 2004-171658 and 2004-358719). In the signal processing device proposed by the inventors' group, a processor is arranged corresponding to each column of the memory array (in a bit line extending direction: entry). The data of the object of processing are stored in each entry, and in each processor, arithmetic/logic operation is performed in a bit-serial manner.

In this arrangement, the data to be processed are stored in the entry corresponding to each column, and the arithmetic/logic operation is executed in the bit-serial manner, and therefore, even when the data have different bit width (word configuration), only the number of operation cycles is increased and the contents of operation are unchanged. Therefore, the arithmetic/logic operation can be executed in parallel, even on the data having different word configurations.

Further, as the processors process in parallel, it follows that the processors same in number as the entries (columns) execute parallel processing, and therefore, the time for processing can be reduced as compared with the sequential (word-serial) processing of each data word. By way of example, consider a two-term (binary) operation of 8-bit data with the entry number of 1024. Assuming that transfer, operation and storage of the operation result of the two-term data each require 1 machine cycle, the necessary number of cycles would be 8×2, 8 and 8 cycles, that is, a total of 32 operation cycles (and one more cycle for storing a carry). Compared with the configuration in which 1024 data are successively processed, however, the time of operation can significantly be reduced, as the operation is executed in parallel among 1024 entries.

In the signal processing device, in order to achieve high speed processing by effectively utilizing the advantageous characteristics of parallel processing, it is necessary to transfer data efficiently to the memory area storing the data before and after the operations, and the circuit for data transfer must satisfy the conditions of small occupation area and low power consumption.

The CAM shown in Reference 1 described above is a single port memory, and hence it is incapable of such transformation of data arrangement.

Further, in parallel processing, even when the contents of the data to be processed have low degree of parallelism (the number of data items to be processed in parallel is small), high speed processing is required without degrading processing performance.

SUMMARY OF THE INVENTION

An object of the present invention is to provide a semiconductor memory device capable of transforming data arrangement and transferring data at high speed.

Another object of the present invention is to provide a memory device for a semiconductor signal processing device that can improve processing performance even in an operation of low degree of parallelism.

According to a first aspect, the present invention provides a semiconductor memory device, including: a first word line; a second word line arranged crossing the first word line; bit lines arranged crossing the first word line; a search line arranged separate from the bit lines; a match line pair arranged crossing the bit lines; and a memory cell including a data storage portion storing data and a search/read portion driving the match line pair in response to the potential of the search line and in accordance with the data stored in the data storage portion. The data storage portion of the memory cell reads the stored data to the bit lines and the match line pair, when the first and second word lines are selected, respectively.

According to a second aspect, the present invention provides a semiconductor memory device, including: a first word line; a second word line arranged crossing the first word line; bit lines arranged crossing the first word line; a match line pair arranged crossing the bit lines; and a memory cell including a data storage portion storing data and a search portion driving the match line pair in accordance with the potential of the bit lines and the data stored in the data storage portion. The data storage portion reads the stored data to the bit lines and the match line pair, when the first and second word lines are selected, respectively.

In the memory cell in accordance with the present invention, a pair of search lines is provided. Therefore, the pair of search lines can be used as the transfer path for the complementary data, and the number of signal lines for the memory cell can be reduced. Further, first and second word lines are provided, and when these are selected, the data stored in the memory cell is transferred to the bit lines and to the match line pair. The first and second word lines are arranged to cross each other, allowing change in arrangement of memory cells connected to the selected word line, and hence, allowing transformation of the sequence of bit arrangement of the input/output data. Thus, bit-serial and word-parallel data can readily be transformed into word-serial and bit-parallel data.

Further, as the search line pair is utilized for data transfer, it becomes possible to mask a data write at the destination of data transfer. Therefore, write mask is possible at the destination in accordance with a write mask instruction from an external processor, and hence, data arrangement can be transformed without impairing the write mask function.

Further, it becomes possible to mask an operation of a processor at the destination in accordance with a signal on the search line, and therefore, it becomes possible to execute the operation only on the necessary data. Therefore, even when the operation has low degree of parallelism, parallel operation can be executed only on the necessary data, and hence, degradation in operation speed can be suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
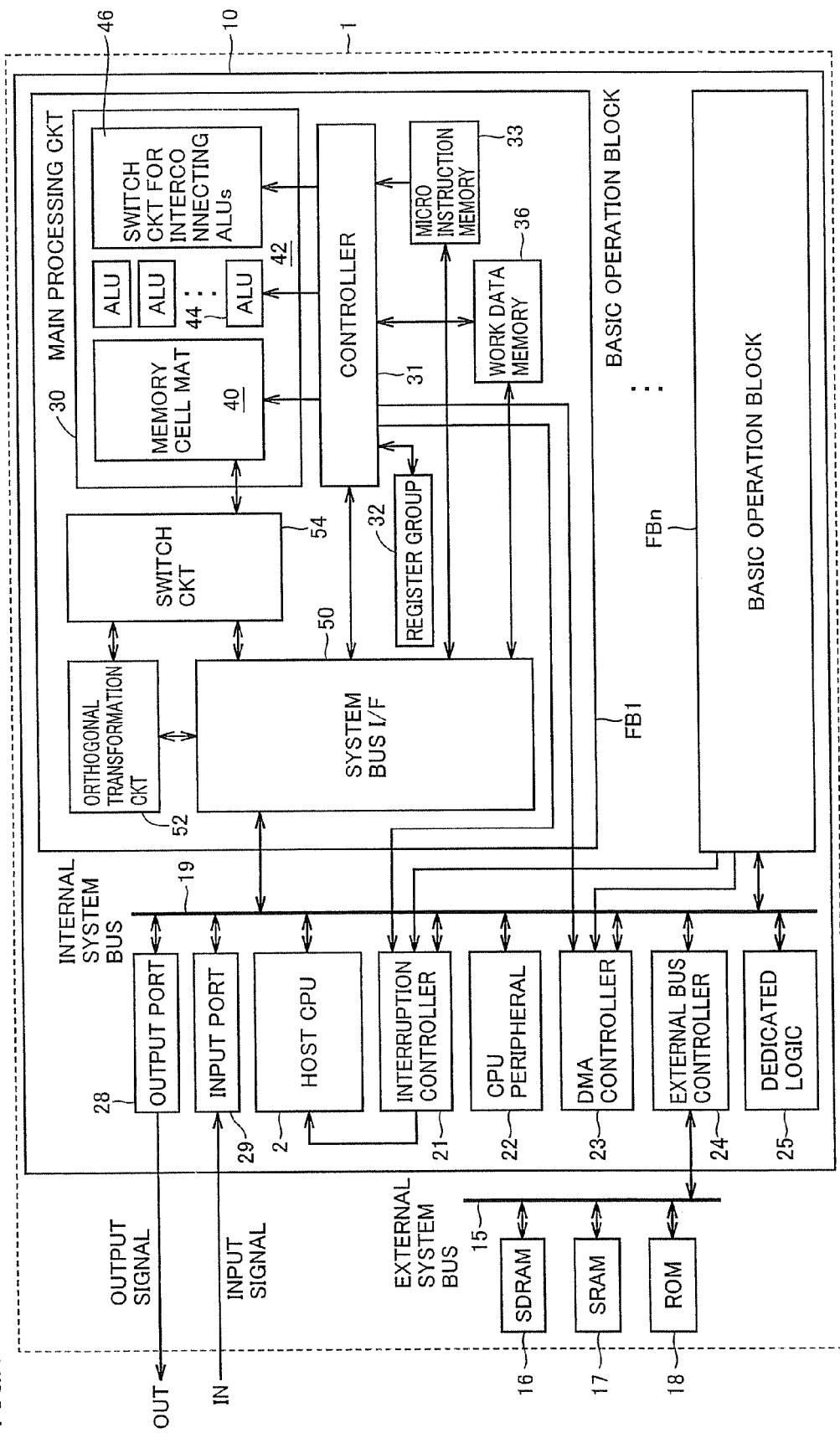
FIG. 1 schematically shows a configuration of a semiconductor signal processing system in accordance with Embodiment 1 of the present invention.

FIG. 1 schematically shows an overall configuration of a semiconductor signal processing system to which the semiconductor memory device of the present invention is applied. Referring to FIG. 1, a signal processing system 1 includes a system LSI 110 implementing arithmetic/logic operation functions for executing various processes, and external memories connected to system LSI 110 through an external system bus 15.

The external memories include a large capacity memory 16, a high-speed memory 17 and a read only memory (ROM) 18 storing fixed information such as an instruction for starting up the system. Large capacity memory 16 is formed, for example, of a clock-synchronized dynamic random access memory (SDRAM). High-speed memory 17 is formed, for example, of a static random access memory (SRAM).

System LSI 110 has, for example, an SOC (System On Chip) configuration, and includes basic operation blocks FB1 to FBn coupled in parallel with an internal system bus 19, a host CPU 2 controlling processing operations of these basic operation blocks FB1 to FBn, an input port 29 for converting an input signal IN from an outside of signal processing system 1 to data suitable to internal processing, and an output port 28 for receiving an output data from internal system bus 19 and generating an output signal OUT to the outside of the system. Input port 29 and output port 28 are formed of IP (Intellectual Property) blocks reserved in the form of a library, and implements functions necessary for inputting/outputting data/signals.

System LSI 110 further includes an interruption controller 21 receiving an interruption signal from basic operation blocks FB1 to FBn and signaling host CPU 2 of an interruption, a CPU peripheral 22 performing control operations necessary for various processes by host CPU 2, a DMA controller 23 transferring data with external memories (16-18) in accordance with a transfer request from basic operation blocks FB1 to FBn, an external bus controller 24 controlling an access to memories 16 to 18 connected to external system bus 15, in accordance with an instruction from host CPU 2 or from DMA controller 23, and a dedicated logic 25 assisting data processing by host CPU 2. These functional blocks 21 to 25, 28 and 29 and host CPU 2 are coupled in parallel to system bus 19.

CPU peripheral 22 has functions necessary for programming and debugging by host CPU 2, including a timer function and a serial IO (input/output) function. Dedicated logic 25 is implemented, for example, by an IP block, and realizes necessary processing functions utilizing existing functional blocks.

DMA controller 23 is used for directly accessing an external memory (16-18), not through host CPU 2. By the control of DMA control 23, data can be transferred between external memory 16 and/or 17 and system LSI 110, and system LSI 110 can directly access the external memories 16 to 18. A DMA request signal for DMA controller 23 is applied from basic operation blocks FB1 to FBn.

These basic operation blocks FB1 to FBn are of the same configuration, and therefore, the configuration of basic operation block FB1 is shown as a representative in FIG. 1.

Basic operation block FB1 includes main processing circuitry 30 including a memory and a processor; a micro instruction memory 33 for storing an execution program provided in a micro code form; a controller 31 for controlling an internal operation of basic operation block FB1; a register group 32 used as an address pointer or others; a work data memory 36 for storing intermediate processing data or work data for controller 31; and a system bus interface (I/F) 50 for transferring data/signals between an inside of basic operation block FB1 and internal system bus 19.

Main processing circuitry 30 includes a memory cell mat 40 in which memory cells are arranged in a matrix of rows and columns, and a group of arithmetic logic units (ALUs) 42 arranged on one side of memory cell mat 40.

In memory cell mat 40, memory cells MC arranged in rows and columns are divided into a plurality of entries. In the group of arithmetic logic units 42, an arithmetic logic unit (ALU) 44 is provided corresponding to each entry. Arithmetic logic unit 44 is capable of executing addition, logical operation, coincidence detection (EXOR), inversion (NOT) and the like. An arithmetic/logic operation is performed by loading and storing data between an entry and a corresponding arithmetic logic unit 44.

In order to switch a connection path between arithmetic logic units 44 in the group of arithmetic logic units 42, a switch circuit 46 for interconnecting ALUs is provided. By switching the connection path of arithmetic logic units 44 using the switch circuit 46 for interconnecting ALUs, data transfer between entries, including a copy operation of data items stored in memory cell mat 40 becomes possible to advance processing.

System bus I/F 50 allows host CPU 2 or DMA controller 23 to make an access to memory cell mat 40, the dedicated register in controller 31, micro instruction memory 33 and work data memory 36.

To basic operation blocks FB1 to FBn, different address areas (CP address areas) are allocated. Further, different addresses (CPU addresses) are allocated to memory cell mat 40, the control register in controller 31, micro instruction memory 33 and work data memory 36 in each of basic operation blocks FB1 to FBn. In accordance with each allocated address area, host CPU 2 and DMA controller 23 identify the basic operation block FB (FB1 to FBn) as the object of accessing, and make an access to the object basic operation block.

Basic operation block FB1 further includes an orthogonal transformation circuit 52 for transforming data arrangement with system bus I/F 50, and a switch circuit 54 for selecting either the orthogonal transformation circuit 52 or the system bus I/F 50 and coupling the selected one to main processing circuitry 30. Orthogonal transformation circuit 52 transforms data transferred in bit-parallel and word-serial manner from system bus I/F 50 to word-parallel and bit-serial data, and transfers the transformed data through switch circuit 54 to memory cell mat 40 of main processing circuitry 30.

To respective entries of memory cell mat 40, bits at the same position (digit) of different data words are written in parallel. Further, orthogonal transformation circuit 52 performs orthogonal transformation on the data train transferred in word-parallel and bit-serial manner from memory cell mat 40 of main processing circuitry 30 to generate and transfer a bit-parallel and word-serial data train. Thus, integrity of transferred data at the system bus 19 and memory cell mat 40 is maintained.

Here, the orthogonal transformation refers to conversion between bit-serial and word-parallel data and bit-parallel and word-serial data. "Bit-serial" refers to the manner in which each bit of a data word is transferred successively, while "word-parallel" refers to a manner in which a plurality of data words are transferred in parallel. "Bit-parallel" refers to a manner in which bits of one data word are transferred in parallel, and "word-serial" refers to a manner in which data words are successively transferred word-by-word.

Switch circuit 45 may be adapted to select the work data from controller 31 for transferring the work data to main processing circuitry 30. In this configuration, memory cell mat 40 can be used as a work data storage area, and work data memory 36 becomes unnecessary. Further, when orthogonal transformation of the data of the object of operation is unnecessary, switch circuit 54 couples system bus I/F 50 to main processing circuitry 30.

In each of basic operation blocks FB1 to FBn, by distributing the data input/output functions, it becomes possible to determine whether orthogonal transformation of data is necessary or not on block-by-block basis, and hence, it becomes possible to flexibly set the data arrangement in accordance with the contents of processing in each of the basic operation blocks FB1 to FBn.

In system LSI 110, a central control unit may be provided common to basic operation blocks FB1 to FBn. The central control unit includes a controlling CPU, an instruction memory and a register group. The control is transferred from host CPU 2 to the central control unit, and processing operations of basic operation blocks FB1 to FBn are controlled. In this configuration, the control is further transferred from the central control unit to controller 31 in basic operation blocks FB1 to FBn, and the processing operations are controlled in a unit of each basic operation block.

Figure 2:
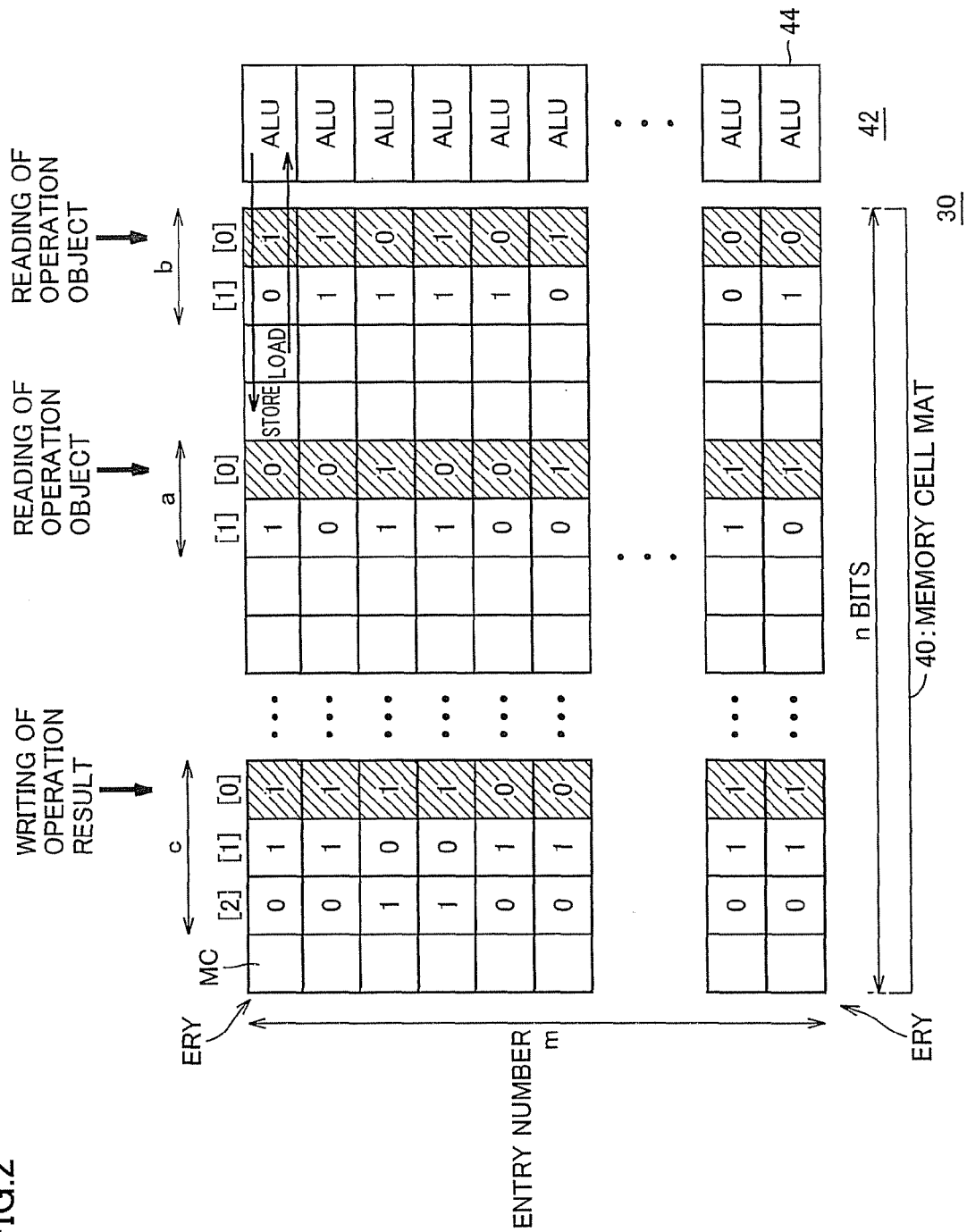
FIG. 2 shows correspondence between a memory cell mat of main processing circuitry and arithmetic logic units shown in FIG. 1.

FIG. 2 schematically shows configurations of memory cell mat 40 and the group of arithmetic logic units 42 included in main processing circuitry 30 included in each of the basic operation blocks FB1 to FBn. In memory cell mat 40, memory cells MC are arranged in a matrix of rows and columns, and memory cell mat 40 is divided such that each column of memory cells constitutes one entry ERY.

In memory cell mat 40, memory cells MC are divided into m entries ERY. One entry ERY has a bit width of n bits, and includes memory cells aligned in one column along the direction of extension of the bit line in memory cell mat 40. By way of example, in memory cell mat 40, the number of entries m is 1024, and the bit width n of one entry ERY is 512 bits.

In the group of arithmetic logic units 42 arranged on one end of memory cell mat 40, arithmetic logic units 44 are provided for respective entries ERY. An arithmetic/logic operation is performed by loading and storing data between the entry ERY and the corresponding arithmetic logic unit (ALU) 44.

In each entry ERY, the data of the object of arithmetic/logic operation is stored. Arithmetic logic unit 44 executes the arithmetic/logic operation in bit-serial manner. In the group 42 of arithmetic logic units, a plurality of arithmetic logic units 44 operate in parallel to execute arithmetic/logic operations, and therefore, arithmetic/logic operations on the data are executed in bit-serial and entry-parallel manner. "Entry parallel" refers to a manner in which a plurality of entries are processed in parallel.

As the arithmetic/logic operation is executed in the bit-serial manner in arithmetic logic unit 44, even when the data to be subjected to arithmetic/logic operation may have different bit width for different purposes, simply the number of operation cycles is changed in accordance with the bit width of data word, and the contents of processing are unchanged. Therefore, data having different word configurations can readily be processed.

FIG. 2 shows an example of data stored in respective entries for a two-term (binary) operation. When a two-term operation is to be executed, in each entry FRY, bits of two-term data words are transferred and subjected to the arithmetic operation, and the data bits representing the result of operation are stored. In the example shown in FIG. 2, the two-term operation on data a and b is executed in the corresponding arithmetic logic unit 44, and the result of operation is written to prescribed positions of the same entry ERY as data c. By way of example, when an addition of data a and b is to be done, the set of data of the object of addition are respectively stored in the entries ERY. Specifically, in an arithmetic logic unit 44 corresponding to the entry ERY of the first row shown in FIG. 2, an addition of 10B+01B is performed, whereas in an arithmetic logic unit 44 corresponding to the entry ERY of the second row, an operation of 00B+11B is performed. Here, "B" indicates a binary number. In an arithmetic logic unit 44 corresponding to the entry ERY of the third row, an addition of 11B+10B is performed. Then, in the similar manner, addition of stored data words a and b is performed in each entry, and the result of operation is stored in the corresponding entry.

The arithmetic/logic operation is performed in the bit-serial manner, starting from the lowest bit. First, in entry ERY, a lower bit a [0] of data word a is transferred to the corresponding arithmetic logic unit 44. Thereafter, a lower bit b [0] of data word b is transferred to the corresponding arithmetic logic unit 44. Arithmetic logic unit 44 performs an addition, using 2 bits of data thus supplied. The result of addition a [0]+b [0] corresponds to the lower bit c of data word c, and is stored (written) to an entry of the corresponding position. Specifically, in the entry ERY of the first row, the result of addition "1" is written to the position of bit c [0].

This addition is performed on higher bits a [1] and b [1], and the result of operation a [1]+b [1] is written to the position of bit c [1].

An addition may possibly produce a carry, and the carry value is written to a position of bit c [2]. Assuming that the number of entries m is 1024, addition of 1024 sets of data can be executed in parallel.

In a configuration in which transfer of a data bit between memory cell mat 40 and arithmetic logic unit 44 requires one cycle and the arithmetic logic unit 44 requires an operation cycle of one machine cycle, four machine cycles are necessary to add 2 bits of data and to store the result of addition. As the operation is executed in parallel in each entry, it follows that addition of m sets of data will have been complete at the end of four machine cycles.

Therefore, the approach in which the memory cell mat 40 is divided into a plurality of entries ERY, sets of data to be processed are stored in respective entries ERY, and arithmetic/logic operation is performed by corresponding arithmetic logic units 44 in bit-serial manner achieves the following advantages. Specifically, though relatively large number of machine cycles are necessary for the arithmetic/logic operation of each data, high speed data processing can be achieved by increasing the degree of parallel operations when an extremely large amount of data are to be processed. The arithmetic/logic operation is done in the bit-serial manner, and the bit width of data to be processed is not fixed. Therefore, this approach may be adopted for various applications having various different data configurations.

Figure 3:
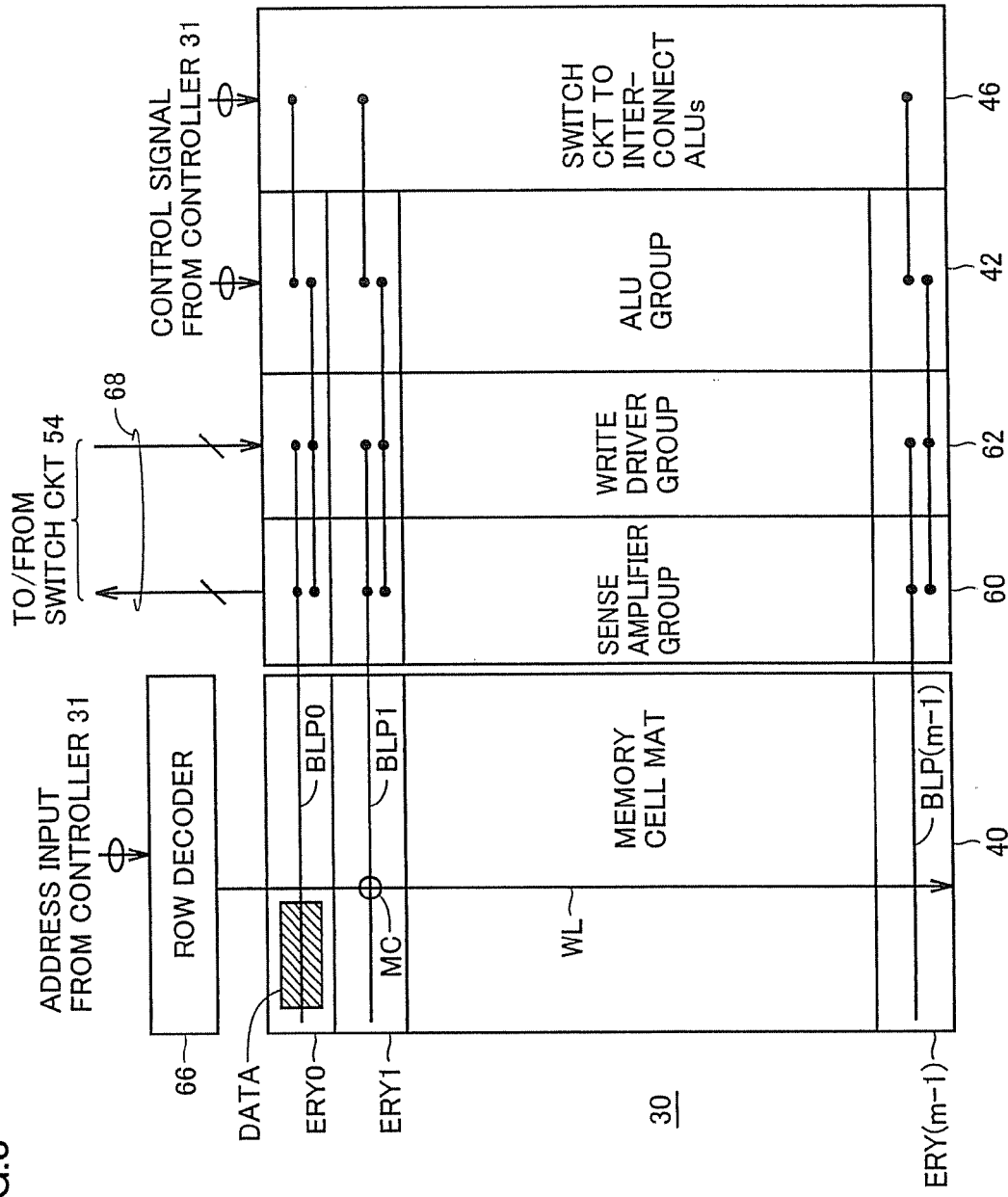
FIG. 3 schematically shows a configuration of the main processing circuitry shown in FIG. 1.

FIG. 3 more specifically shows the configuration of main processing circuitry 30. In memory cell mat 40, word lines WL are arranged corresponding to the respective rows of memory cells MC, and bit line pairs BLP are arranged corresponding to the respective columns of memory cells. Memory cells MC are arranged at crossings of the bit line pairs BLP and word lines WL and connected to the corresponding word lines WL and bit line pairs BLP, By way of example, memory cell MC is implemented by an SRAM (Static Random Access Memory).

Each entry ERY is provided corresponding to each bit line pair BLP. In FIG. 3, in memory cell mat 40, entries ERY0 to ERY(m-1) are arranged corresponding to bit line pairs BLP0 to BLP(m-1), respectively. The bit line pair BLP is used as a data transfer line between the entry ERY and the corresponding arithmetic logic unit 44.

For a word line WL of memory cell mat 40, a row decoder 66 is provided Row decoder 66 drives the word line WL connected to the memory cells storing data bits to be processed to a selected state, in accordance with an address signal from controller 31 shown in FIG. 1. Word line WL is connected to memory cells of the same position of respective entries ERY0 to ERY(m-1), and by row decoder 66, data bits of the same position are selected in parallel, in respective entries ERY.

In the group of arithmetic logic units 42, respective arithmetic logic units 44 are arranged corresponding to bit line pairs BLP0 to BLP(m-1) (in FIG. 3, represented by "•" in the group of processing units (ALU group) 42). Between the group of arithmetic logic units 42 and memory cell mat 40, a sense amplifier group 60 and a write driver group 62 are provided for loading/storing data. The sense amplifier group 60 includes sense amplifiers provided corresponding to respective bit line pairs BLP, each of which amplifies data read onto a corresponding bit line pair BLP and transmits the amplified data to the corresponding arithmetic logic unit (44) of the group of arithmetic logic units 42.

Similarly, the write driver group 62 includes write drivers arranged corresponding to respective bit line pairs BLP, each of which amplifies data from the corresponding arithmetic logic unit 44 and transfers the amplified data to the corresponding bit line pair BLP.

For the group of sense amplifiers 60 and the group of write drivers 62, an internal data bus 68 is arranged for data transfer to/from switch circuit 54. In FIG. 3, internal data bus 68 is shown including bus lines connected separately to the group of sense amplifiers 60 and to the group of write drivers 62. However, a common data bus may be connected to the group of sense amplifiers 60 and to the group of write drivers 62. Further, an interface for data input/output (input/output buffer) may be arranged between internal data bus 68 and each of the group of sense amplifiers 60 and the group of write drivers 62.

Switch circuit 46 for interconnecting ALUs provided for the group of arithmetic logic units 42 establishes interconnection paths among the arithmetic logic units included in the group of arithmetic logic units 42 based on a control signal from controller 31 shown in FIG. 1. Therefore, as in a barrel shifter, data transfer becomes possible not only between neighboring arithmetic logic units but also between arithmetic logic units physically separated by a distance. Switch circuit 46 for interconnecting ALUs may be implemented, for example, by a cross bar switch employing an FPGA (Field Programmable Gate Array). Each arithmetic logic unit included in the group of arithmetic logic units 42 has its timings and contents for arithmetic/logic operation determined in accordance with a control signal from controller 31 shown in FIG. 1.

As shown in FIG. 3, data of the object of arithmetic/logic operation are stored in entries ERY0 to ERY(m-1). FIG. 3 shows data DATA stored in entry ERY0 as a representative. For writing data to memory cell mat 40, data are written in parallel to memory cells MC connected to selected word line WL, by the write driver group 62. The width of data bits that can be written at one time is limited by the bus width of internal data bus 68. Here, it is required that data bits at the same position of different entries be written to memory cells of different entries connected to the selected word line WL. System bus I/F shown in FIG. 1 serially transfers data DATA in the bit-parallel manner. Therefore, in order to convert the data arrangement between system bus I/F (I/F 50 of FIG. 1) and internal data bus 68, orthogonal transformation circuit 52 shown in FIG. 1 is used.

Figure 4:
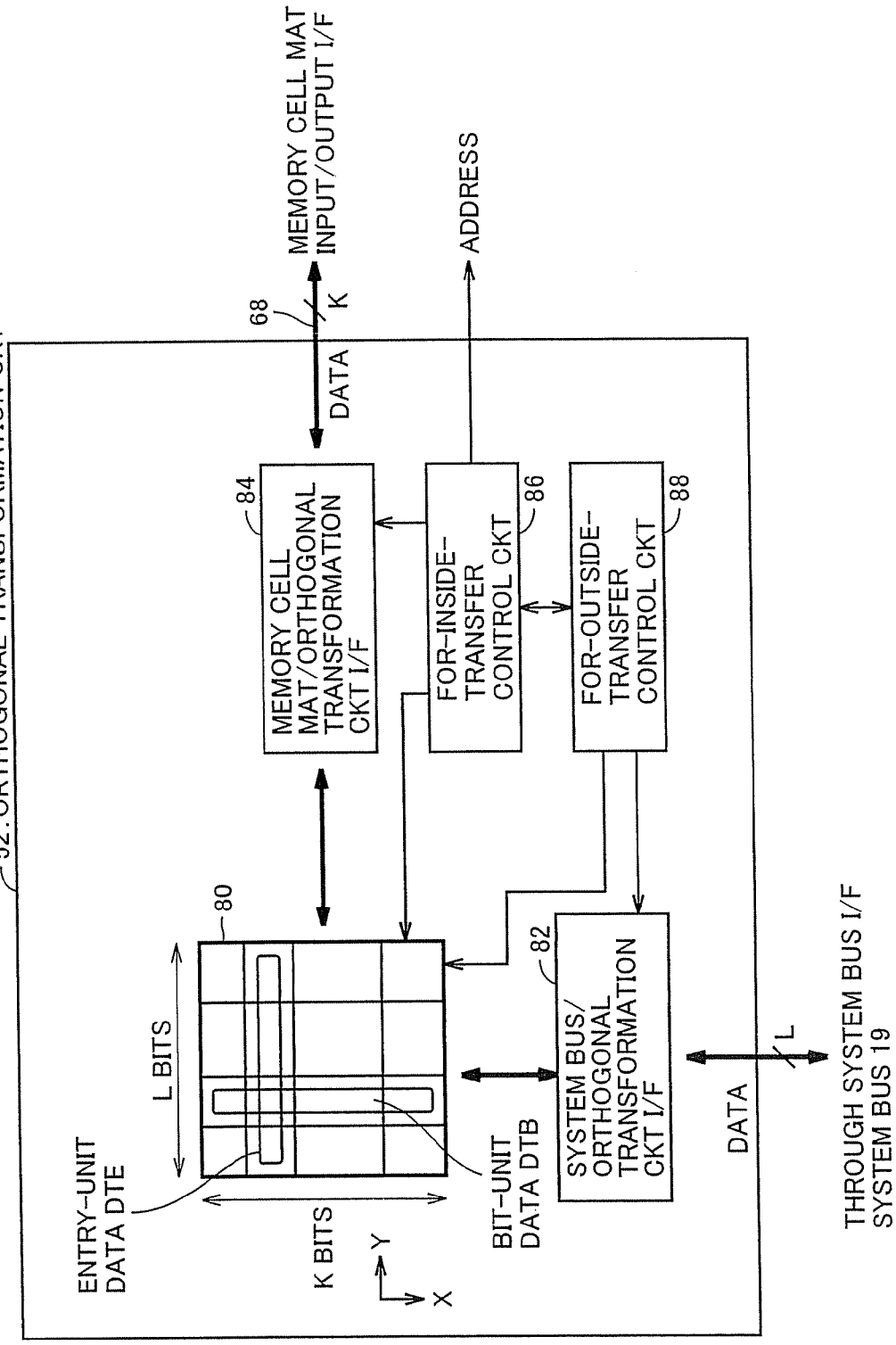
FIG. 4 schematically shows a configuration of the orthogonal transformation circuit shown in FIG. 1.

FIG. 4 schematically shows a configuration of orthogonal transformation circuit 52 shown in FIG. 1. Referring to FIG. 4, orthogonal transformation circuit 52 includes an orthogonal memory 80 having memory elements arrange in a matrix of K bits×L bits, a system bus/orthogonal transformation circuit interface (I/F) 82 as an interface between orthogonal memory 80 and system bus I/F 50, a memory cell mat/orthogonal transformation circuit I/F 84 as an interface to input/output interface portion (I/F) provided for memory cell mat 40, a for-outside-transfer control circuit 88 controlling data transfer between system bus 19 and orthogonal memory 80, and a for-inside-transfer control circuit 86 controlling data transfer between memory cell mat input/output I/F and orthogonal memory 80.

Between orthogonal transformation circuit 52 and system bus 19, data are transferred L bits by L bits, and between orthogonal transformation circuit 52 and memory cell mat 40, data are transferred K bits by K bits. The width L of transferred data bits may be the same as the bit width of data words transferred over internal data bus 19. Alternatively, bit-width conversion may be performed at system bus I/F 50 (see FIG. 1), and a plurality of word data may be transferred in parallel between system bus I/F 50 and orthogonal transformation circuit 52. The same applies to the bit width of internal data bus 68.

At the time of data transfer between the memory cell mat and orthogonal transformation circuit 52, for-inside-transfer control circuit 86 generates an address to orthogonal memory 80, generates an address to the memory mat, and controls a buffering process at memory cell mat/orthogonal transformation circuit I/F 84.

When data is being transferred to/from memory cell mat (40) by the operation of for-inside-transfer control circuit 86, for-inside-transfer control circuit 86 controls an operation of for-outside-transfer control circuit 88, to set data transfer to/from system bus 19 in a "wait" state. Further, at the time of data transfer to the memory cell mat, for-inside-transfer control circuit 86 calculates an address based on bit position information and entry position information of orthogonal memory 80, and transfers the calculated address to main processing circuitry (30).

At the time of data transfer with system bus 19, for-outside-transfer control circuit 88 controls such that addresses in the X direction of orthogonal memory 80 are successively generated, so that data accesses are made (data is written or read) along the X direction of orthogonal memory 80 successively. At the time of data transfer with the memory cell mat, for-inside-transfer control circuit 86 controls such that addresses in the Y direction of orthogonal memory 80 are generated, so that data accesses are made along the Y direction of orthogonal memory 80 successively.

Orthogonal memory 80, of which configuration will be described in detail later, is a 2-port memory, which transfers data DTE of entry unit between system bus and orthogonal transformation circuit I/F 82, and transfers data DTB of bit unit over a plurality of entries between memory cell mat and orthogonal transformation circuit I/F 84.

In orthogonal memory 80, the data DTE aligned in the Y direction represent data of the external address (CPU address) unit, which are the data of entry unit to be stored in the same entry of the memory cell mat. Therefore, when viewed from the point of external address (CPU address), at the time of data transfer with the memory cell mat, bits aligned in the X direction are transferred, that is, the data are transferred in the word-parallel and bit-serial manner. The bit unit data DTB represent data of the word line address unit of the memory cell mat of the main processing circuitry, including the bits at the same position of a plurality of entries, in the memory cell mat (40) of the main processing circuitry.

In orthogonal memory 80, a port for data transfer with system bus (19) and a port for data transfer with internal bus (68) of the memory are provided separately, and therefore, it is possible to rearrange the data in the X direction and the data in the Y direction, for data transfer. When multi-bit data (multi-bit data of entry unit) are transferred from system bus 19 to memory cell mat (40), the data are converted to multi-bit data of bit unit before transference. Therefore, in orthogonal memory 80, data arrangement is converted between a series of word-parallel and bit-serial data and a series of word-serial and bit-parallel data. This conversion process is defined here as the orthogonal transformation of data.

Figure 5:
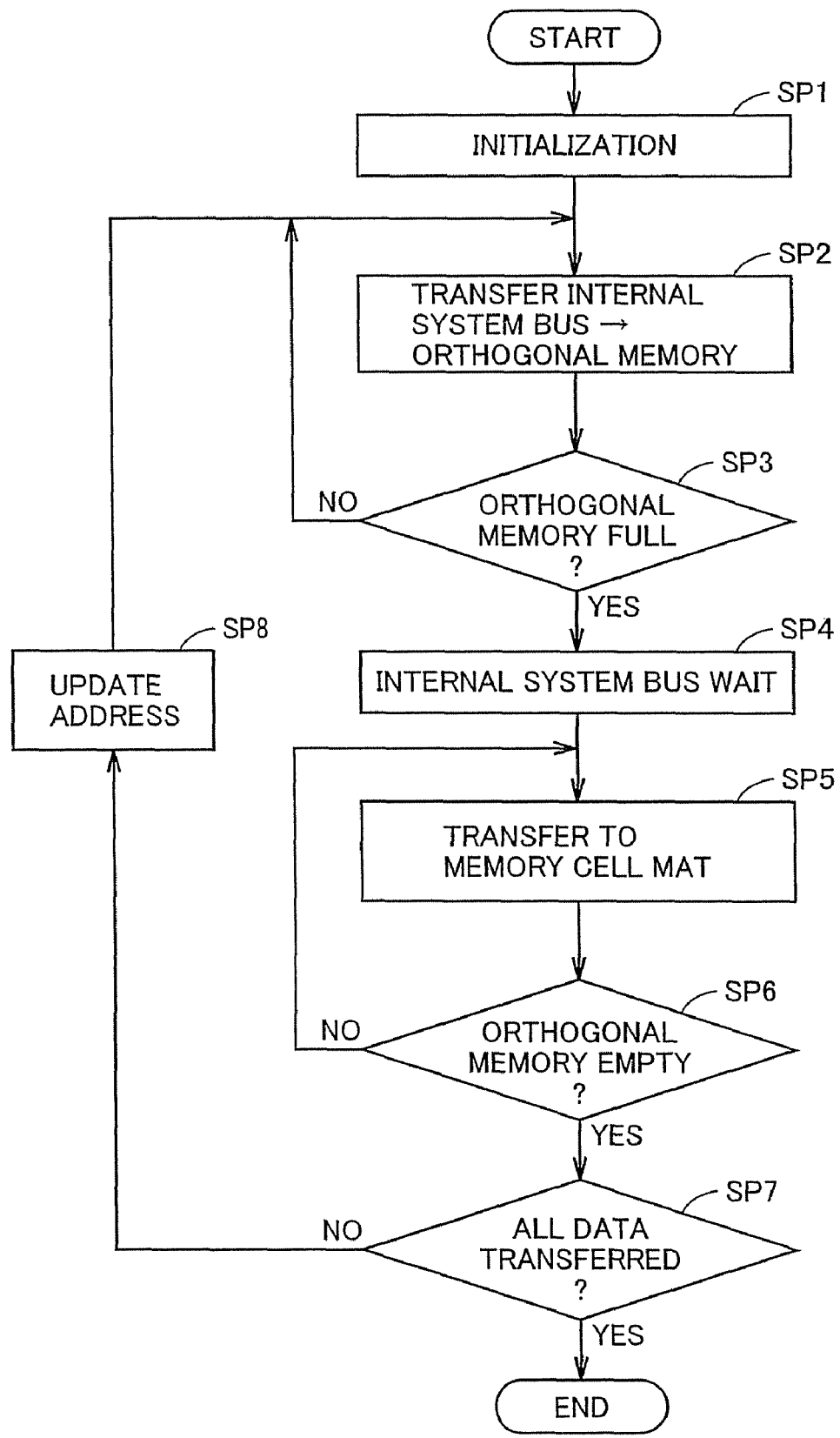
FIG. 5 is a flowchart representing an operation of the orthogonal transformation circuit shown in FIG. 4.

FIG. 5 is a flowchart representing an operation of orthogonal transformation circuit 52 shown in FIG. 4 in data transfer to the memory cell mat. In the following, the operation of orthogonal transformation circuit 52 will be described with reference to FIGS. 1 and 5.

In data transfer to the memory cell mat, it is assumed that the data of the same bit width as the data on system bus 19 (K=L) are transferred from orthogonal transformation circuit 52 to the memory cell mat (40) of main processing circuitry 30. Specifically, though the data are subjected to orthogonal transformation, bit width of the data is not converted. Namely, a transfer operation where the bit width of data on the system data bus 19 is the same as the bit width of data on internal system bus 68 will be described.

The bit position (word line address) and the entry position (bit address) of the starting point of writing to the memory cell mat in the main processing circuitry are respectively set in registers, not shown, of for-inside-transfer control circuit 86, the for-inside-transfer control circuit 86 is set to a data read mode, and for-outside-transfer control circuit 88 is set to a data write mode. Further, an address for the orthogonal memory 80 is set as the initial address. By the series of processes, orthogonal transformation circuit 52 is initialized (step SP1).

Next, from system bus I/F 50 through system bus/orthogonal transformation circuit I/F 82, the transfer data are written to orthogonal memory 80 under the control of for-outside-transfer control circuit 88. The write data of orthogonal memory 80 are successively stored as multi-bit data DTE of entry unit aligned along the Y direction, from the starting row, in the X direction of orthogonal memory 80. For each data writing to orthogonal memory 80, for-outside-transfer control circuit 88 counts the number of times of writing, and updates the address of orthogonal memory 80 (step SP2).

Data writing continues until the storage contents of orthogonal memory 80 becomes full, that is, until the number of data writing from system bus 19 to orthogonal memory 80 reaches the transfer data bit width K for the memory mat in the main processing circuitry (step SP3).

When data writing has been done L times from system bus 19 through system bus/orthogonal transformation circuit I/F 82 to orthogonal memory 80, for data transfer from orthogonal memory 80 to the memory cell mat of the main processing circuitry, for-inside-transfer control circuit 86 asserts a wait control signal to system bus 19 so as to set the for-outside-transfer control circuit 88 to a state ready for the subsequent data writing (step SP4).

Whether the state of storage of orthogonal memory 80 is full or not can be known by monitoring the number of times of data writing to orthogonal memory 80 each time the number is counted, by for-outside-transfer control circuit 88. The result of monitoring is transferred from for-outside-transfer control circuit 88 to for-inside-transfer control circuit 86, and thus, for-inside-transfer control circuit 86 gets the state of storage in orthogonal memory 80. As the wait control signal is asserted by for-inside-transfer control circuit 86, for-outside-transfer control circuit 88 sets the system bus/orthogonal transformation circuit I/F to the wait state, and in response, system bus I/F 50 is set to the wait state.

For-inside-transfer control circuit 86 sets the for-outside-transfer control circuit 88 to the wait state, and activates memory cell mat/orthogonal transformation circuit I/F 84. Under the control of for-inside-transfer control circuit 86, data are successively read from the start address in the Y direction of orthogonal memory 80 by memory cell mat/orthogonal transformation circuit I/F 84, and the data are transferred to the memory cell mat of the main processing circuitry through memory cell mat/orthogonal transformation circuit I/F 84 (step SP5).

Whether the data stored in orthogonal memory 80 have all been transferred or not by data transfer to the memory cell mat of the main processing circuitry is determined at each transfer (step SP6). Specifically, for-inside-transfer control circuit 86 counts the number of times of data reading and transfer from orthogonal memory 80, and monitors whether the count number has reached L. Until the count value reaches L, K-bits by K-bits data transfer continues from orthogonal memory 80 through memory cell mat/orthogonal transformation circuit I/F 84.

When it is determined in step SP6 that all data of orthogonal memory 80 have been transferred, then, determination is made as to whether all the data of the object of arithmetic/logic operation have been transferred (step SP7). When there is any transfer data left as the object of arithmetic/logic operation, the address for orthogonal memory 80 is updated to the initial value to store data again in orthogonal memory 80, the data transfer circuit is initialized (step SP8), and the process is started again from step SP2.

When the process returns back from step SP8 to SP2, an address updating process (step SP8) is performed, in which K is added to the address representing the entry position in the memory cell mat and the starting entry portion in the memory cell mat of the data stored in orthogonal memory 80 is updated (where m>K) in for-inside-transfer control circuit 86.

When the entry position information exceeds the entry number of the memory cell mat of the main processing circuitry, it is necessary to select a next word line and to write data to the next bit position in the memory cell mat (40), so that the entry position information is set to the initial value of 0, and in order to select the next word line in memory cell mat 40, the word line address (bit position information) is incremented by 1.

For-inside-transfer control circuit 86 cancels the wait state of for-outside-transfer control circuit 88 for the system bus 19, so that for-outside-transfer control circuit 88 again starts writing of data from system bus 19 to orthogonal memory 80.

The operations from step SP2 to step SP8 are repeated until all the data as the object of arithmetic/logic operation are transferred.

When it is determined in step SP7 that all the data of the object of arithmetic/logic operation have been transferred (determined as the transfer request from system bus I/F is deasserted), data transfer ends. Through the series of operations, the data transferred in word-serial manner from the outside can be converted to bit-serial and word-parallel data and transferred to the memory cell mat.

Figure 6:
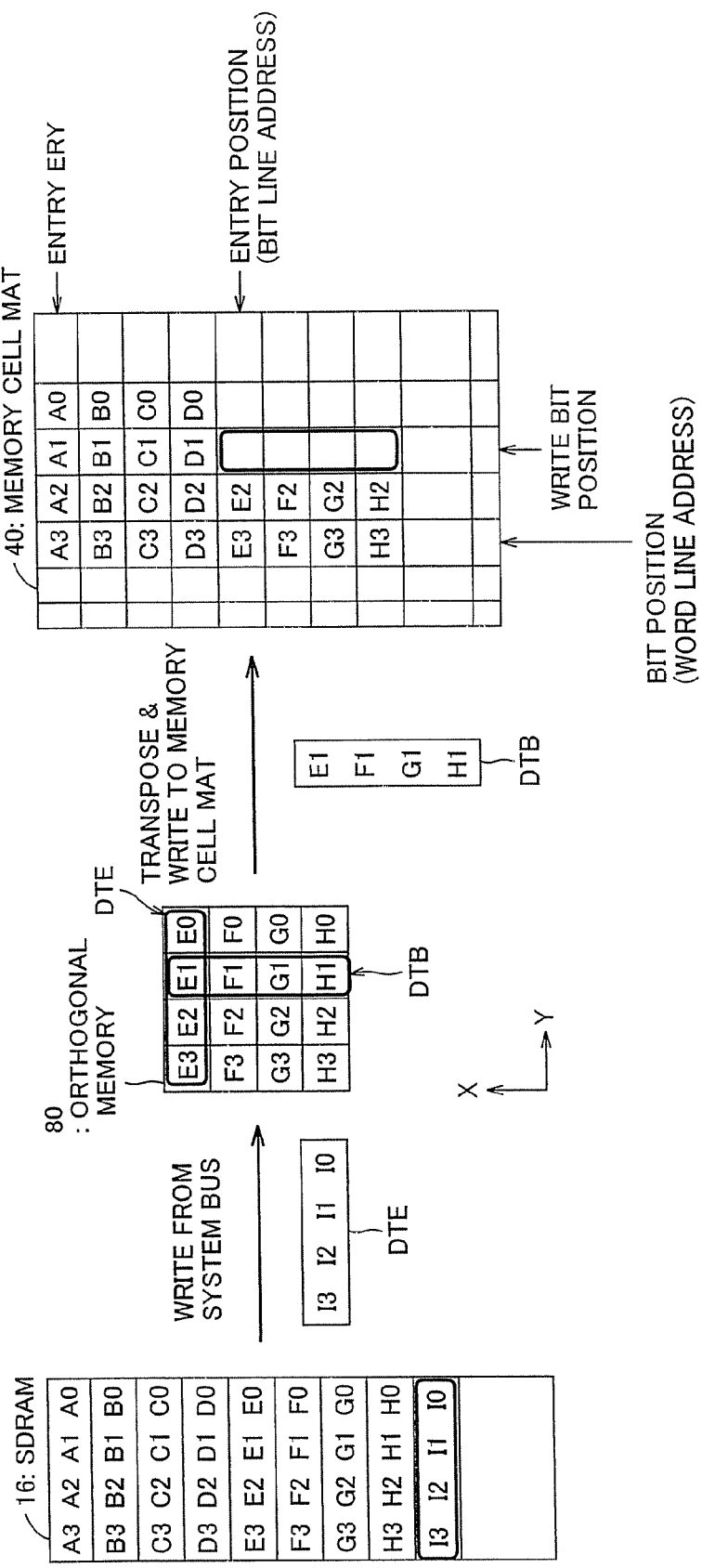
FIG. 6 shows a data transfer sequence through the orthogonal transformation circuit shown in FIG. 4.

FIG. 6 schematically shows a data flow in data transfer from the large capacity memory (SDRAM) 16 to memory cell mat 40. FIG. 6 shows, as an example, data transfer of data having the bit width L of 4 bits, to memory cell mat 40.

Referring to FIG. 6, 4-bit data A (bits A3-A0) to I (bits I3-I0) are stored in SDRAM 16. In SDRAM 16, each data is stored word-by-word in word-serial manner From SDRAM 16, 4 bits of data DTE (data I: bits I3-I0) are transferred through internal system bus 19 to orthogonal memory 80 and stored therein. Data DTE from SDRAM 16 represent data of entry unit that are stored in the same entry ERY of the memory cell mat, and in orthogonal memory 80, data bits are stored aligned along the Y direction. FIG. 6 shows a state in which data E to H are stored, as an example.

In data transfer from orthogonal memory 80 to memory cell mat 40, respective bits of data DTB aligned along the X direction of orthogonal memory 80 are read in parallel. Data DTB by the address unit of memory cell mat, including data bits E1, F1, D1 and H1 are stored at positions indicated by entry position information and bit position information of memory cell mat 40. The bit position information is used as the word line address of memory cell mat 40, and the entry position information is used as the bit (column) address of memory cell mat 40. The bit position information and entry position information are stored in the register of for-inside-transfer control circuit 86 shown in FIG. 4, and transferred as address information to the main processing circuitry. The write bit position information indicating the actual position of data writing in memory cell mat 40 is generated based on the number of times of accesses to memory cell mat 40, the entry position information and the bit position information.

By simultaneously storing data bits in the Y direction and then reading data bits aligned in the X direction using orthogonal memory 80, it becomes possible to convert the data DTE of entry unit read from SDRAM 16 in the word-serial and bit-parallel manner to word-parallel and bit-serial data DTB of address unit (unit of word line address of the memory cell mat) to be stored in memory cell mat 40.

When data are read from memory cell mat 40 and transferred to system bus 19, the direction of data transfer is reversed. The operation of orthogonal memory 80, however, is the same as in data writing to memory cell mat 40. By the operation of for-inside-transfer control circuit 86, the data read from memory cell mat 40 are stored successively in orthogonal memory 80, starting from the start position in the Y direction. Thereafter, by the operation of for-outside-transfer control circuit 88, data are successively read from orthogonal memory 80 from the start position in the X direction, and the data read in the word-parallel and bit-serial manner from memory cell mat 40 are converted to word-serial and bit-parallel data and transferred.

Figure 7:
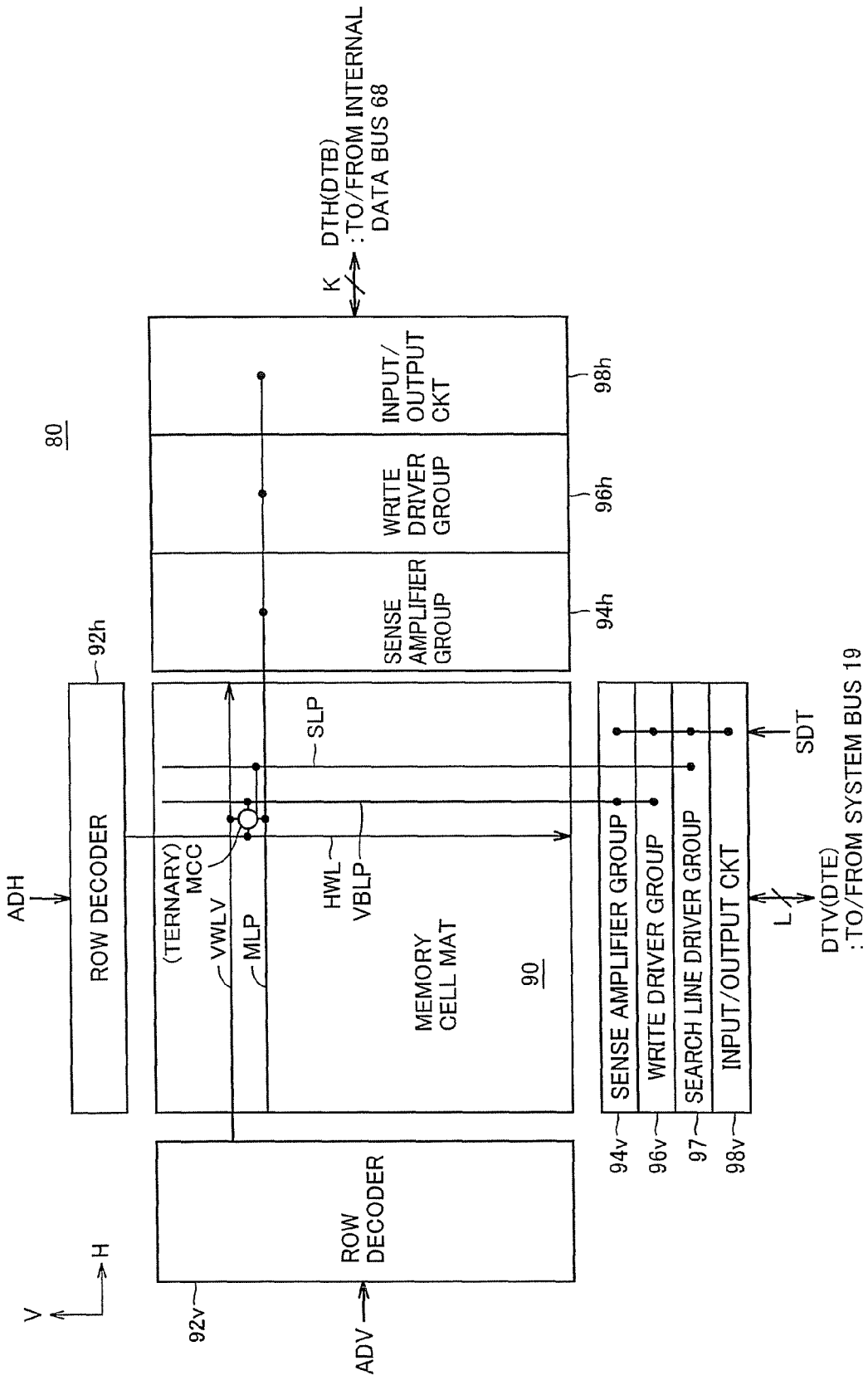
FIG. 7 schematically shows a configuration of an orthogonal memory of the orthogonal transformation circuit shown in FIG. 4.

FIG. 7 schematically shows a specific construction of orthogonal memory 80 according to the present invention. Referring to FIG. 7, orthogonal memory 80 includes a memory cell mat 90 having memory cells MCC arranged in a matrix of rows and columns. A memory cell MCC is formed of a CAM (Content Addressable Memory), and as will be described in detail later, has two ports. One port is used for data transfer to the memory cell mat of the main processing circuitry, and the other port is used for data transfer to an external host CPU (2).

In memory cell mat 90, a vertical word line WLV and a match line pair MLP are arranged corresponding to memory cells MCC aligned in the horizontal direction H, and a horizontal word line WLH and vertical bit line pair BLVP are arranged corresponding to memory cells MCC aligned in the vertical direction V.

The match line pair MLP is also used as a bit line pair for the memory cells aligned along the horizontal direction H. As the CAM cell is used as the memory cell MCC, the main processing circuitry comes to have the searching function, and it is possible to have the processing circuit execute an arithmetic/logic operation selectively in accordance with the result of searching, in the main processing circuitry. Further, as the match line pair is used, data writing to the memory cells in the memory cell mat can be inhibited in the main processing circuitry, implementing the write mask function. In order to transmit the search data at the time of searching, a search line pair SLP is arranged along the vertical direction V.

Orthogonal memory 80 further includes: a row decoder 92*v* for selecting a vertical word line WLV of memory cell mat 90 in accordance with a vertical word address ADV; a sense amplifier group 94*v* for sensing and amplifying memory cell data read onto vertical bit line pair BLVP; a write driver group 96*v* for writing data to memory cells on vertical bit line pair BLVP; a search line driver group 97 transmitting search data to the search line pair SLP; and an input/output circuit 98*v* for inputting and outputting vertical data DTV and inputting search data SDT.

Either the vertical port or the horizontal port may be used for data transfer with the main processing circuitry. In the following description, data DTV input/output through input/output circuit 98*v* are assumed to correspond to the data DTE of entry unit transferred to/from system bus 19.

Orthogonal memory 80 further includes: a row decoder 92*h* for decoding a horizontal word address ADH and selecting a horizontal word line WLH of memory cell mat 90; a sense amplifier group 94*h* for sensing and amplifying data read onto match line pair MLP; a write driver group 96*h* for writing data to memory cells coupled to match line pair MLP; and an input/output circuit 98*h* inputting and outputting data with sense amplifier group 94*h* and write driver group 96*h*. The data DTH transmitted/received through input/output circuit 98*h* correspond to the data DTB transferred to/from internal data bus 68 (through memory cell mat/orthogonal transformation circuit I/F 48 shown in FIG. 4).

One of input/output circuits 98*v* and 98*h* performs data transfer with system bus 19, and the other performs data transfer with memory cell mat 40 in the main processing circuitry. Here, an example is assumed, in which data DTE of entry unit are successively stored along the vertical direction V and the data DTB of bit unit are successively stored along the horizontal direction H as described above. Along the horizontal direction H, word lines WLH greater in number than the bits of data stored in one entry of memory cell mat of the main processing circuitry are arranged. In order to transfer in parallel the bits of up to the entire entries to and from memory cell mat 40 of the main processing circuitry, input/output circuit 98*h* performs input/output of n-bit data here. After the data have been stored in all entries (defined by the vertical word line) of memory cell mat 90, data transfer from orthogonal memory 80 to the memory cell mat (40) of the main processing circuitry is executed.

Here, it is assumed that when word lines WLV and WLH are selected respectively by row decoders 92*v* and 92*h*, all the transfer data bits are selected. Therefore, a column decoder to further perform column selection is not provided. Word line WLH and match line pair MLP form one data access port (port to the main processing circuitry; horizontal port), and word line WLV and bit line pair BLVP form the other access port (port to system bus I/F; vertical port).

In memory cell mat 90, vertical word line WLV forms one entry, and when data transfer is to be performed in parallel with all the entries of the memory cell mat of the main processing circuitry, m word lines are provided (K=m). One entry in memory cell mat 90 is formed by memory cells MCC aligned in the horizontal direction, of which bit width is L bits.

Figure 8:
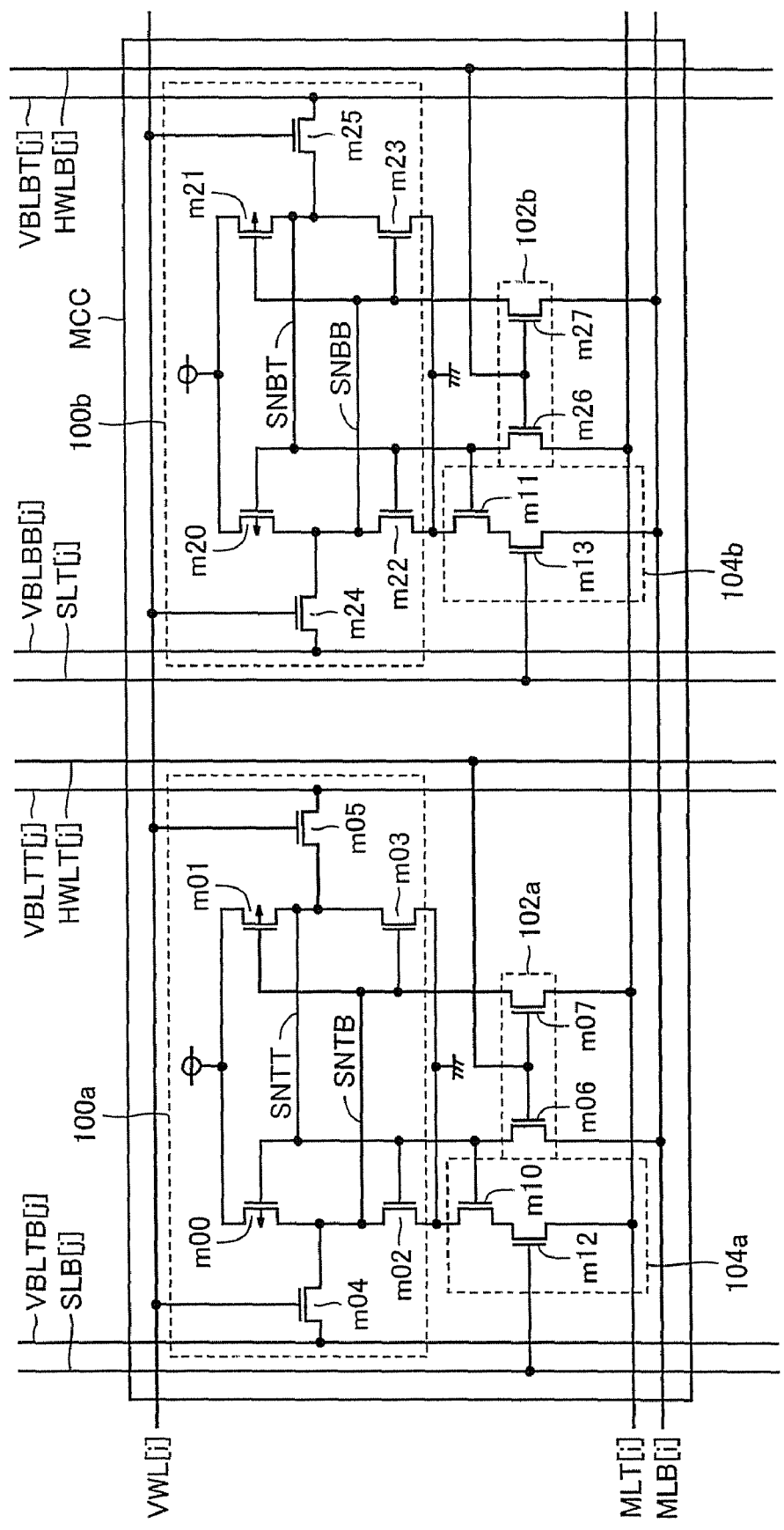
FIG. 8 shows a configuration of the CAM cell shown in FIG. 7.

FIG. 8 shows a specific configuration of a memory cell MCC included in orthogonal memory 80 according to Embodiment 1 of the present invention. In FIG. 8, an electric equivalent circuit of 1-bit memory cell is shown. Memory cell MCC includes a first data storage portion 100*a* that transfers data between vertical bit lines VBLTB[j] and VBLTT[j] in accordance with signal potential on vertical word line VWL[i], and a second data storage portion 100*b* that transfers data between vertical bit lines VBLBB[j] and VBLTT[j] in accordance with a signal on vertical word line VWL[i]. Data storage portions 100*a* and 100*b* each has a configuration of an SRAM cell (Static Random Access Memory cell) storing complementary data, and by these two data storage portions 100*a* and 100*b*, ternary data of "0", "1" and "X" (don't care) are stored.

The first data storage portion 100*a* includes: a P channel MOS transistor m00 connected between a power supply node (high-side power supply node) and a storage node SNTB and having its gate connected to a storage node SNTT; an N channel MOS transistor m02 connected between storage node SNTB and a ground node (low-side power supply node) and having its gate connected to storage node SNTT; a P channel MOS transistor m01 connected between the power supply node and storage node SNTT and having its gate connected to storage node SNTB; an N channel MOS transistor m03 connected between storage node SNTT and the ground node and having its gate connected to storage node SNTB; and N channel MOS transistors m04 and m05, selectively made conductive in accordance with a signal on vertical word line VWL[i] and when made conductive, connecting storage nodes SNTB and SNTT to vertical bit lines VBLTB[j] and VBLTT[j], respectively.

MOS transistors m00 and m02 form a CMOS inverter, and MOS transistors m01 and m03 form a CMOS inverter, In the first data storage portion 10a, as in an SRAM cell, a CMOS inverter latch is used for storing data, and complementary data are stored at storage nodes SNTB and SNTT.

The second data storage portion 100b includes: a P channel MOS transistor m20 and an N channel MOS transistor m22, connected in series between the power supply node and the ground node, and forming a CMOS inverter; a P channel MOS transistor m21 and an N channel MOS transistor m23, connected in series between the power supply node and the ground node, and forming another CMOS inverter; and N channel MOS transistors m24 and m25 selectively rendered conductive in response to a signal potential on vertical word line WLV[j] and, when made conductive, coupling storage nodes SNBB and SNBT to vertical bit lines VBLBB[j] and VBLBT[j], respectively. MOS transistors m20 and m22 have their gates connected to storage node SNBT, and MOS transistors m21 and m23 have their gates connected to storage node SNBB. The second data storage portion 100b also has a configuration of a CMOS inverter latch, and stores complementary data at storage nodes SNBT and SNBB.

Vertical bit lines VBLTB[j], VBLTT[j], VBLBB[j] and VBLBT[j] correspond to the vertical bit line pair VBLP shown in FIG. 7. MOS transistors m04, m05, m24 and m25 of data storage portions 100a and 100b are access transistors, and when these are selectively rendered conductive by the vertical word line, data can be transferred to the vertical bit lines, whereby data can be transferred to/from the host CPU and the orthogonal memory through the systems bus (19).

Memory cell MCC further includes: a first horizontal access gate 102a coupling the storage nodes of data storage portion 100a to match lines MLT[i] and MLB[i] in accordance with a signal on horizontal word line WLT[j]; a second horizontal access gate 102b coupling the storage nodes of data storage portion 100b to match lines MLT[i] and MLB[i] in accordance with a signal on horizontal word line HWLB[j]; a first search/read gate 104a selectively enabled in accordance with search data on search line SLB[j] and driving match line MLT[i] in accordance with the potential of storage node SNTT of the first data storage portion 100a; and a second search/read gate 104b selectively enabled in accordance with search data on search line SLT[j] and driving match line MLB[i] in accordance with a signal on storage node SNBT of the second data storage portion 100b.

Match lines MLT[i] and MLB[i] correspond to the match line pair MLP shown in FIG. 7, and transfer data to/from the memory cell mat of the main processing circuitry through internal data bus 68.

The first horizontal access gate 102a includes N channel MOS transistors m06 and m07 that are rendered conductive in response to a signal potential on horizontal word line HWLT[j] and when made conductive, coupling storage nodes SNTT and SNTB to match lines MLB[i] and MLT[i], respectively. The second horizontal access gate 102b includes N channel MOS transistors m26 and m27 coupling storage nodes SNBT and SNBB of the second data storage portion 100b to match lines MLT[i] and MLB[i], respectively, in accordance with signal potential on horizontal word line HWLB[j].

Horizontal access gates 102a and 102b form the second port (horizontal port) of the memory cell MCC. Match lines MLT[i] and MLB[i] are arranged in a direction orthogonal to the vertical bit line VBLTB[j] and realize orthogonal transformation of data arrangement in the orthogonal memory. Match lines MLT[i] and MLB[i] are used for data transfer to/from the memory cell mat of the main processing circuitry, and selectively inhibits data writing in accordance with the ternary storage data of memory cell MCC.

Search/read gate 104a includes an N channel MOS transistor m10 selectively rendered conductive in accordance with signal potential on storage node SNTT, and an N channel MOS transistor m12 selectively rendered conductive in accordance with a signal on search line SLB[j] and when made conductive, coupling the match line MLT[i] to MOS transistor m10.

Search/read gate 104b includes an N channel MOS transistor m10 selectively rendered conductive in accordance with signal potential on storage node SNBT of the second data storage portion 10b, and an N channel MOS transistor m13 selectively rendered conductive in accordance with signal potential on search line SLT[j] and when made conductive, coupling the match line MLB[i] to MOS transistor m11.

In search/read gates 104a and 104b, MOS transistors m10 and m11 are coupled to the ground node in the memory cell, and when MOS transistors connected in series (m10, m12 or m11, m13) are rendered conductive in search/read gates 104a and 104b, the corresponding match line is driven to the ground voltage level (in a search operation, the match lines MLT[i] and MLB[i] are precharged to the power supply voltage level).

By transferring data representing the search result to match lines MLT[i] and MLB[i] using search/read gates 104a and 104b, it becomes possible to mask an arithmetic/logic operation by each arithmetic logic unit (ALU) in the main processing circuitry, and hence, it becomes possible to execute the arithmetic/logic operation only on the data that satisfy prescribed conditions (a mask register is provided in the arithmetic logic unit, and whether the arithmetic/logic operation should be done or not is set in accordance with a mask bit of the mask register in the arithmetic logic unit).

When horizontal access gates 102a and 102b are used for reading data stored in the first and second data storage portions 100a and 100b, data collision possibly occurs on match lines MLT[i] and MLB[i] (as ternary data are stored). Therefore, at the time of horizontal reading of data, search/read gates 104a and 104b are used and data are read to match lines MLT[i] and MLB[i]. In that case, search lines SLB[j] and SLT[j] are used as read word lines and driven to the selected state (H level).

Generally, a CPU has a write mask function of inhibiting writing of data by a byte unit. In correspondence with the write mask function of the CPU, ternary data are stored using the two data storage portions 100a and 100b, and writing of data to the memory cell mat of the main processing circuitry is selectively inhibited.

Figure 9:
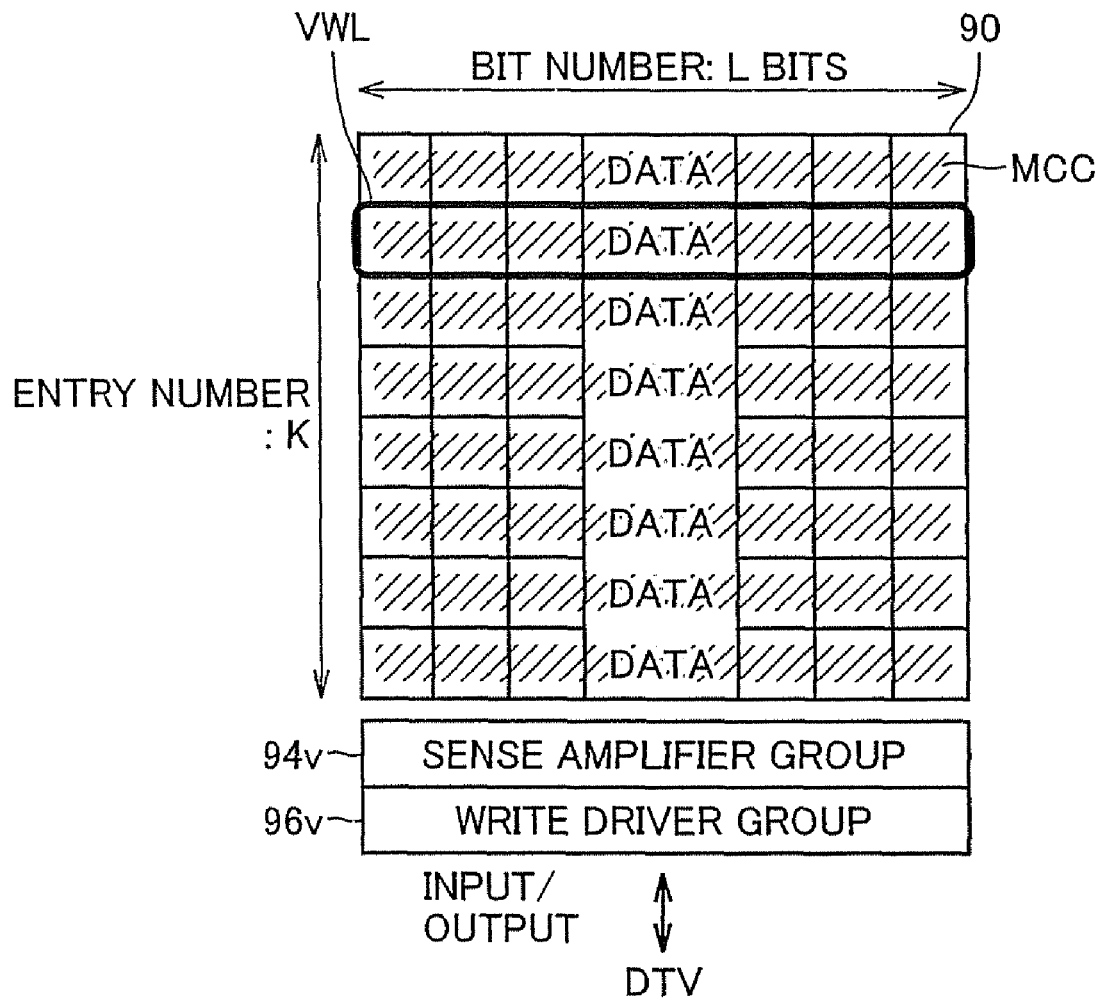
FIG. 9 shows data arrangement of the orthogonal memory cell mat shown in FIG. 7.

FIG. 9 schematically shows a manner of selecting a word line in orthogonal memory 80 in data transfer with an external host CPU. As shown in FIG. 9, in memory cell mat 90, vertical word line VWL is driven to the selected state. In memory cell mat 90, each vertical word line VWL corresponds to one entry, the bit width of data DTV is L bits (maximum), and K entries (maximum: m) are provided. Using sense amplifier group 94v or write driver group 96v, data DATA are read/written from/to the memory cells connected to the selected word line VWL, and data are transferred through the vertical port.

Figure 10:
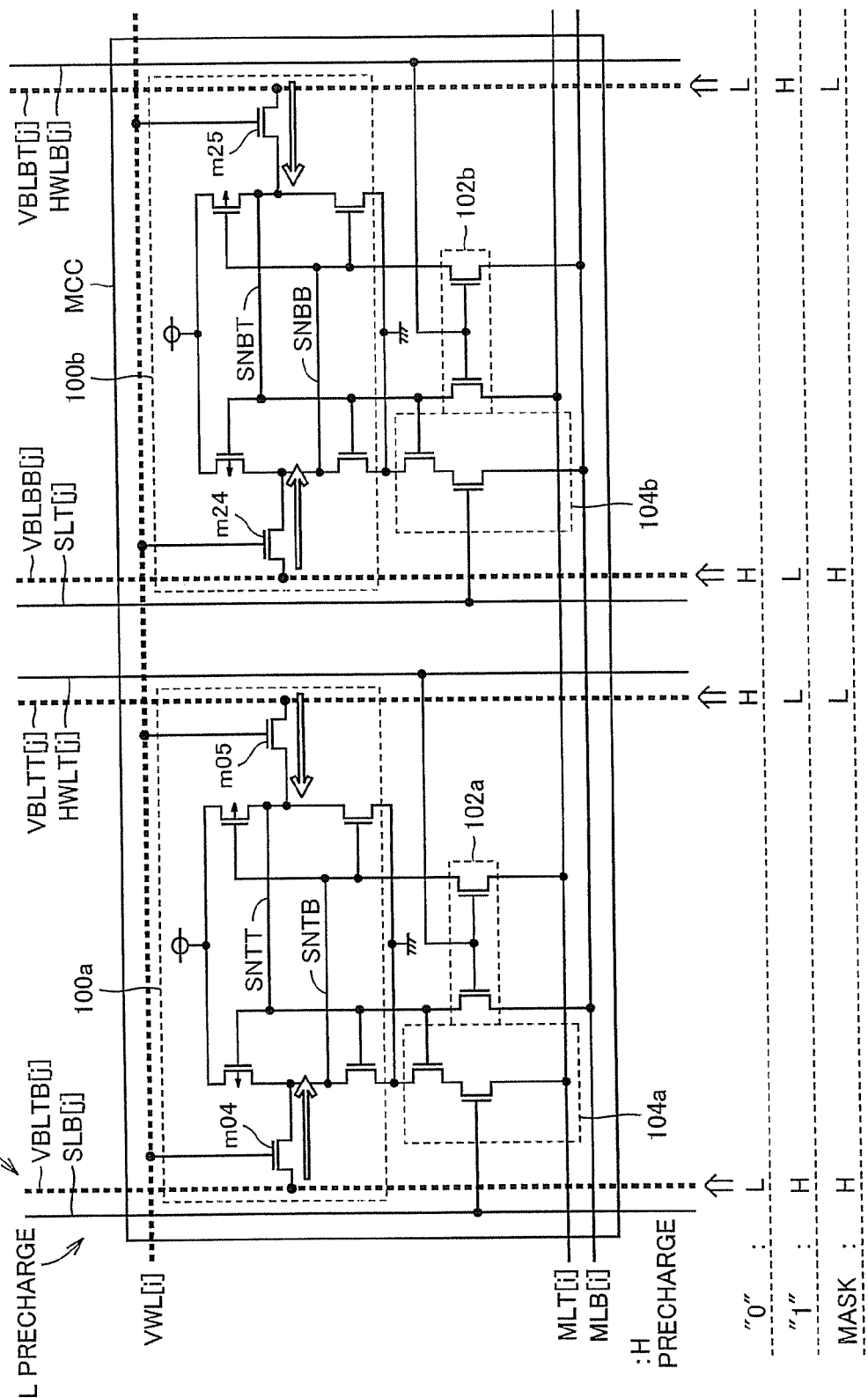
FIG. 10 shows a signal flow at connections of data at vertical ports of the memory cell shown in FIG. 8.

FIG. 10 schematically shows the states of signal lines in writing/reading data DTV As shown in FIG. 10, when data DTV are transferred to or from host CPU, vertical word line VWL[i] is driven to the selected state, and in data storage portions 100a and 100b, access transistors m04, m05, m24 and m25 are rendered conductive In response, storage nodes SNTT and SNTB are coupled to bit lines VBLTT[j] and VBLTB[j], respectively, in data storage portion 100a. Horizontal word lines HWLT[j] and HWLB[j] are at the non-selected state of L level, and horizontal access gates 102a and 102b are non-conductive. Further, search lines SLB[j] and SLT[j] are also at the L level, and search/read gates 104a and 104b are also non-conductive.

When data "0" is written, bit lines VBLTB[j] and VBLTT [j] are respectively driven to L level and H level, and bit lines VBLBB[j] and VBLBT[j] are respectively driven to H level and L level. When data "1" is written, bit lines VBLTB[j] and VBLTT[j] are respectively driven to the H level and L, level, and bit lines VBLBB[j] and VBLBT[j] are respectively driven to the L level and H level.

When a data write is to be masked, as mask data, bit lines VBLTB[j] and VBLTT[j] are respectively driven to H level and L level, and bit lines VBLBB[j] and VBLBT[j] are respectively driven to the H level and L level.

By storing 1 bit CPU data using 2 bit information with two data storage portions 100a and 100b, it becomes possible to store ternary data and, hence, to store mask data inhibiting data writing in the memory cell mat of the main processing circuitry. When the mask data is stored, the match lines MLT [i] and MLB[i] used as the bit lines for data transfer with the memory cell mat of the main processing circuitry are both maintained at the precharged state, and data writing in the memory cell mat of the main processing circuitry is inhibited.

In reading data DTV from memory cell mat 90, binary data "0" or "1" is read (even when the write mask function is realized, data reading means reading of data that has been transferred from the main processing circuitry, and in the memory cell, the ternary data allowing mask data is not stored but binary data is stored).

Figure 11:
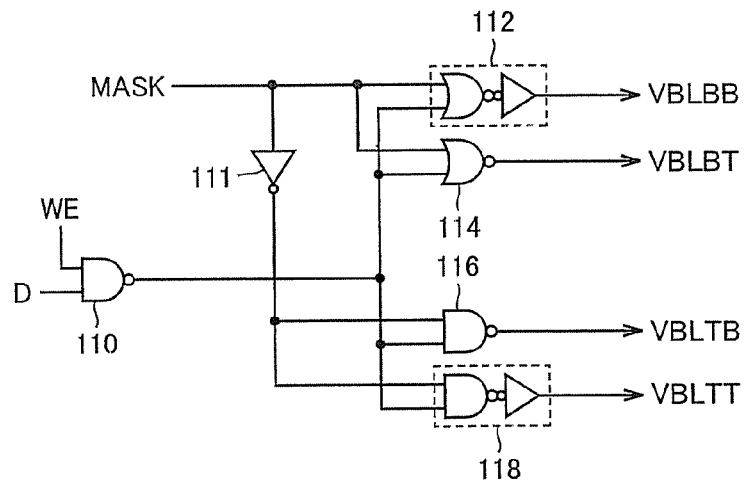
FIG. 11 shows an exemplary configuration of a circuit driving a vertical bit line of FIG. 10.

FIG. 11 shows an exemplary configuration of a write driver arranged for a column of memory cells in the vertical direction, in write driver group 96v shown in FIG. 9. In write driver group 96v, write drivers of the same configuration are arranged for respective columns in the vertical direction, and therefore, in FIG. 11, bit lines provided for memory cells arranged aligned in the vertical direction are generally represented by vertical bit lines VBLTT, VBLTB, VBLBB and VBLBT.

In the following description also, as regards representation of signal lines, when a specific signal line is to be identified, a suffix [i] or [j] is added, and when signal lines are generally referred to, such a suffix is omitted.

Referring to FIG. 11, the write driver includes: an NAND circuit 110 receiving a write instruction signal WE and 1 bit data D; an inverter circuit 111 inverting a mask instruction signal MASK; an OR circuit 112 receiving the mask instruction signal MASK and an output signal of NAND circuit 110 and driving bit line VBLBB; an NOR circuit 114 receiving the mask instruction signal MASK and an output signal of NAND circuit 110 and driving bit line VBLBT; an NAND circuit 116 receiving an output signal of inverter 111 and an output signal of NAND circuit 110 and driving bit line VBLTB; and an AND circuit 118 receiving an output signal of inverter circuit 111 and an output signal of NAND circuit 110 and driving bit line VBLTT. Write instruction signal WE is set to the H level in the data write mode. Mask instruction signal MASK is set to the H level (for example, in the byte unit) when the write mask operation is executed to mask a data write.

In a common, non-masked data writing, the write instruction signal WE is set to the H level and the mask instruction signal MASK is set to the L level. When the data bit is "0" and at the L level, the output signal of NAND circuit 110 attains to the H level. In response, the output signal of OR circuit 112 attains to the H level, and the output signal of AND circuit 118 attains to the H level. Further, the output signal of NOR circuit 114 attains to the L level and the output signal of NAND circuit 116 attains to the L level. Therefore, bit lines VBLBB and VBLTT are driven to the H level, and bit lines VBLTB and VBLBT are driven to the L level.

When the data bit D is "1" and at the H level, the output signal of NAND circuit 110 attains to the L level. The mask instruction signal MASK is at the L level, and therefore, the output signal of OR circuit 112 attains to the L level, and bit line VBLBB is driven to the L level. On the other hand, NOR circuit 114 has both inputs at L level, and hence, bit line VBLBT is driven to the H level. NAND circuit 116 drives bit line VBLTB to the H level in accordance with the L level signal from NAND circuit 110, and AND circuit 118 drives bit line VBLTT to the L level.

In a write mask operation, mask instruction signal MASK is set to the H level and, in response, the output signal of inverter 111 is set to the L level. Consequently, by NAND circuit 116, bit line VBLTB is driven to the H level, and by AND circuit 118, bit line VBLTT is driven to the L level. Further, OR circuit 112 drives bit line VBLBB to the H level, and NOR circuit 114 drives bit line VBLBT to the L level.

Therefore, by writing complementary data to data storage portions 100a and 100b utilizing the exemplary configuration of the write driver shown in FIG. 11, it is possible to store ternary data in memory cell MCC, in accordance with the data bit D and mask instruction signal MASK.

As to the sense amplifiers of sense amplifier group 94v shown in FIG. 9, a sense amplifier may be provided to perform a reading operation based on data of one of the data storage portions 100a and 100b, or a configuration may be adopted in which data read from data storage portions 100a and 100b are sensed by preamplifiers, and the output signals of these preamplifiers are amplified by a main amplifier to obtain a final 1 bit of data. In data reading, the mask data is not read, and binary data is read.

As to the mask instruction signal MASK and write instruction signal WE, a mask instruction signal and a write instruction signal (write enable signal) are applied from an external host CPU to for-outside-transfer control circuit 88 shown in FIG. 4, and for-outside-transfer control circuit 88 generates the mask instruction signal MASK, for example, in a byte unit.

Figure 12:
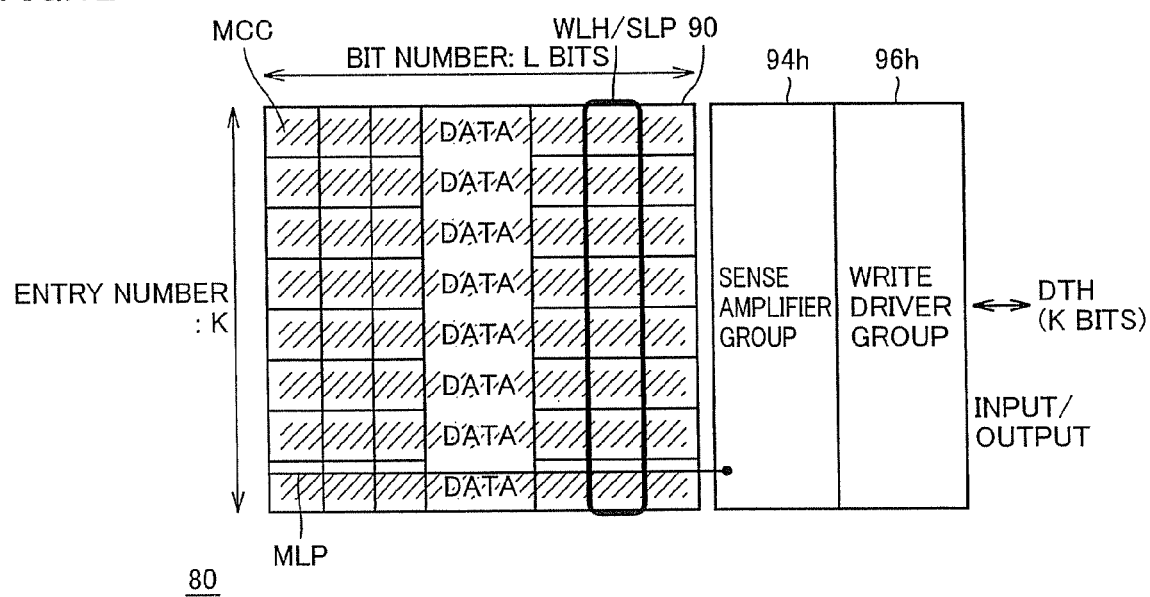
FIG. 12 schematically shows a data arrangement at the time of a horizontal port access in the orthogonal memory cell shown in FIG. 7.

FIG. 12 schematically shows the state of orthogonal memory 80 in data transfer through the horizontal port. Referring to FIG. 12, in data transfer through the horizontal port, horizontal word line WLH is driven to the selected state in memory cell mat 90. The match line pair MLP arranged corresponding to each entry is used as an internal data transmission lines, and by sense amplifier group 94v or write driver group 96h, data is read or written, and data DTH (K bit width) is transferred to or from the memory cell mat of the main processing circuitry.

At the time of this data transfer, it is necessary to transmit ternary data to mask data writing to the memory cell mat in the main processing circuitry. Therefore, when data are transferred from memory cell mat 90 to memory cell mat (40) of the main processing circuitry, the search line pair SLP is used as the read word line, and data stored in two data storage portions (100a, 100b) are read each being a single end, to match line pair MLP through the search/read gate. This allows transfer of ternary data.

Figure 13:
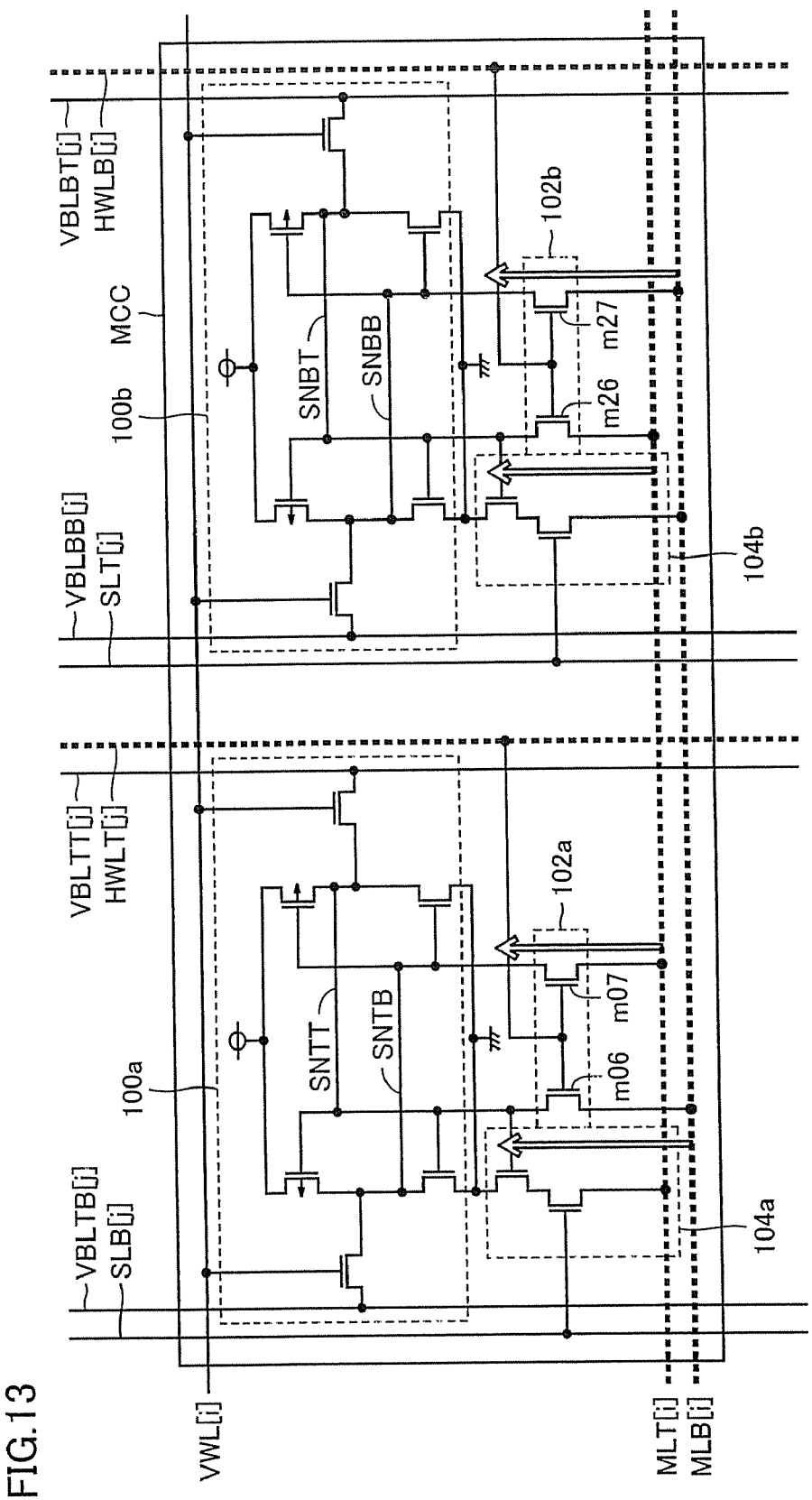
FIG. 13 schematically shows a signal flow at the time of data writing through a horizontal port of the memory cell shown in FIG. 8.

FIG. 13 shows a state of a memory cell when data is written from the memory cell mat of the main processing circuitry to memory cell mat 90. In data writing from the main processing circuitry to memory cell mat 90, horizontal word lines HWLT [j] and HWLB[j] are driven to the H level. Vertical word line VWL[j] and search lines SLB[j] and SLT[j] are set to the L level.

The write data is transferred to match lines MLT[i] and MLB[i]. In this state, at horizontal access gates 102a and 102b of memory cell MCC, MOS transistors m06, m07, m26 and m27 are rendered conductive. Search/read gates 104a and 104b are non-conductive. Horizontal access gate 102a couples match lines MLT[i] and MLB[i] to storage nodes SNTB and SNTT of data storage portion 100a, respectively. In data storage portion 100b, match lines MLT[i] and MLB[i] are coupled to storage nodes SNBT and SNBB, respectively, through access gate 102b. Therefore, in data storage portions 100a and 100b, complementary data can be stored, and hence, binary data can be stored.

Data writing is executed in memory cells MCC connected to horizontal word lines HWLT[j] and HWLB[j], using corresponding match lines MLT and MLB, respectively. The data stored in the memory cell mat of the main processing circuitry is binary data, and in data writing through the horizontal port, mask function is not provided. Therefore, by reversing the connections to match lines MLT[i] and MLB[i] between storage nodes SNTT and SNTB and storage nodes SNBT and SNBB in data storage portions 100a and 100b, complementary data can be written to data storage portions 100a and 100b.

Figure 14:
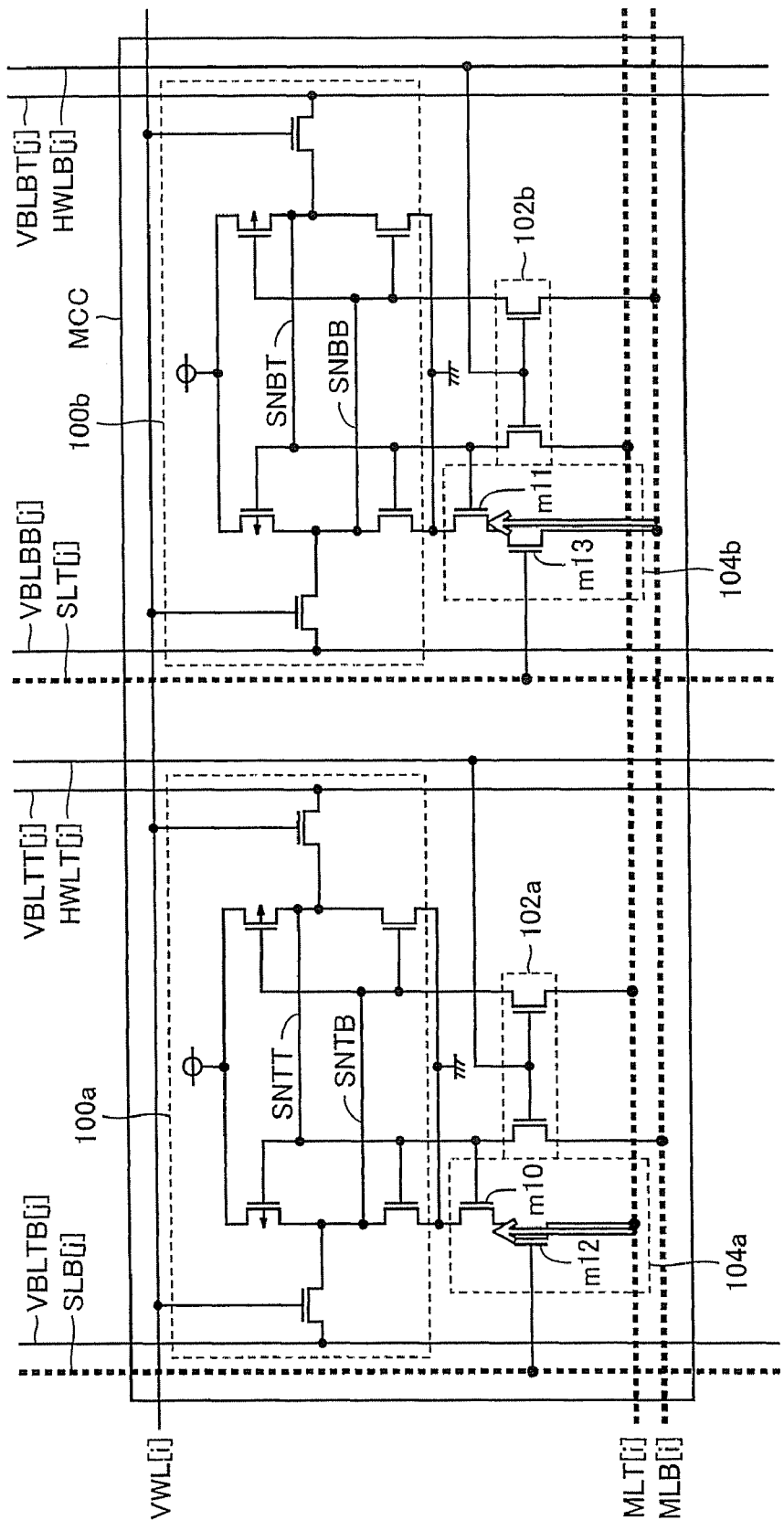
FIG. 14 schematically shows a signal flow at the time of data reading through a horizontal port of the memory cell shown in FIG. 8.

FIG. 14 shows an internal state of memory cell MCC in data reading through the horizontal port. At the time of data reading through the horizontal port, search lines SLB[i] and SLT[i] are driven to the selected state, and horizontal word lines HWLT[j] and HWLB[j] are maintained at an unselected state. Similarly, vertical word line VWL[i] is also maintained at the unselected state.

In memory cell MCC, MOS transistor m12 is rendered conductive at search/read gate 104a, and similarly, MOS transistor m13 is rendered conductive at search/read gate 104b. Match lines MLT[i] and MLB [i] are precharged to the H level. In accordance with the data stored at storage node SNTT of data storage portion 100a, match line MLT[i] is selectively driven to the ground level, and in accordance with the stored potential at storage node SNBT of data storage portion 100b, match line MLB[i] is selectively driven to the ground level.

As can be seen from FIG. 10 showing the write data, when data "0" is held in memory cell MCC, storage node SNTT of data storage portion 100a is at the H level and storage node SNBT of data storage portion 100b is at the L level. Therefore, at search/read gate 104a, MOS transistor m10 is conductive and at search/read gate 104b, MOS transistor m11 is non-conductive. Accordingly, match line MLT[i] is discharged to the ground voltage level, and match line MLB[i] is maintained at the H level of the precharge voltage level. Thus, data "0" is transferred through match lines MLT[i] and MLB [i]

When data "1" is stored in memory cell MCC, storage node SNTT of data storage portion 100a is at the L level and storage node SNBT of data storage portion 100b is at the H level. Therefore, in this case, at search/read gate 104a, MOS transistor m10 is non-conductive and at search/read gate 104b, MOS transistor m11 is conductive. Therefore, match line MLT[i] attains to the H level of the precharge voltage level and match line MLB [i] attains to the L level of the ground voltage level, whereby data "1" is read.

When mask data is stored in memory cell MCC, storage node SNTT of data storage portion 100a is at the L level and storage node SNBT of data storage portion 100b is also at the L level. Therefore, in this state, at search/read gates 104a and 104b, MOS transistors m10 and m11 are non-conductive, discharge of match lines does not occur, and match lines MLT[i] and MLB[i] are maintained at the H level of the precharge voltage level.

Figure 15:
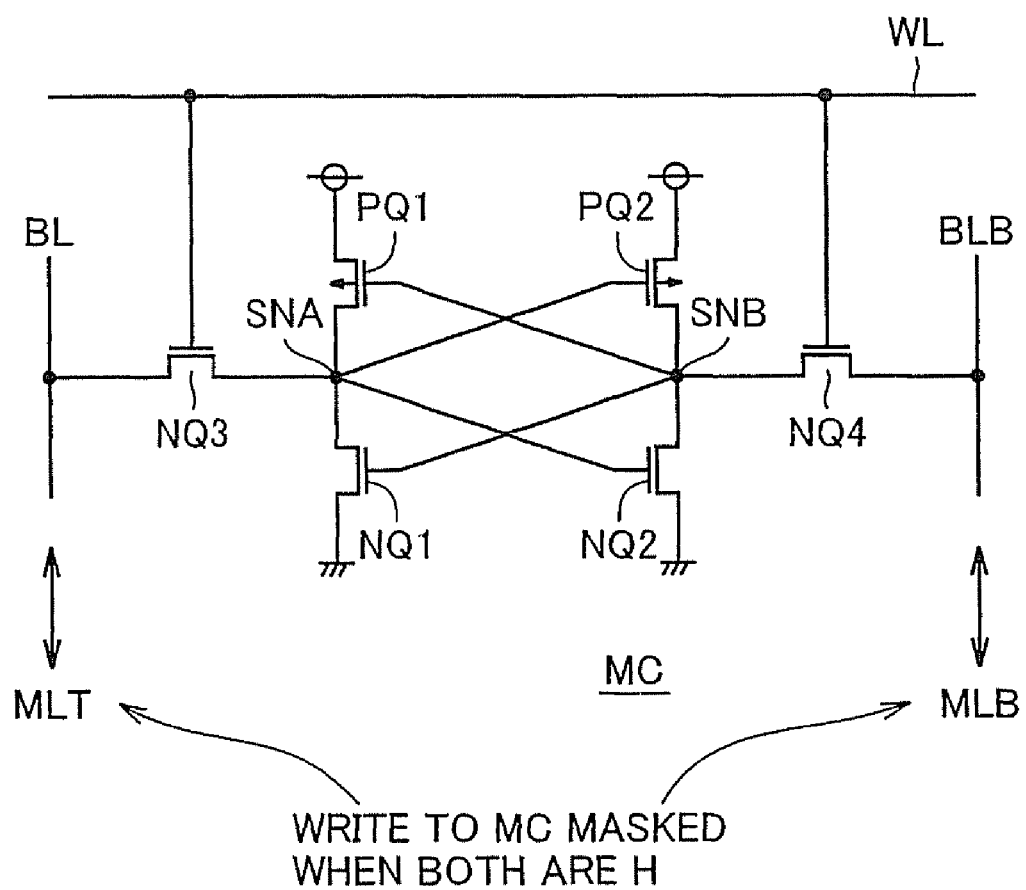
FIG. 15 shows a configuration of a memory cell included in the memory mat of the main processing circuitry FIG. 16 schematically shows a signal flow at the time of searching in the memory cell mat shown in FIG. 8.

FIG. 15 shows an exemplary configuration of a memory cell MC included in the memory cell mat (40) of the main processing circuitry. Referring to FIG. 15, a memory cell MC of the main processing circuitry includes P channel MOS transistors PQ1 and PQ2 having their gates and drains cross-coupled, and N channel MOS transistors NQ1 and NQ2 having their gates and drains cross-coupled. MOS transistors PQ1 and NQ1 have their drains coupled to a storage node SNA, and MOS transistors PQ2 and NQ2 have their drains coupled to a storage node SNB.

The memory cell MC further includes N channel MOS transistors NQ3 and NQ4 coupling storage nodes SNA and SNB to bit lines BL and BLB in accordance with signal potential on the word line WL.

The memory cell MC is an SRAM cell. To bit lines BL and BLB, signals in accordance with the signals on match lines MLT and MLB are transmitted. Therefore, when data bits on match lines MLT and MLB are both at the H level, the data held at storage nodes SNA and SNB of memory cell MC are unchanged (same as in a common data reading). When complementary data (H level and L level) are transmitted to bit lines BL and BLB, one of the storage nodes SNA and SNB is driven to the H level and the other is driven to the L level, so that the data is written.

Therefore, by setting match lines MLT (MLT[i]) and MLB (MLB[i]) both to the H level, a data write to the memory cell MC can be inhibited, and write mask function is realized.

Figure 16:
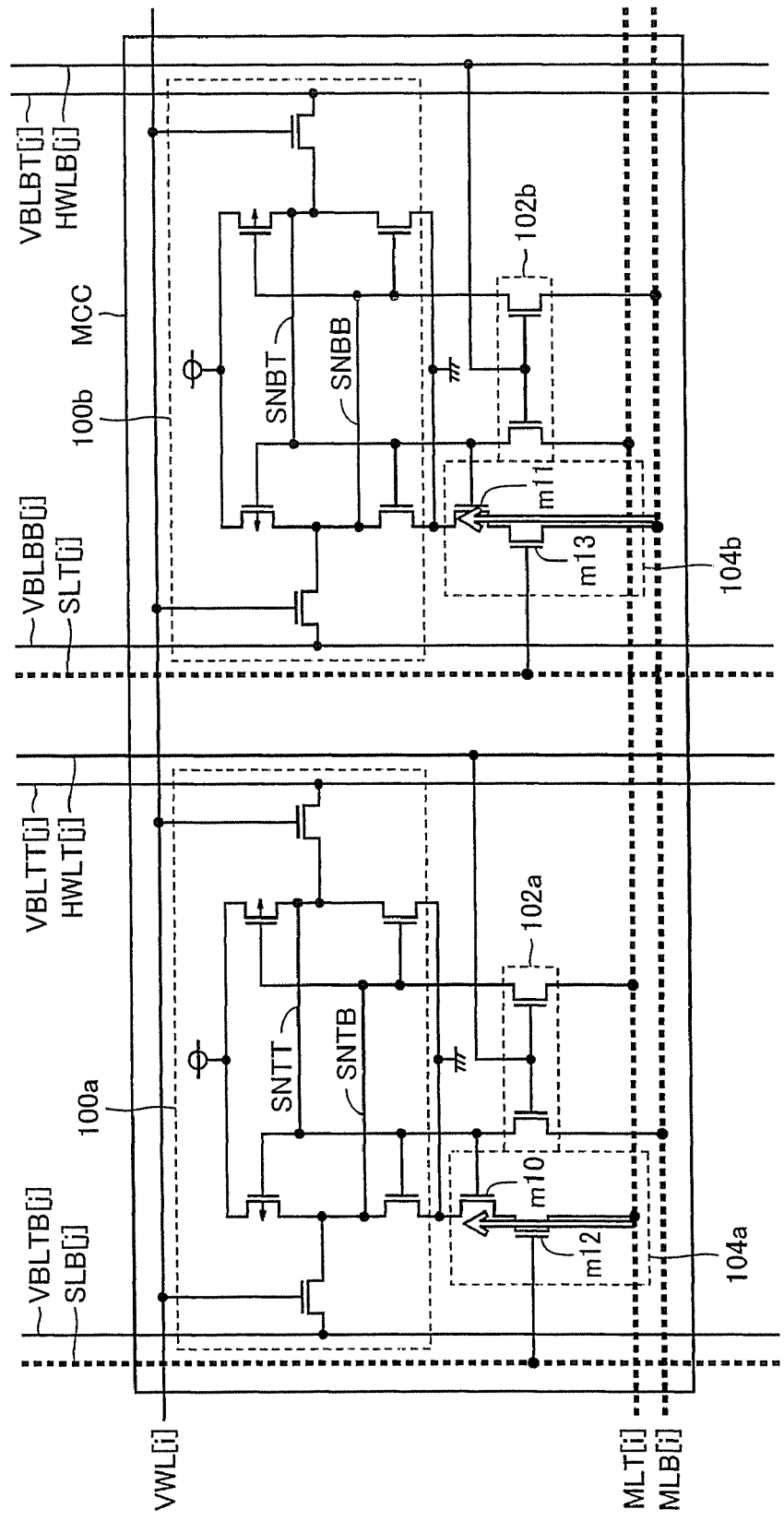

FIG. 16 shows states of signal lines when the memory cell MCC of the orthogonal memory is subjected to the CAM operation. In the CAM operation, search data are transmitted to search lines SLB[j] and SLT[j]. When the data stored in memory cell MCC is not the target of searching, search lines SLB[j] and SLT[j] are both maintained at the L level. Therefore, when the data stored in memory cell MCC is not the target of searching, at search/read gates 104a and 104b, MOS transistors m12 and m13 are non-conductive, and there is no influence to the signal potentials on match lines MLT[i] and MLB[i].

To search lines SLB[j] and SLT[j], a bit value and inverted value thereof are transferred, respectively. Therefore, when the search data is data "0", search line SLB[j] is set to the L level and search line SLT[j] is set to the H level. When memory cell MCC stores the data "0", storage node SNTT is at the H level and storage node SNBT is at the L level. Therefore, in this state, at search/read gates 104a and 104b, MOS transistors m12 and m11 are rendered non-conductive, and match lines MLT[i] and MLB[i] are maintained at the precharge voltage level.

When memory cell MCC stores data "0" and search data "1" is applied, at search/read gate 104a, MOS transistors m10 and m12 are rendered conductive, match line MLT[i] is discharged to the ground node, and the voltage level thereof lowers. On the contrary, when memory cell MCC stores data "1" and search data "0" is transmitted, at search/read gate 104b, MOS transistors m11 and m13 are rendered conductive, and match line MLB[i] is discharged to the ground level.

Therefore, when match lines MLT[i] and MLB[i] are both maintained at the precharge voltage level (H level), it is determined that the search data matches the data stored in memory cell MCC. Match lines MLT[i] and MLB[i] extend in the horizontal direction in memory cell mat 90, and arranged common to the memory cells of one entry. Therefore, each determination result of match/mismatch of the data bits of one entry appears on the match lines. Accordingly, by checking whether match lines MLT[i] and MLB[i] are both maintained at the precharge level or not, match/mismatch between the search data and one entry could be determined.

Figure 17:
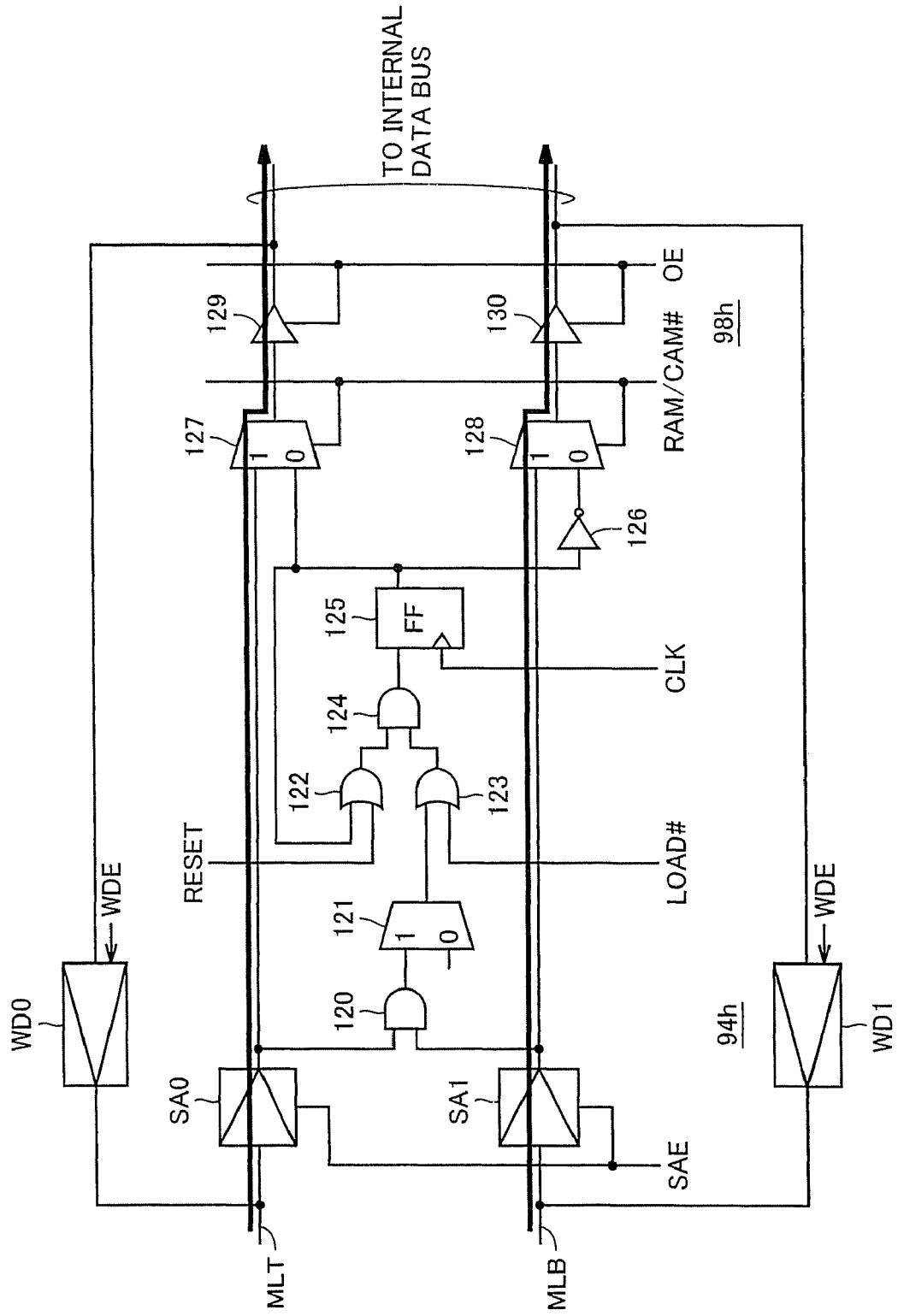
FIG. 17 schematically shows configurations of a sense amplifier and a write driver at a horizontal port, when the memory cell shown in FIG. 8 is used.

FIG. 17 schematically shows exemplary configurations of the sense amplifier portion and a data output portion related to 1 bit of data, in sense amplifier group 94h (see FIG. 12) at the data reading portion of the horizontal port. FIG. 17 also shows a data flow when the RAM operation is executed in memory cell mat 90.

Referring to FIG. 17, a sense amplifier circuit of sense amplifier group 94h includes: single end sense amplifiers SA0 and SA1 provided corresponding to match lines MLT and MLB, respectively, and amplifying signal potentials on match lines MLT and MLB in response to activation of a sense amplifier activating signal SAE; a 2-input AND circuit 120 receiving output signals of sense amplifiers SA0 and SA1; a selector 121 selecting one of the output signal from AND circuit 120 and, for example, a test signal, not shown; an OR circuit 123 receiving an output signal of selector 121 and a search result designating signal LOAD#; an OR circuit 122 receiving a reset signal RESET and an output signal of a flip-flop (FF) 125; and an AND circuit 124 receiving output signals of OR circuits 122 and 123.

Selector 121 selects one of a test instruction signal in a test mode and an output signal of AND circuit 120. FIG. 17 does not show the test signal that is applied to the input "0" of the selector. In a normal operation, selector 121 selects the output of AND circuit 120. Here, inputs "1" and "0" of selector 121 represent a state in which the signal applied to the input "1" is selected when a select control signal, not shown, is at "1" (H level).

Flip-flop (FF) 125 takes in and latches the output signal of AND circuit 124 in synchronization with a clock signal CLK.

An output of a 1-bit sense amplifier circuit of sense amplifier group 94h is applied to input/output circuit 98h. The output portion of input/output circuit 98h includes: a selector 127 selecting one of an output signal of sense amplifier SA0 and an output signal of flip-flop (FF) 125 in accordance with a selection control signal RAM/CAM#; an inverter 126 receiving an output signal of flip-flop 125; a selector 128 selecting one of an output signal of sense amplifier SA1 and an output signal of inverter 126 in accordance with a selection control signal RAM/CAM#; and tri-state buffers 129 and 130 activated in accordance with an output enable signal OE and, when activated, buffering and outputting output signals of selectors 127 and 128. Output signals of tri-state buffers 129 and 130 are transmitted through memory cell mat/orthogonal transformation circuit I/F 84 shown in FIG. 4 previously to internal data bus 68, and further to the memory cell mat of the main processing circuitry.

When the RAM operation is to be performed by the orthogonal memory, that is, when the data stored in the memory cells of orthogonal memory are read and transferred to the memory cell mat of the main processing circuitry, selection control signal RAM/CAM# is set to the H level, and selectors 127 and 128 each select the signal applied to the input "1".

In response to the activation of sense amplifier activating signal SAE, sense amplifiers SA0 and SA1 amplify the signals on match lines MLT and MLB and transmit amplified signals to selectors 127 and 128, respectively. By amplifying the selected signals of selectors 127 and 128 by tri-state buffers 129 and 130 in accordance with the output enable signal OE, the data read to match lines MLT and MLB in the orthogonal memory can be transferred through the internal data bus to the memory cell mat of the main processing circuitry.

Figure 18:
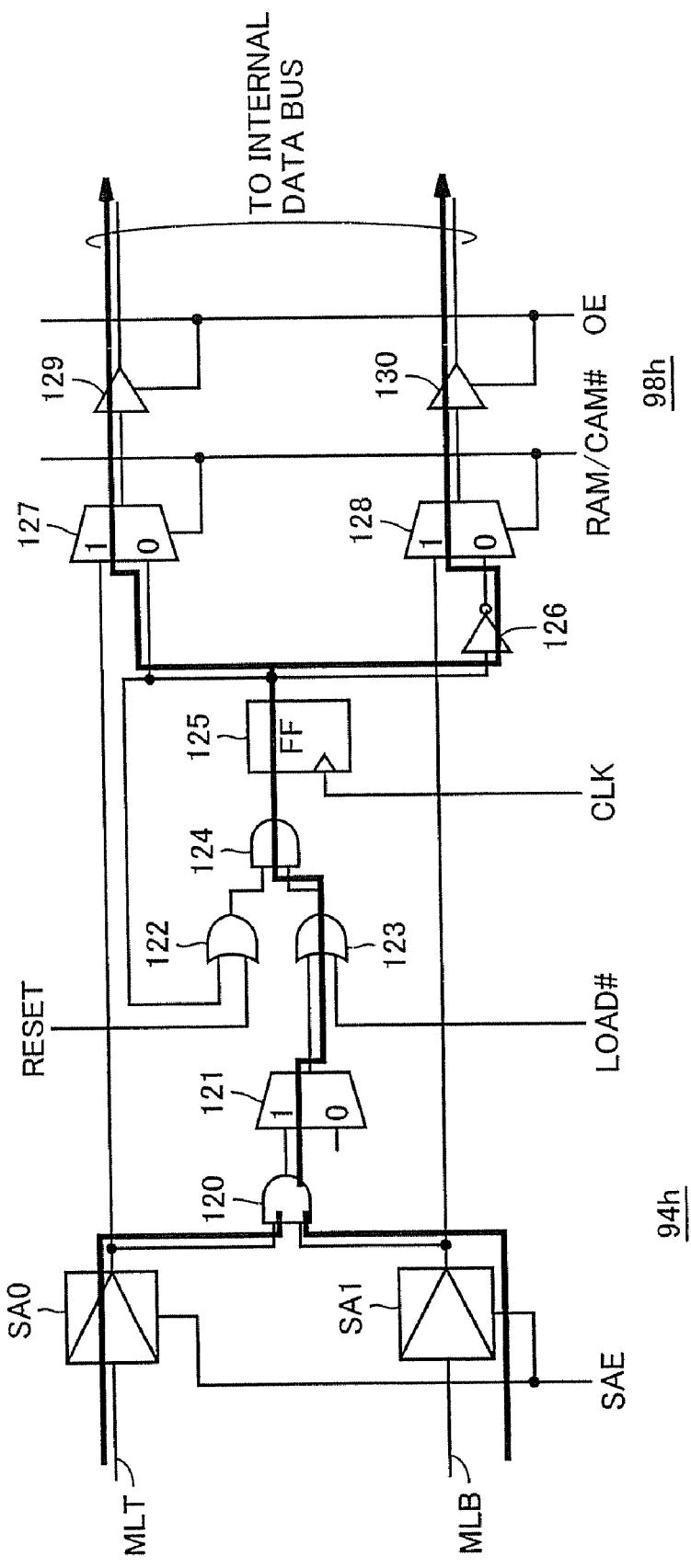
FIG. 18 shows a signal flow at the time of reading a search result, when the memory cell shown in FIG. 8 is used.

FIG. 18 shows a signal flow when the CAM operation is performed in the orthogonal memory, that is, when a signal indicating the result of match/mismatch determination in accordance with the search data is transmitted. In the CAM operation in which data that matches the search data is searched, first, the reset signal RESET is set to the H level, and clock signal CLK is toggled. In this state, the output signal of OR circuit 122 attains to the H level in accordance with the reset signal RESET. The load signal LOAD# setting the timing of holding the search result data is at the H level. Therefore, the output signals of OR circuits 122 and 123 both attain to the H level, and the output signal of AND circuit 124 attains to the H level. In flip-flop (FF) 125, the output signal of AND circuit 124 is taken in accordance with the clock signal CLK, and the signal held in flip-flop 125 attains to the H level. Corresponding to the state in which match lines MLT and MLB are both at the initial state of H level, flip-flop 125 is set to the match detected state, as the initial state.

At the time of a search operation, reset signal RESET is at the L level, and OR circuit 122 outputs a signal at the H level in accordance with an output signal of flip-flop 125.

A search operation takes place in the orthogonal memory, and the voltage levels of match lines MLT and MLB are set from the precharged state to states reflecting the result of search. Sense amplifier activating signal SAE is activated at a prescribed timing, signal potentials of match lines MLT and MLB are amplified, and AND circuit 120 determines whether match lines MLT and MLB are both at the H level or not. When the search data matches the data held in the corresponding entry, match lines MLT and MLB are both at the H level, and the output signal of AND circuit 120 is at the H level. When the output signals of AND circuit 120 and selector 121 are established, load signal LOAD# is set to the L level, OR circuit 123 performs the buffering operation, and the output signal of AND circuit 120 is buffered and transmitted to AND circuit 124.

As the output signal of OR circuit 122 is at the H level, AND circuit 124 operates as a buffer circuit and, therefore, the output signal of AND circuit 124 indicates match/mismatch between the search data and the data held in the corresponding entry. In accordance with clock signal CLK, flip-flop 125 takes in and holds the applied signal. Therefore, the data held in flip-flop 125 is at the H level when the search data matches the data stored in the corresponding entry, and at the L level when they do not match. When the output signal of flip-flop 125 is set to the L level, the output signal of OR circuit 122 attains to the L level (reset signal RESET attains to the L level), and therefore, even when the clock signal CLK is toggled, the output signal of AND circuit 124 is always kept at the L level. Thus, the signal indicating the result of match searching is correctly held by flop-flop 125.

In a search operation, selection control signal RAM/CAM# is at the L level, selectors 127 and 128 each select the signal applied to the "0" input, and tri-state buffers 129 and 130 transmit the result of match/mismatch to the internal data bus in accordance with the output enable signal OE. Therefore, to the internal data bus, complementary signals representing the result of match/mismatch determination are transmitted (inverter circuit 126 reflects the output signal of flip-flop 125).

By utilizing the configurations of sense amplifier group 94h and input/output circuit 98h shown in FIGS. 17 and 18, both the RAM operation and CAM operation of the orthogonal memory can be realized.

As another possible configuration, the search result may not be held in the flip-flop 125 using clock signal CLK but the output signal of AND circuit 120 at the time of a search operation may be applied to selectors 127 and 128.

Further, as shown in FIG. 17, when the data transferred from the memory cell mat of the main processing circuitry are written to the orthogonal memory, complementary data transmitted through the internal data bus are amplified and transmitted to match lines MLT and MLB, using write drivers WD0 and WD1 provided for match lines MLT and MLB, respectively. The write drivers WD0 and WD1 are included in the write driver group (96h), and activated in response to activation of a write driver enable signal WDE.

The control signals shown in FIGS. 17 and 18 are generated by for-inside-transfer control circuit 86 shown in FIG. 4.

Figure 19:
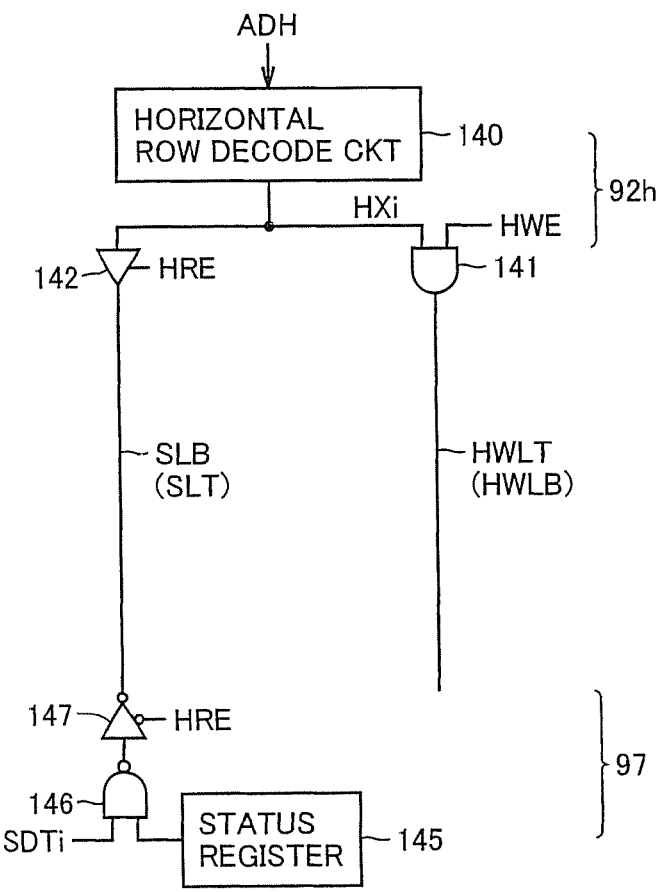
FIG. 19 shows an exemplary configuration of a circuit driving the search line and the horizontal word line when the memory cell shown in FIG. 8 is used FIG. 20 schematically shows a transfer path of the search result in a searching operation.

FIG. 19 shows an exemplary configuration of a portion driving the horizontal word line HWLT (HWLB) and the search line SLB (SLT). The portion driving the horizontal word line HWLT (HWLB) and the search line SLB (SLT) corresponds to the arrangement included in row decoder 92h and search line driver group 97 shown in FIG. 7.

Row decoder 92h includes: a horizontal row decode circuit 140 generating a horizontal row selecting signal HXi for selecting a horizontal word line/search line in accordance with an address signal ADH; an AND circuit 141 driving the horizontal word line HWLT (or HWLB) to the selected state in accordance with a horizontal data write instruction signal HWE and the horizontal row selecting signal HXi; and a tri-state buffer 142 activated when a horizontal read instruction signal HRE is activated, and when activated, driving the search line SLB (or SLT) to the selected state in accordance with the horizontal row selecting signal HXi from the horizontal row decode circuit 140.

Horizontal write instruction signal WE designates an operation mode in which the data transferred from the memory cell mat of the main processing circuitry are written to the orthogonal memory, and horizontal read instruction signal HRE designates a data transfer operation from the orthogonal memory to the memory cell mat of the main processing circuitry.

Search line driver group 97 includes: a status register storing data indicating whether the search of the corresponding row is valid or invalid; an NAND circuit 146 receiving the data stored in status register 145 and a search data bit SDTi; and a tri-state inverter buffer 147 activated when the horizontal read instruction signal HRE is inactivated, and when activated, driving the search line SLB (or SLT) in accordance with an output signal of NAND circuit 146.

In searching, complementary data are transmitted to search lines SLB and SLT, and when they are not the target of searching, these search lines are both maintained at the L level in accordance with the data stored in status register 145. Horizontal word lines HWLT and HWLB each are provided with the AND circuit 141, and in horizontal data writing, these are driven to the selected state in accordance with the horizontal row selecting signal HXi from horizontal row decoder 140.

Therefore, at the time of horizontal reading, tri-state buffer 142 is activated, tri-state inverter buffer 147 is inactive, and search line SLB is driven to the selected state in accordance with the horizontal row selecting signal HXi. In this state, horizontal write instruction signal HWE is inactive, and horizontal word lines HWLT and HWLB are at the unselected state. Thus, ternary data of the memory cell can be read to match lines MLT and MLB, using the search/read gate.

In a searching operation, tri-state buffer 142 is inactive and at an output high-impedance state. Here, search line SLB (and SLT) is driven in accordance with the data stored in status register 145, by tri-state inverter 147 and NAND circuit 146.

The data representing target/non-target of search stored in status register 145 may be applied through the same terminal to which the search data SDT (SDTi) is input, or it may be applied through a terminal that receives the data DTV.

Figure 20:
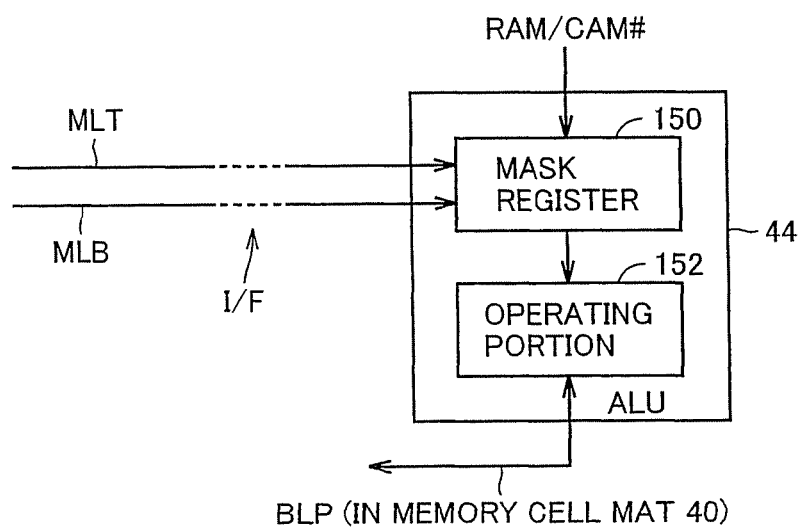

FIG. 20 schematically shows a configuration of arithmetic logic unit 44. As shown in FIG. 20, arithmetic logic unit 44 includes a mask register 150 receiving the read data corresponding to the signals on match lines MLT and MLB through the internal data bus and the input/output circuit (represented by I/F), and an operating portion 152 of which arithmetic/logic operation is inhibited/executed under the control of mask register 150.

Mask register 150 stores the search result data read onto match lines MLT and MLB of the orthogonal memory when the CAM operation is designated by the selection control signal RAM/CAM#. Operating portion 152 has a function of performing addition, subtraction, multiplication, division, inversion and others, and executes an arithmetic/logic operation by transferring data to and from the corresponding entry (bit line pair BLP) in memory cell mat 40.

Therefore, by storing the search result data in mask register 150, dependent on whether the search conditions of the data of one entry aligned along the horizontal direction in the orthogonal memory are satisfied or not, the arithmetic/logic operation of the arithmetic logic unit 44 of the corresponding entry in the main processing circuitry can be controlled. Namely, the arithmetic/logic operation can be executed only when the corresponding data satisfy the prescribed conditions.

Further, whether the arithmetic/logic operation should be executed or not is controlled in accordance with the search result, and therefore, it becomes possible to execute an arithmetic/logic operation on data being low in degree of parallelism using only the necessary arithmetic logic unit or units. By way of example, parallel processing of 256 entries, 512 entries or 1024 entries can be achieved, and thus, arithmetic/logic operation flexibly corresponding to the contents of processing can be executed.

As to the configuration for writing the data of search result to mask register 150, each internal data bus of the main processing circuitry may be directly coupled to the mask register, or a configuration in which the search result data is transferred to the corresponding arithmetic logic unit through the sense amplifier and the write driver in the main processing circuitry and the data is stored in mask register 150 may be used.

As described above, in Embodiment 1 of the present invention, 2-port CAM cells are used in the orthogonal memory, and high speed data transfer is possible with the data arrangement transformed between an external host CPU and the internal main processing circuitry. Further, by the search function, it becomes possible to execute an arithmetic/logic operation in the main processing circuitry only on the data that satisfy prescribed conditions. Further, as a configuration for storing ternary data is provided, a data writing to the memory cell mat in the main processing circuitry can be inhibited, and in accordance with a write mask function of an external host CPU, the function of write mask to the entry of memory cell mat in the main processing circuitry can be realized.

Embodiment 2

Figure 21:
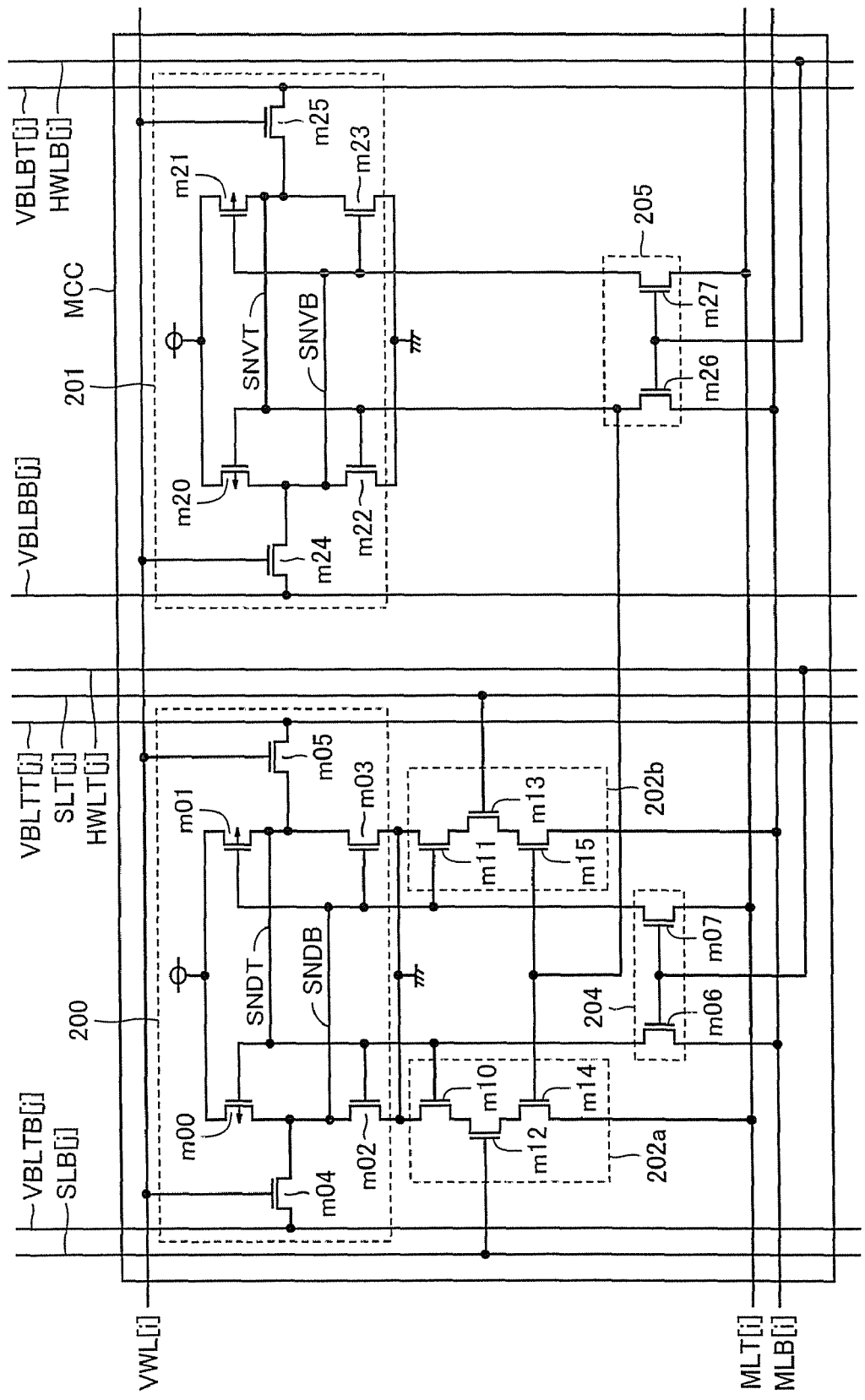
FIG. 21 shows a configuration of a CAM circuit in accordance with Embodiment 2 of the present invention.

FIG. 21 shows a configuration of a memory cell MCC of a semiconductor memory device in accordance with Embodiment 2 of the present invention. Referring to FIG. 21, memory cell MCC includes: an information data storage portion 200 for storing complementary data; a mask data storage portion 201 storing mask data inhibiting writing of data stored in information data storage portion 200 to the memory cell mat in the main processing circuitry; search/read gates 202a and 202b for driving match lines MLT[i] and MLB[i] in accordance with signals on search lines SLB[j] and SLT[j] and the data stored in data storage portion 200; a horizontal write port 204 for coupling storage nodes SNDT and SNDB of data storage portion 200 to match lines MLB [i] and MLT[i], respectively, in accordance with a signal on horizontal word line HWLT[j]; and a horizontal write port 205 for coupling storage nodes SNBT and SNBB of mask data storage portion 201 to match lines MLB[i] and MLT[i], respectively, in accordance with the signal potential on horizontal word line HWLB[j].

Information data storage portion 200 has the same configuration as the first data storage portion of Embodiment 1 shown in FIG. 8 previously described, and therefore, corresponding portions are denoted by the same reference characters and description thereof will not be repeated. In information data storage portion 200, when vertical word line VWL[i] is selected, MOS transistors m04 and m05 for accessing are rendered conductive, storage nodes SNDB and SNDT are coupled to vertical bit lines VBLTB[j] and VBLTT[j], respectively, and vertical data writing or reading is executed.

Mask data storage portion 201 has the same configuration as the second data storage portion 100b shown in FIG. 8 above, and therefore, corresponding portions are denoted by the same reference characters and description thereof will not be repeated. Mask data storage portion 201 differs from the second data storage portion 100b shown in FIG. 8 only in the data stored therein.

Search/read gate 202a includes three N channel MOS transistors m10, m12 and m14 connected in series between the ground node (low-side power supply node) of information storage portion 200 and the match line MLT[i]. MOS transistor m10 has its gate connected to storage node SNDT of data storage portion 200, and MOS transistor m12 has its gate connected to search line SLB[j]. MOS transistor m14 has its gate connected to storage node SNVT of mask data storage portion 201.

Second search/read gate 202b includes N channel MOS transistors m11, m13 and m15 connected in series between the ground node of information data storage portion 200 and match line MLB[i]. MOS transistor m11 has its gate coupled to storage node SNDB of information data storage portion 200, and MOS transistor m13 has its gate coupled to search line SLT[j]. MOS transistor m15 has its gate coupled to storage node SNVT of mask data storage portion 201.

Horizontal write port 204 includes N channel MOS transistors m06 and m07, which are rendered conductive when horizontal word line HWLT[j] is selected and couple storage nodes SNDT and SNDB of information data storage portion 200 to match lines MLB[i] and MLT[i], respectively.

Horizontal write port 205 includes N channel MOS transistors m26 and m27 which are selectively rendered conductive in accordance with signal potential on horizontal word line HWLB[j] and, when made conductive, couple storage nodes SNVT and SNVB of mask data storage portion 201 to match lines MLB[i] and MLT[i], respectively.

Mask data storage portion 201 stores mask data for a write mask, and not stores any data of the object of arithmetic/logic operation. Therefore, horizontal word line HWLB[j] may normally be maintained at the unselected state.

Figure 22:
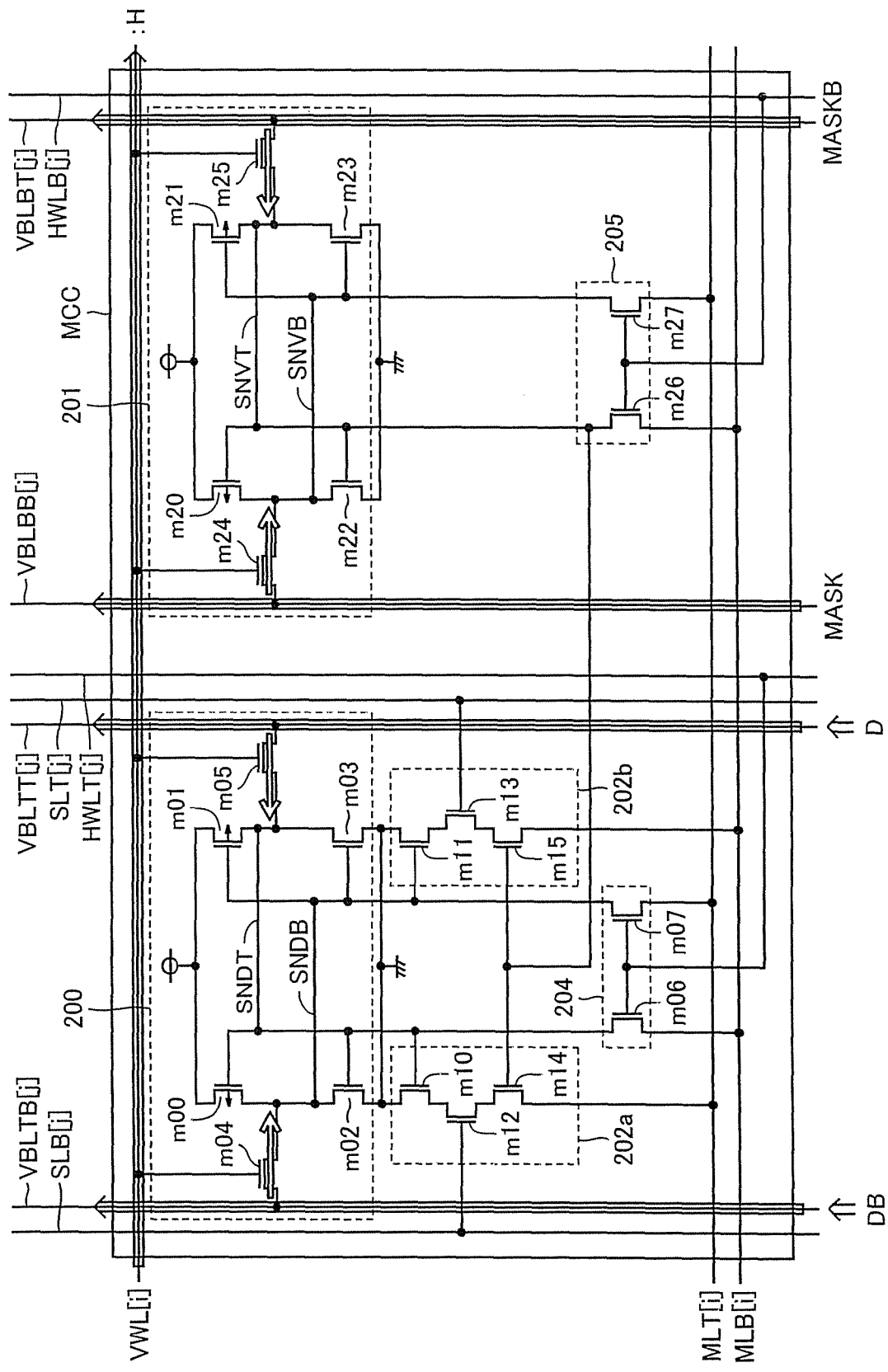
FIG. 22 shows a signal flow at the time of an access to a vertical port of the CAM cell shown in FIG. 21.

FIG. 22 shows a signal flow in data writing from the host CPU to the memory cell MCC shown in FIG. 21. In data writing from the host CPU, vertical word line VWL[i] is driven to the selected state. In information data storage portion 200, complementary data bits DB and D are transmitted to vertical bit lines VBLTB[j] and VBLTT[j], respectively, and through MOS transistors m04 and m05, voltage levels of storage nodes SNDB and SNDT are set in accordance with the transmitted data. In parallel with the data writing operation, in mask data storage portion 201 also, MOS transistors m24 and m25 are rendered conductive, and mask signals MASK and MASKB are transmitted through bit lines VBLBB[j] and VBLBT[j] and stored in storage nodes SNVB and SNVT. In mask data storage portion 201, when the complementary mask signal MASKB stored in storage node SNVT is at the L level, writing of data stored in the information data storage portion is masked.

In data reading to an external host CPU, as in the data writing, vertical word line VWL[i] is driven to the selected state. Here, data read from information data storage portion 200 to bit lines VBLTB[j] and VBLTT[j] are amplified by a sense amplifier circuit to generate the read data. It is not particularly required to transfer the data stored in mask data storage portion 201 to the external CPU. However, a configuration for reading the data stored in mask data storage portion 201 may be provided. By way of example, with a read-modify-write operation, the mask data may be changed, and the state of masking may be externally monitored.

Figure 23:
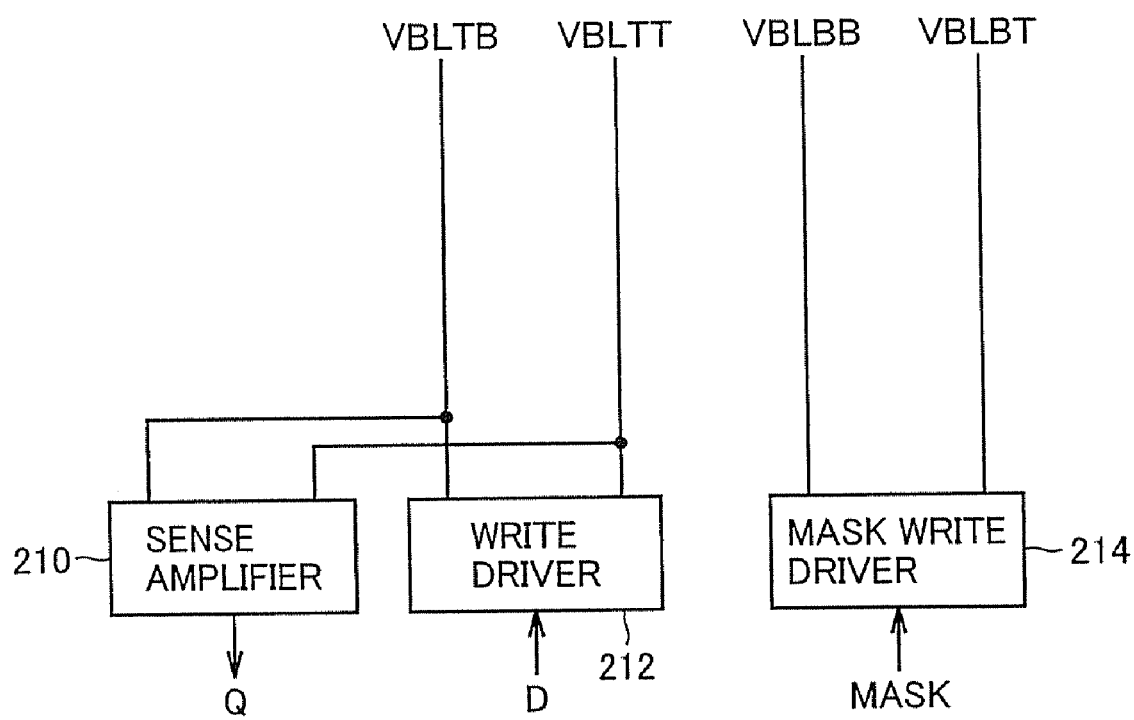
FIG. 23 schematically shows a configuration of a portion driving a vertical bit line pair for the memory cell shown in FIG. 22.

FIG. 23 schematically shows a configuration of a portion related to vertical data writing/reading shown in FIG. 22. The configuration of vertical data writing/reading portion of FIG. 23 corresponds to the configurations of sense amplifier group 94v and write driver group 96v shown in FIG. 7. Referring to FIG. 23, the vertical data writing/reading portion includes: a write driver 212 provided for vertical bit lines VBLTB and VBLTT; a mask write driver 214 provided for bit lines VBLBB and VBLBT; and a sense amplifier 210 provided for bit lines VBLTB and VBLTT.

When activated, write driver 212 transmits complementary data (DB, D) to bit lines VBLTB and VBLTT in accordance with 1 bit data D applied from the host CPU. In data writing, mask write driver 214 generates complementary mask signals (MASK, MASKB) in accordance with the mask signal MASK and transmits these signals to vertical bit lines VBLBB and VBLBT.

When activated, sense amplifier 210 differentially amplifies data on these bit lines VBLTB and VBLTT, and generates read data Q.

A configuration for reading mask data read to vertical bit lines VBLBB and VBLBT may be provided in parallel with sense amplifier 210.

Figure 24:
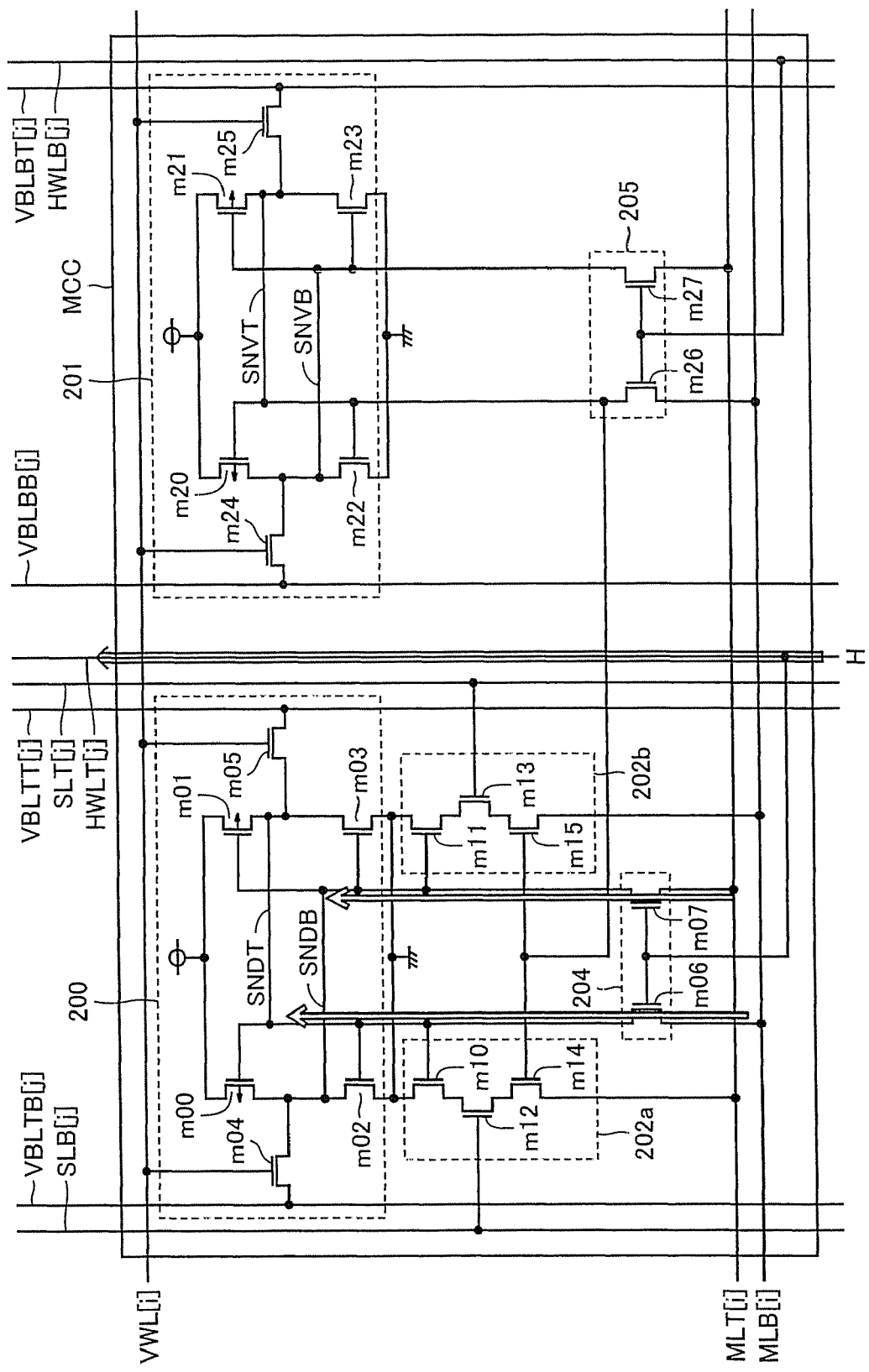
FIG. 24 shows a signal flow at the time of data writing from a horizontal port of the memory cell shown in FIG. 22.

FIG. 24 schematically shows a signal flow at the time of data writing from the memory cell mat of the main processing circuitry, when the memory cell MCC according to Embodiment 2 of the present invention is used. In the horizontal data writing, horizontal word line HWLT[j] is driven to the selected state of H level, and the transfer data from the main processing circuitry is transmitted to match lines MLT[i] and MLB[i], To information data storage portion 200, the transfer data are transferred through MOS transistors m06 and m07 of horizontal write port 204 and stored.

In this writing, horizontal word line HWLB[j] may also be driven to the selected state simultaneously and in parallel, and in mask data storage portion 201, transfer data from the memory cell mat of the main processing circuitry may be stored. In this case, by way of example, information data storage portion 200 and mask data storage portion 201 store the same data. In vertical data reading, the data of data storage portion 200 and the data stored in mask data storage portion 201 are amplified by a first stage of amplifiers, and output signals of the first stage of amplifiers are further amplified by a second stage of amplifiers to generate the final read data.

In the configuration shown in FIG. 24, the manner of connection of the match lines and the corresponding storage nodes in information data storage portion 200 may be made different from that in mask data storage portion 201, so that data complementary to each other (data of opposite logic) are stored in storage portions 200 and 201.

Figure 25:
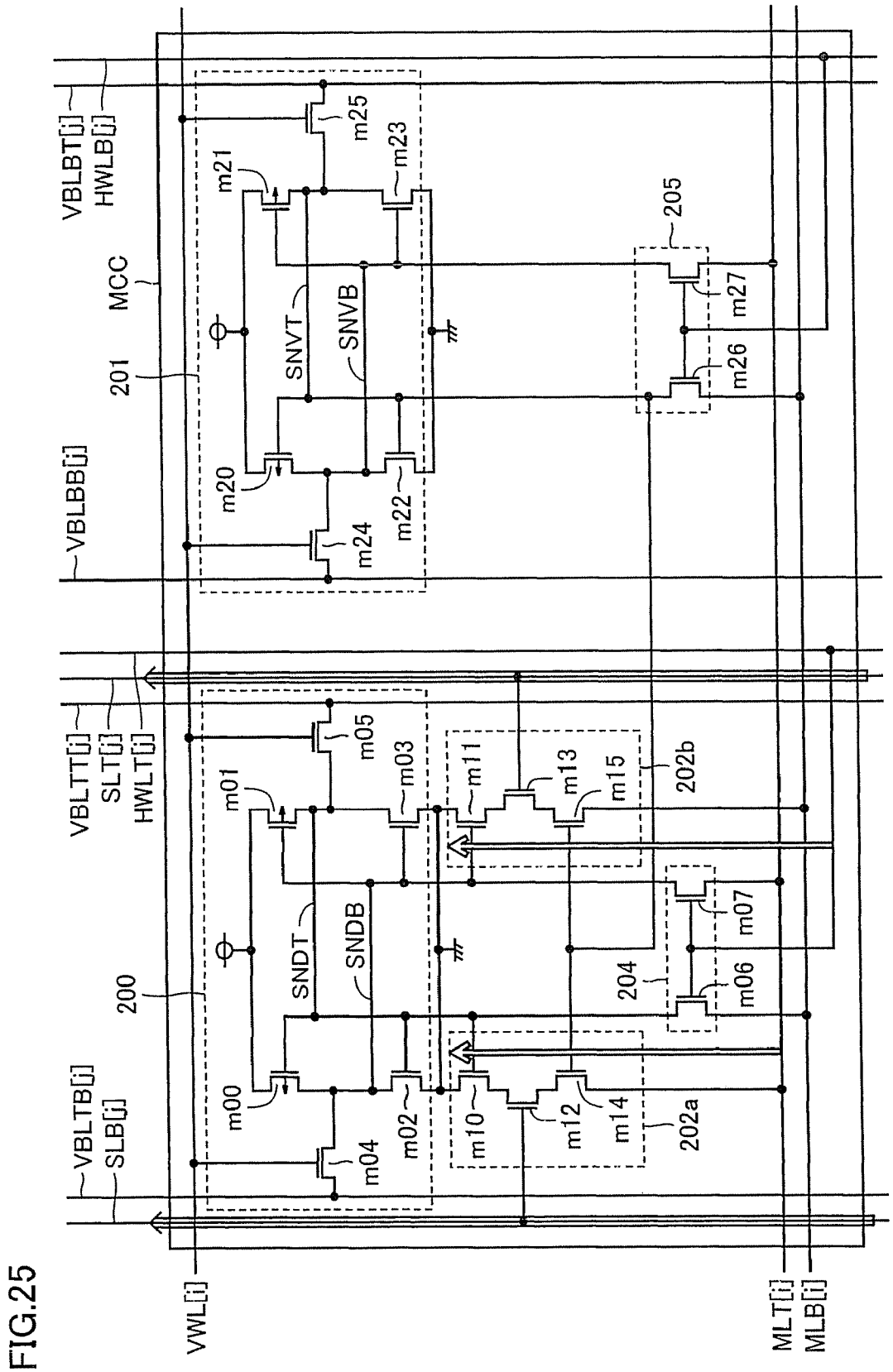
FIG. 25 shows a signal flow at the time of data reading from a horizontal port of the memory cell shown in FIG. 22.

FIG. 25 schematically shows a signal flow at the time of horizontal data reading. At the time of this horizontal data reading, the data stored in the orthogonal memory are transferred to the memory cell mat of the main processing circuitry. In this case, search lines SLB[i] and SLT[i] are driven to the selected state. In response, at search/read gates 202a and 202b, MOS transistors m12 and m13 are rendered conductive. When a signal at the L level is held at the storage node SNVT of mask data storage portion 201, MOS transistors m14 and m15 are non-conductive, and match lines MLT[i] and MLB[i] are maintained at the precharge voltage level of H. When a signal at the H level is held at the storage node SNVT of mask data storage portion 201, MOS transistors m14 and m15 are rendered conductive at search/read gates 202a and 202b. MOS transistors m10 and m11 are selectively rendered conductive in response to the potentials held at storage nodes SNDT and SNDB. Therefore, when signal potential of H level is held at storage node SNDT, MOS transistor m10 is rendered conductive, and match line MLT[i] is discharged to the ground voltage level, so that its voltage level lowers. At this time, MOS transistor m11 is non-conductive, and match line MLB[i] is maintained at the precharge voltage level of H level. Thus, ternary data can be transferred as in Embodiment 1.

As the configuration for performing the horizontal data transfer (write/read), the configuration of Embodiment 1 described with reference to FIG. 19 may be used.

In a search operation, data according to the search data are transmitted to search lines SLB[j] and SLT[j]. Here, in mask data storage portion 201, at the search operation, non-mask data is stored and storage node SNVT is maintained at the H level. Thus, dependent on match/mismatch between the data transmitted to search lines SLB[j] and SLT[j] and the data stored at storage nodes SNDT and SNDB, match lines MLT[i] and MLB[i] are selectively discharged to the ground voltage level.

When the search data and the data stored in information data storage portion 200 have the same logic level, match lines MLT[i] and MLB[i] are both maintained at the H level, that is, the precharge voltage level (data corresponding to external data D is stored at storage node SNDT, data corresponding to complementary external data is stored at storage node SNDB, a search data bit complementary to the search data is transmitted to search line SLB[j] and data of the logic level corresponding to the search data is transmitted to search line SLT[j]).

When not the target of search, search lines SLB[j] and SLT[j] are both maintained at the L level.

In the foregoing, in a search operation, storage node SNVT in mask data storage portion 201 is described as being maintained at the H level so that it has no influence to the searching operation. It is noted, however, that when the write-masked data bit is processed as a data bit that is not the target of search, the search operation may be performed while the write-masked data is held in mask data storing portion 201.

As described above, in the configuration of memory cell MCC in accordance with Embodiment 2 of the present invention, information data storage portion 200 and mask data storage portion 201 are provided separately. Therefore, the data applied from the host CPU can be maintained as the data at information data storage portion regardless of mask and non-mask of writing, and therefore, in data transfer to the memory cell mat of the main processing circuitry, the data that has been transferred from host CPU will not be destructed. By changing the position of the write mask, it is possible to mask writing of data at an arbitrary position (for example, in a unit of byte).

Further, in transferring the data transferred from the main processing circuitry again to the memory cell mat of the main processing circuitry, it is possible to mask data at a desired position (byte unit).

Embodiment 3

Figure 26:
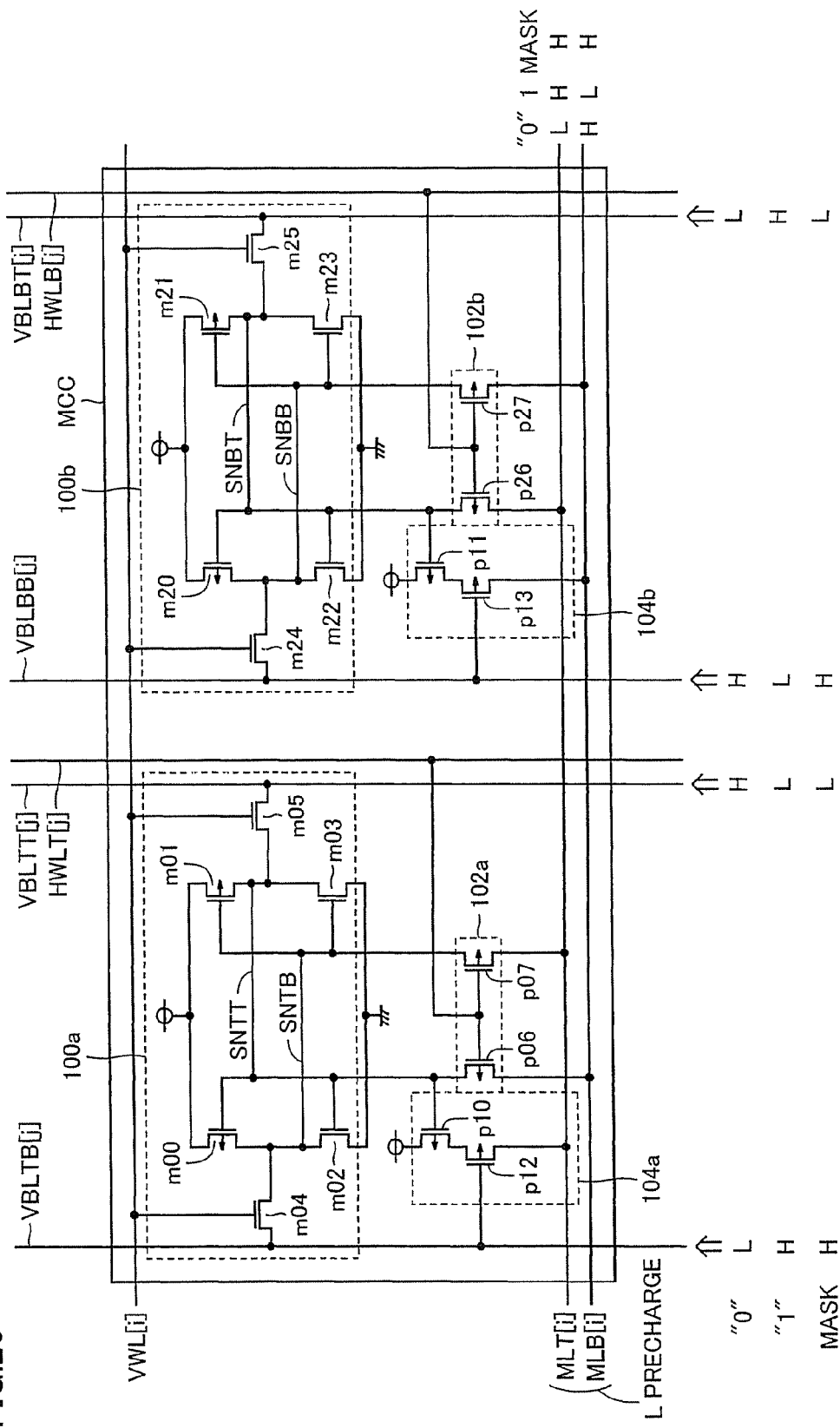
FIG. 26 shows a configuration of a CAM cell in accordance with Embodiment 3 of the present invention.

FIG. 26 shows a configuration of memory cell MCC in accordance with Embodiment 3 of the present invention. Memory cell MCC shown in FIG. 26 differs from the memory cell MCC in accordance with Embodiment 1 shown in FIG. 8 in the following points. Specifically, search/read gates 104a and 104b receive potential on bit lines VBLTB[j] and VBLBB[j] as search data, respectively, and selectively drive match lines MLT[i] and MLB[i] in accordance with the stored data, respectively. Specifically, search lines SLT[j] and SLB[j] are omitted, and bit lines VBLTB[j] and VBLBB[j] are used as the search lines and vertical bit lines. Thus, the number of signal lines for the memory cell MCC can be reduced, the interconnection area of the memory cells can be reduced and the layout area of the memory cell can be reduced.

Configurations of data storage portions 100a and 100b are the same as data storage portions 100a and 100b of memory cell MCC shown in FIG. 8, and therefore, corresponding portions are denoted by the same reference characters and description thereof will not be repeated.

Search/read gate 104a includes P channel MOS transistors p10 and p12 connected in series between a power supply node and match line MLT[i]. Search gate 104b includes P channel MOS transistors p11 and p13 connected in series between a power supply node and match line MLB[i]. MOS transistor p10 has its gate coupled to storage node SNTT of data storage portion 100a, and MOS transistor p12 has its gate coupled to vertical bit line VBLTB[j], MOS transistor p11 has its gate coupled to storage node SNBT of data storage portion 100b, and MOS transistor p13 has its gate coupled to vertical bit line VBLBB[j].

Match lines MLT[i] and MLB[i] are both precharged to the L level, and therefore, in horizontal write ports 102a and 102b, P channel MOS transistors are used. Specifically, horizontal write port 102a includes P channel MOS transistors p06 and p07 rendered conductive in response to a horizontal word line HWLP[j] and coupling storage nodes SNTT and SNTB of data storage portion 100a to match lines MLB[i] and MLT[i], respectively. Horizontal write port 102b includes P channel MOS transistors p26 and p27 coupling storage nodes SNBT and SNBB of data storage portion 100b to match lines MLT[i] and MLB[i], respectively, in response to a signal on horizontal word line HWLB[j].

Bit lines VBLTB[j] and VBLBB[j] are precharged to the H level at the standby state, both in the data access cycle and in the search cycle. Therefore, at search/read gates 104a and 104b, MOS transistors p12 and p13 are maintained non-conductive at the standby state. Further, match lines MLT[i] and MLB[i] are precharged to the L level, and therefore, in order to prevent noise on the match lines from affecting the data held in data storage portions 100a and 100b, horizontal word lines HWLT[j] and HWLB[j] are maintained at the H level in the standby state, using P channel MOS transistors p06, p07, p26 and p27 at horizontal write ports 102a and 102b. Consequently, horizontal write ports 102a and 102b can surely be maintained off, at the standby state.

The data writing and reading operations with the external CPU through the vertical port are the same as those of Embodiment 1 described previously. Therefore, in the following, the data transfer operation though the horizontal port will be described.

Figure 27:
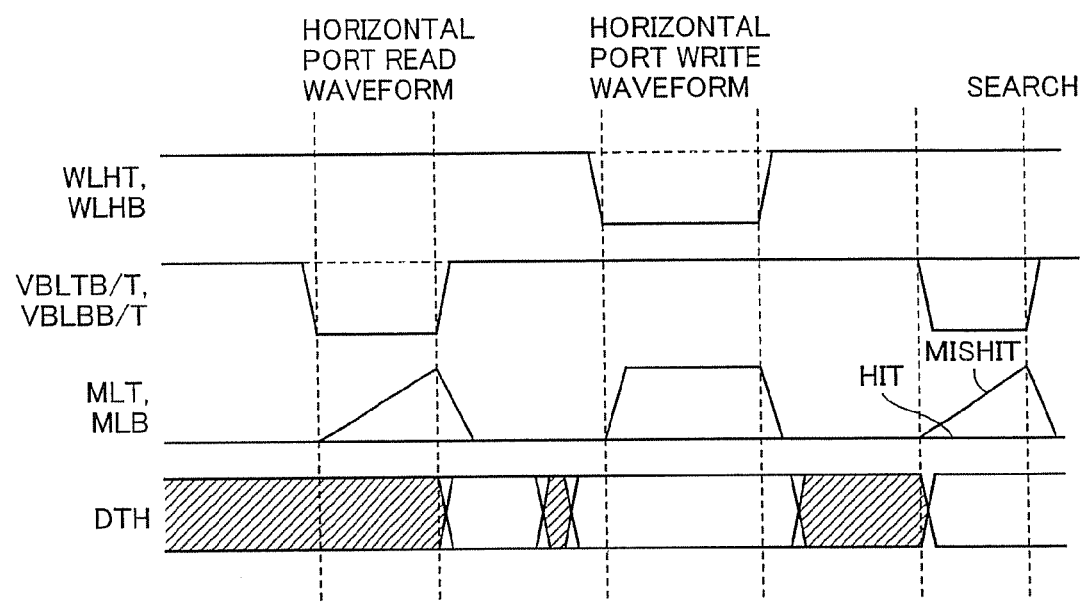
FIG. 27 shows signal waveforms at the time of an access to a horizontal port of the CAM cell shown in FIG. 26.

FIG. 27 shows signal waveforms at the data reading/writing through match lines MLT[i] and MLB[i] of the memory cell shown in FIG. 26. As shown in FIG. 27, bit lines BLTB, BLTT, VBLBB and VBLBT are all precharged to the H level at the standby state. Match lines MLT[i] and MLB[i] are maintained at the L level. Horizontal word lines WLHT and WLHB are maintained at the H level Though not shown in the figure, vertical word line VWL[i] is maintained at the L level.

At the time of reading through the horizontal port, bit lines VBLTB[j], VBLTT[j], VBLBB[j] and VBLBT[j] are driven to the L level. In response, at search/read gates 104a and 104b, MOS transistors p12 and p13 are rendered conductive. The relation between the signal potentials and the data stored in the memory cell MCC is the same as that of Embodiment 1 described previously. Specifically, when data "0" is stored in memory cell MCC, node SNTT is at the H level and storage node SNBT is at the L level. Therefore, at search/read gate 104a, MOS transistor p10 is kept non-conductive, and at search/read gate 104b, MOS transistor p11 is rendered conductive. Accordingly, match line MLT[i] is maintained at the precharge voltage level of L level, and match line MLB[i] is charged to the power supply voltage level through MOS transistor p11 and p13, so that the data "0" is read.

On the contrary, when data "1" is stored in memory cell MCC, at search/read gate 104a, MOS transistors p10 and p12 are both rendered conductive, and at search/read gate 104b, MOS transistor p11 is non-conductive. Therefore, in this state, match line MLT[i] is charged to the power supply voltage level, and match line MLB[i] is maintained at the precharge voltage level of L.

When the write mask data is held in memory cell MCC, storage node SNTT is at the L level and storage node SLBB is also at the L level. Therefore, in this case, at search/read gates 104a and 104b, MOS transistors are all rendered conductive, and match lines MLT[i] and MLB[i] are charged to the power supply voltage level. Thus, as in Embodiment 1 described previously, in the horizontal port reading operation, a ternary data can be read, and thus, the write mask function prohibiting a data write to the memory cell mat of the processing circuit can be realized.

In horizontal port writing, match lines MLT[i] and MLB[i] have their voltage levels set in accordance with the data transferred from the main processing circuitry. For the data writing, bit lines VBLTB[j], VBLTT[j], VBLBB[j] and VBLBT[j] are all maintained at the H level. Horizontal word lines HWLT[j] and HWLB[j] transition from H level to L level, the second port access gates 102a and 102b are rendered conductive, and match lines MLT[i] and MLB[i] are coupled to storage nodes SNTT and SNTB of data storage portion 100a, respectively. In data storage portion 100b, storage node SNBT is coupled to match line MLT[i], and storage node SNBB is coupled to match line MLB[i]. Therefore, in data storage portions 100a and 100b, complementary data can be held, that is, binary data can be stored.

At the time of a search operation, when not the target of search, a signal at the H level is transmitted to each vertical bit line, search/read gates 104a and 104b are rendered non-conductive, and hence, there is no influence on the potentials of match lines MLT[i] and MLB[i].

When it is the target of search, a signal corresponding to the search data is transmitted to the vertical bit lines. As can be seen from the relation between the data and the signal potentials shown in FIG. 26, when the search data matches the data stored in the memory cell MCC (hit), in each of search/read gates 104a and 104b, one MOS transistor is rendered non-conductive and match lines MLT[i] and MLB[i] are maintained at the precharge voltage level of L level. On the contrary, when the search data does not match the stored data (mishit), in either one of search/read gates 104a and 104b, series-connected MOS transistors are both rendered conductive, and match lines MLT[i] and MLB[i] are charged to the H level (power supply voltage level). Thus, the search operation is realized.

Figure 28:
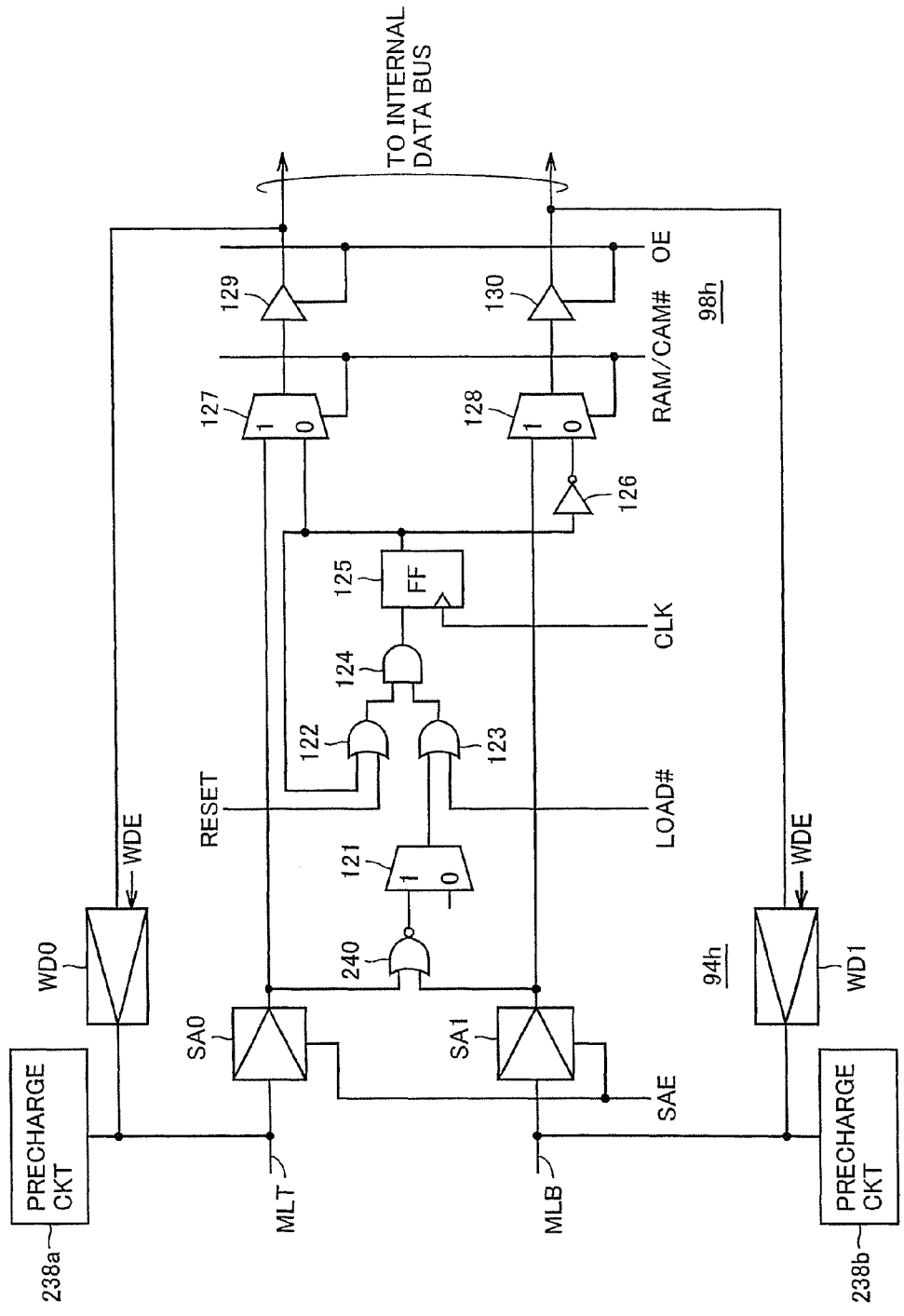
FIG. 28 schematically shows configurations of the horizontal port, a sense amplifier and a write driver, when the CAM cell shown in FIG. 26 is used.

FIG. 28 shows exemplary configurations of the sense amplifier group, write driver group and input/output circuit of the horizontal port in accordance with Embodiment 3 of the present invention. The configuration of horizontal access port (sense amplifier, write driver and input/output circuit) shown in FIG. 28 differs from that of Embodiment 1 shown in FIG. 17 in the following points. Specifically, in place of the AND circuit receiving the output signals of sense amplifiers SA0 and SA1, an NOR circuit 240 is provided, and the output signal of NOR circuit 240 is applied to OR circuit 123 through selector 121.

For match lines MLT and MLB, precharge circuits 238a and 238b for precharging the match lines to the ground voltage level at the standby state are provided (in Embodiment 1, circuits for precharging to the power supply voltage are provided).

Except for this point, the configuration of horizontal access port shown in FIG. 28 is the same as that shown in FIG. 17, and therefore, corresponding portions are denoted by the same reference characters and description thereof will not be repeated.

When there is a match during the search operation, match lines MLT and MLB are both kept at the L level, and therefore, the output signal of NOR circuit 240 attains to the H level. When there is a mismatch during the search operation, one of the match lines MLT and MLB attains to the H level, and in response, the output signal of NOR circuit 240 attains to the L level. By using NOR circuit 240, the logic level of the signal indicating match/mismatch during the search operation can be made the same as in Embodiment 1.

As to the logic level of the read data, the circuit configuration is the same as that of Embodiment 1 and, therefore, a signal of the same logic level can be transferred as the read data.

When AND circuit (120) shown in FIG. 17 is used without using NOR circuit 240, the logic level of the signal representing the result of match/mismatch determination can be made the same as in Embodiments 1 and 3 by providing inverter circuit 126 corresponding not to selector 128 but to selector 127.

When the configuration shown in FIG. 17 is used, an inverting amplifier may be used as sense amplifiers SA0 and SA1.

When a circuit for adjusting logic level of the result of match/mismatch determination on the search result is provided on the side of main processing circuitry, there is no problem even if the signals representing the search result output from the orthogonal memory differ in Embodiments 1 and 3, and the configuration shown in FIG. 28 may be used in place of the configuration shown in FIG. 17 of Embodiment 1 (precharge circuits 248a and 248b precharge to the power supply voltage level).

Figure 29:
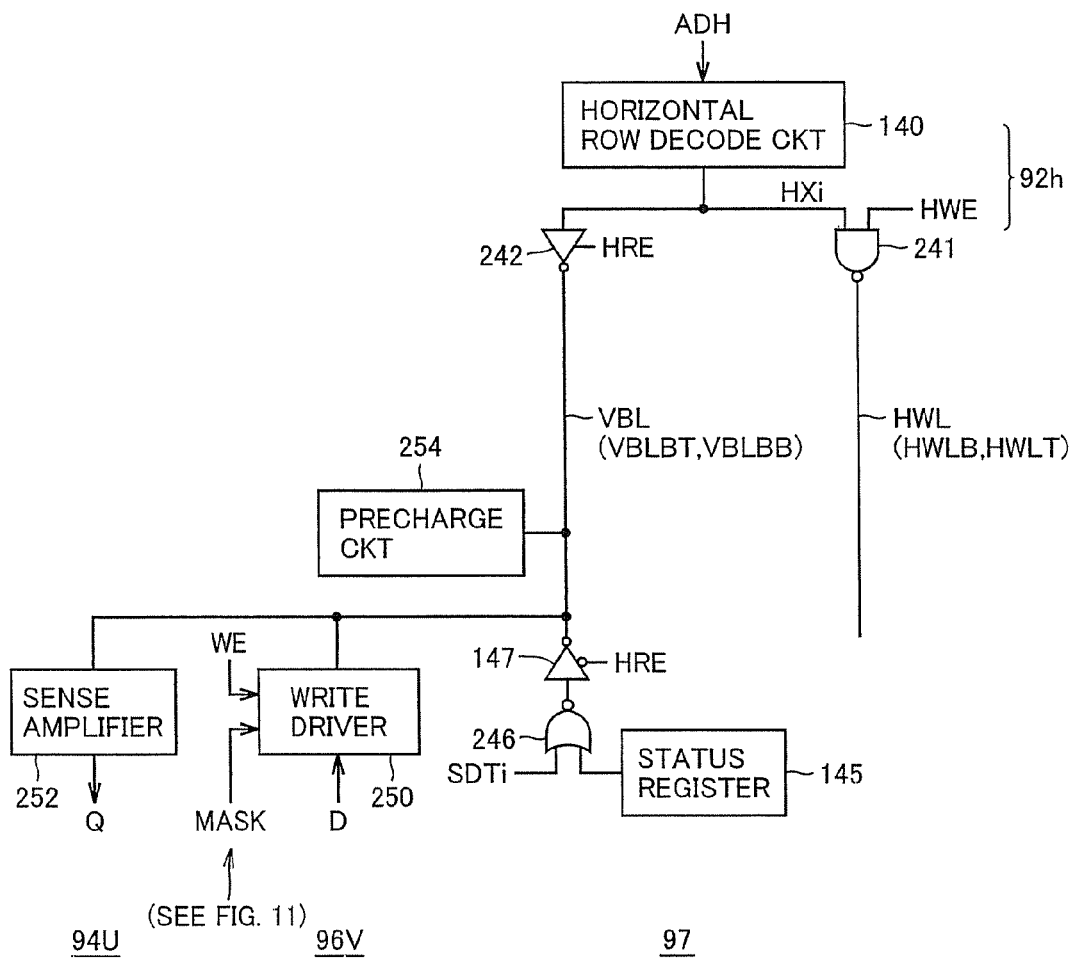
FIG. 29 schematically shows a configuration of a portion driving a vertical bit line and a horizontal word line, when the CAM cell shown in FIG. 26 is used.

FIG. 29 schematically shows a configuration of a portion driving the vertical bit line VBL (VBLTB, VBLTT, VBLBT, VBLBB) and the horizontal word line HWLT (HWLB) of the semiconductor memory device in accordance with Embodiment 3 of the present invention. Referring to FIG. 29, row decoder 97h includes a horizontal row decode circuit 140 for decoding the horizontal address signal ADH. Horizontal row decode circuit 140 is provided corresponding to each row (column) of memory cells aligned in the vertical direction, and when the corresponding memory cells aligned in the vertical direction are selected, it drives the horizontal row selection signal HXi to the H level.

For the horizontal word line HWL, an NAND circuit 241 receiving the horizontal row selecting signal HXi and a horizontal write instruction signal HWE is provided. For the bit line VBL, a tri-state buffer 242 activated in response to the activation of a horizontal read instruction signal HRE and inverting horizontal row selecting signal HXi to drive bit line VBL is provided. Therefore, at the time of access to the horizontal port, the vertical bit line VBL and the horizontal word line HWL are driven to the L level, when selected.

For the vertical bit line VBL, there are provided a status register 145 storing data indicating target/non-target of a search operation, an NOR gate 246 receiving a data bit stored in status register 145 and a search data bit SDTi, and a tri-state inverter buffer 147 activated when the horizontal read instruction signal HRE is inactivated and driving the bit line VBL in accordance with an output signal of NOR gate 246.

For the vertical bit line VBL, a sense amplifier 252 and a write driver 250 are further provided. Sense amplifier 252 is included in sense amplifier group 94v shown in FIG. 7 previously described, and write driver 250 is included in write driver group 96v shown in FIG. 7. Write driver 250 is configured such that it attains to the output high impedance state when the write instruction signal WE is inactivated, and drives the vertical bit line VBL in accordance with the mask instruction signal MASK and the write data D when the write instruction signal WE is activated. The configuration of write driver 250 corresponds to the configuration shown in FIG. 11, for example, with the output portion performing a clock operation in accordance with the write instruction signal WE (performs a ternary value operation including the output high impedance state).

For the vertical bit line VBL, a bit line precharge circuit 254 for precharging the vertical bit line VBL to the power supply voltage level at the standby state is further provided. Bit line precharge circuit 254 is also provided in Embodiments 1 and 2.

By utilizing the peripheral circuitry shown in FIG. 29, the bit line VBL can be used as a data transfer line of the vertical port and as a search data transmitting line at the time of searching. Further, it can also be used as a read word line at the time of horizontal port data reading.

As described above, according to Embodiment 3 of the present invention, in the memory cell, the search line serving as the horizontal port read line is also used as the vertical bit line serving as the write/read data transmitting line at the time of vertical port data access, and the occupation area of the memory cell can be reduced. Further, in the memory cell, MOS transistors forming the data storage portion and the transistors forming the read/search gate at the time of horizontal port access are adapted to have different conductivity types, and therefore, even when the vertical bit line is precharged to the same voltage level (power supply voltage level) at the time of searching, reading and writing, the data stored in the data storage portion or the data representing the search result can correctly be transmitted to the match lines.

Further, as in Embodiments 1 and 2, the search result may be used as information representing whether an arithmetic/logic operation should be done by the arithmetic logic unit of the main processing circuitry, and as the ternary data can be transferred using two data storage portions, the write mask function can be realized.

Embodiment 4

Figure 30:
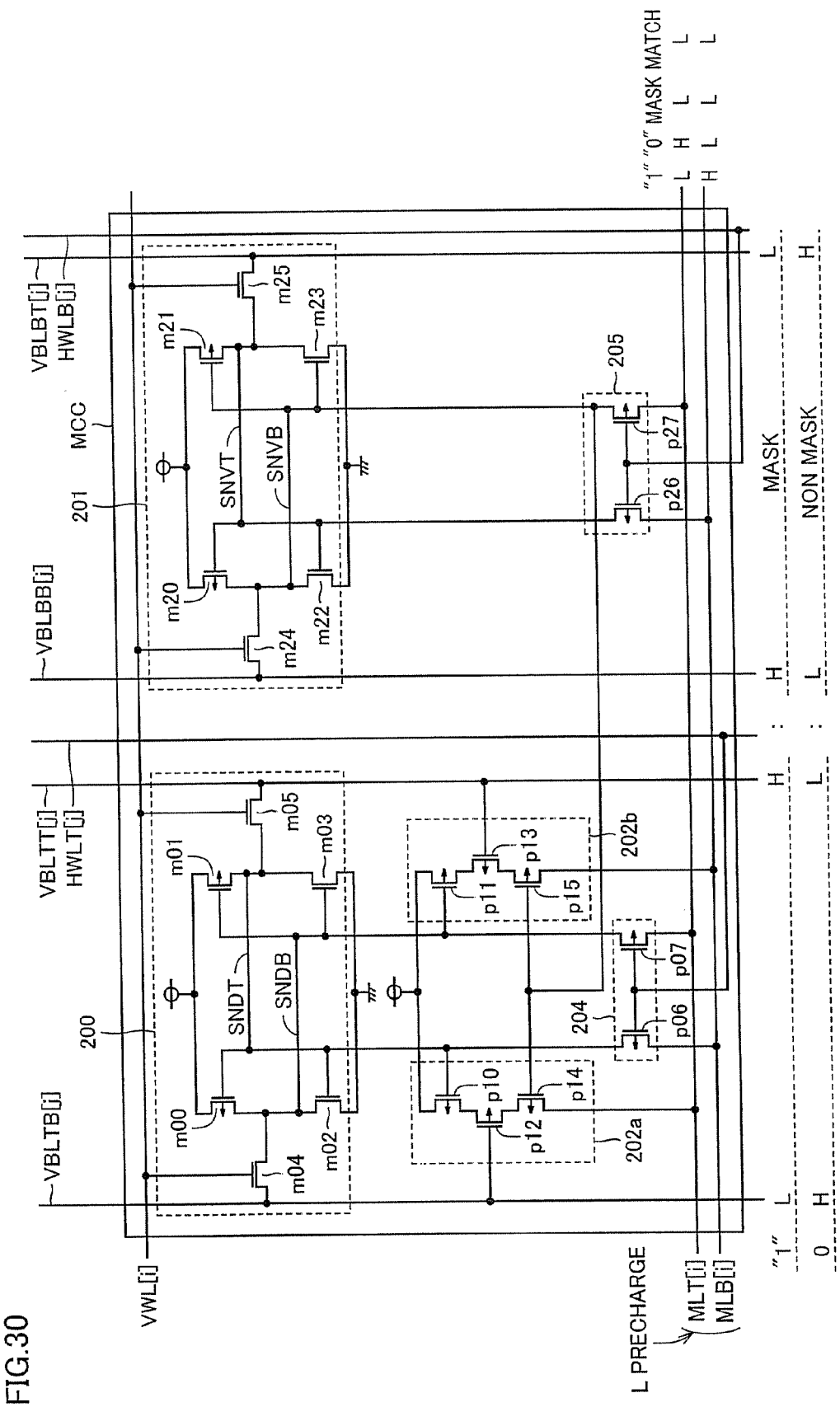
FIG. 30 shows a configuration of a CAM cell in accordance with Embodiment 4 of the present invention.

FIG. 30 shows a configuration of memory cell MCC of the orthogonal memory in accordance with Embodiment 4. The configuration of memory cell MCC shown in FIG. 30 is different from the memory cell shown in FIG. 25 in the following points. Specifically, bit lines VBLTB[j] and VBLTT[j] are also used as search lines SLB[j] and SLT[j]. Further, search/read gates 202a and 202b are formed of P channel MOS transistors, rather than N channel MOS transistors, and horizontal write ports 204 and 205 are formed of P channel MOS transistors. Information data storage portion 200 and mask data storage portion 201 have the same configurations as those shown in FIG. 25 and, therefore, corresponding portions are denoted by the same reference characters and description thereof will not be repeated.

Specifically, search/read gate 202a includes P channel MOS transistors p10, p12 and p14 connected in series between the power supply node and match line MLT[i], and search/read gate 202b includes P channel MOS transistors p11, p13 and p15 connected in series between the power supply node and match line MLB[i].

MOS transistors p10 and p11 have their gates coupled to storage nodes SNDT and SNDB of information data storage portion 200, respectively. MOS transistors p12 and p13 have their gates coupled to bit lines VBLTB[j] and VBLTT[j], respectively. MOS transistors p14 and p15 have their gates coupled to storage node SNVB of mask data storage portion 201.

Horizontal write port 204 includes P channel MOS transistors p06 and p07 coupling storage nodes SNDT and SNDB of information data storage portion 200 to match lines MLB[i] and MLT[i], respectively, in accordance with horizontal word line HWLT [j].

Horizontal write port 205 includes P channel MOS transistors p27 and p26 selectively rendered conductive in accordance with a signal on horizontal word line HWLB[j] and when made conductive, to couple match lines MLT[i] and MLB[i] to storage nodes SNVB and SNVT of mask data storage portion 201, respectively.

Match lines MLT[i] and MLB[i] are precharged to the L level.

In the configuration of memory cell MCC shown in FIG. 30 also, information data storage portion 200 and mask data storage portion 201 are provided separately, and the information data and the mask data can be set almost individually.

Therefore, when mask data is set, it is possible to perform an arithmetic/logic operation in the main processing circuitry, with the mask position changed to an arbitrary position (in byte unit) for the same data item, without destroying the information data.

At the time of a vertical port access, vertical word line VWL[j] is driven to the selected state. Horizontal word lines HWLT[j] and HWLB[j] are maintained at the unselected state (H level). When data "1" is to be written, signals at the L level and H level are respectively transmitted to bit lines VBLTB[j] and VBLTT[j]. Consequently, at information data storage portion 200, storage node SNDB is set to the L level and storage node SNDT is set to the H level. When data "0" is to be written, bit lines VBLTB[j] and VBLTT[j] are set respectively to the H level and L level, and at information data storage portion 200, storage nodes SNBT and SNDB are set to the L level and H level, respectively.

When data to be write-masked is stored in mask data storage portion 201, signals at the H level and L level are transmitted respectively to bit lines VBLBB[j] and VBLTB[j], and storage nodes SNVT and SNVB are set to the L level and H level, respectively. For the non-mask operation without write-mask, signals at the L level and H level are transmitted to bit lines VBLBB[j] and VBLBT[j], respectively, and storage nodes SNVT and SNVB are set to the H level and L level, respectively.

In data reading through the horizontal port, horizontal word lines HWLT[j] and HWLB[j] are both maintained at the H level. Signal waveforms in data writing/reading through the horizontal port are the same as those shown in FIG. 27. Bit lines VBLTB[j] and VBLTT[j] are driven to the L level, and search/read gates 202a and 202b are rendered conductive. When not write-masked, storage node SNVB of mask data storage portion 201 is at the L level and, in response, MOS transistors p14 and p15 are rendered conductive at search/read gates 202a and 202b. Therefore, potentials of which logic levels are inversions of the potentials held at storage nodes SNDT and SNDB of information data storage portion 200 are transmitted to match lines MLT[i] and MLB[i]. Specifically, when data "1" is stored in information data storage portion 200, match line MLB[i] is driven to the H level and match line MLT[i] is maintained at the precharge voltage level. When data "0" is held in information storage portion 200, match line MLT[i] is charged to the power supply voltage level by MOS transistor p10, and match line MLB[i] is maintained at the precharge voltage level of L level.

When there is a write-mask, storage node SNVB of mask data storage portion 201 is at the H level, MOS transistors p14 and p15 at search/read gates 202a and 202b are non-conductive, and match lines MLT[i] and MLB[i] are maintained at the precharge voltage level of L level.

At the time of a search operation, signals in accordance with the search data are transmitted to bit lines VBLTB[j] and VBLTT[j]. When the data bit held and stored in information data storage portion 200 matches the search data bit, one of the MOS transistors is rendered non-conductive at each of search/read gates 202a and 202b, and match lines MLB[i] and MLT[i] are maintained at the precharge voltage level of L level. When the search data bit does not match the data bit held in information data storage portion 200, the series of transistors is rendered conductive in one of search gates 202a and 202b, and the corresponding search line is charge to the H level.

In the search operation, even when the data held in mask data storage portion 201 is set to the non-mask designating state, the data held in information data storage portion 200 can be set as the data bit other than the target of search, by setting bit lines VBLTB[j] and VBLTT[j] both to the H level. Alternatively, by writing a mask instruction data to mask data storage portion 201, the memory cell MCC may be set as the bit that is not the target of search.

Therefore, when mask data storage portion 201 is used as a portion for storing a bit designating search target/non-target for the search operation, it becomes possible to selectively set a bit as a target of searching, by setting bit lines VBLTB[j] and VBLTT[j] to voltage levels according to a search data, in accordance with the external search data. Therefore, ternary driving of the bit line pair to set a search non-target designating bit is unnecessary, and hence, the configuration of the bit line driving portion can be simplified.

For the search, the following operation is also possible. By driving the horizontal word line HWLB[j] to the selected state, transmitting a bit that designates non-target of search through match lines MLT[i] and MLB[i] from the main processing circuitry and setting the bit in mask data storage portion 201 through horizontal write port 205, a data bit at a desired position can be set as the target/non-target designating bit of search, in accordance with the contents of arithmetic/logic operation of the main processing circuitry (by a controller (21) in the basic operation block, target/non-target of search can be set).

In data writing through the horizontal port, horizontal word line HWLT[j j] is driven to the L level, horizontal write port 204 is rendered conductive, and storage nodes SNBT and SNDB of information data storage portion 200 are connected to match lines MLB[i] and MLT[i], respectively, whereby the data transferred from the memory cell mat of the main processing circuitry can be written to information data storage portion 200.

As shown in FIG. 30, logic levels of signal potentials on match lines MLT[i] and MLB[i] at the time of data reading are opposite to the signal potentials of Embodiment 3 shown in FIG. 26. It is noted, however, that the configuration of horizontal access port shown in FIG. 28 can be utilized, provided that the logic level of write data transmitted from the vertical port through vertical bit lines VBLBT[j] and VBLBB[j] matches the logic level of transfer data transmitted through match lines MLT[i] and MLB[i].

Further, even when match lines MLT[i] and MLB[i] are both set to the L level at the time of a write mask indication, by using a configuration of inverting a control signal at the input interface portion of the main processing circuitry, an H level signal can be transmitted to the complementary bit lines for the memory cell mat of the main processing circuitry, and hence, a write mask is realized.

Therefore, as regards the consistency of logic levels of the signals, what is necessary is that inversion/non-inversion of signals is set to achieve consistency in the logic level at the interface portion between the orthogonal memory and the memory cell mat of the main processing circuitry, and at the interface portion between the orthogonal memory and the host CPU.

As described above, in accordance with Embodiment 4 of the present invention, the search lines are also used as the vertical bit lines, and therefore, the number of signal lines for the memory cell can be reduced, and the layout area of signal lines for the memory cells can be reduced.

As in Embodiment 2, the mask data storage portion and the information data storage portion are provided separately from each other, and therefore, the write mask data can be set without destructing the information data. Further, as the mask data storage portion is used as an area for storing data designating the search target bit position, the configuration of the search data driving portion can be simplified.

Embodiment 5

Figure 31:
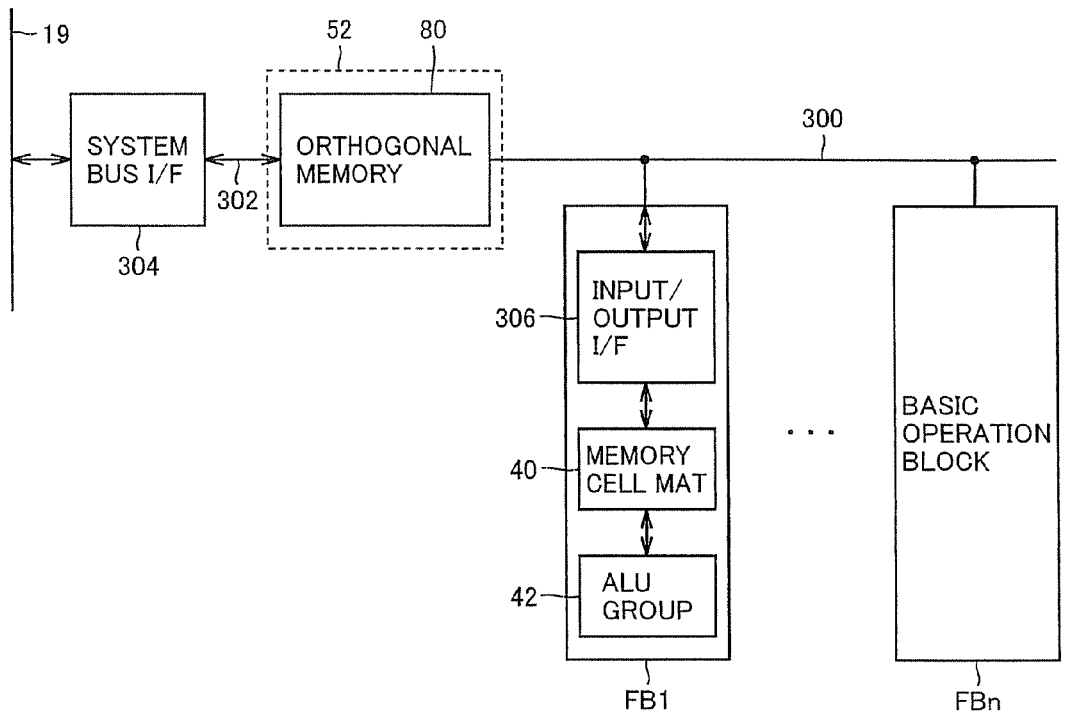
FIG. 31 schematically shows a configuration of a semiconductor signal processing system in accordance with Embodiment 5 of the present invention.

FIG. 31 schematically shows a configuration of a main portion of a semiconductor signal processing device in accordance with Embodiment 5 of the present invention. In the semiconductor signal processing device shown in FIG. 31, basic operation blocks FB1 to FBn are commonly coupled to global data bus 300. Basic operation blocks FB1 to FBn have the same configuration and, in FIG. 31, the configuration of a main portion of basic operation block FB1 is schematically shown. Basic operation block FB1 includes, as shown previously in FIG. 2, a memory cell mat 40 divided into a plurality of entries, a group of arithmetic logic units (ALU group) 42 including arithmetic logic units (ALUs) arranged correspondingly to the entries of memory cell mat 40, and an input/output interface (I/F) 306 for inputting/outputting data between memory cell mat 40 and global data bus 300. Though not shown in FIG. 31, a sense amplifier group and a write driver group for data transfer to/from the group of arithmetic logic units 42 are provided, for memory cell mat 40.

For global data bus 300, orthogonal transformation circuit 52 is provided, which circuit is coupled through internal main bus 302 to system bus I/F 304. The system bus I/F 52 is coupled to internal system bus 19. As shown previously in FIG. 1, peripheral devices such as host CPU are coupled to system bus 19.

In orthogonal transformation circuit 52, orthogonal memory 80 described in Embodiments 1 to 4 above is provided, which converts data arrangement between system bus 19 and global data bus 300.

In the configuration shown in FIG. 31, orthogonal memory 80 is provided commonly to a plurality of basic operation blocks FB1 to FBn. It is unnecessary to arrange orthogonal memory 80 in each of the basic operation blocks FB1 to FBn, and therefore, chip area of the semiconductor signal processing device can be reduced.

In the configuration shown in FIG. 31, a central control unit may be provided common to basic operation blocks FB1 to FBn, and a control key may be passed from an external host CPU to the central processing unit, for controlling the arithmetic/logic operation by basic operation blocks FB1 to FBn. In this case also, a controller (21) is provided in basic operation blocks FB1 to FBn to control the internal operation thereof.

[Modification]

Figure 32:
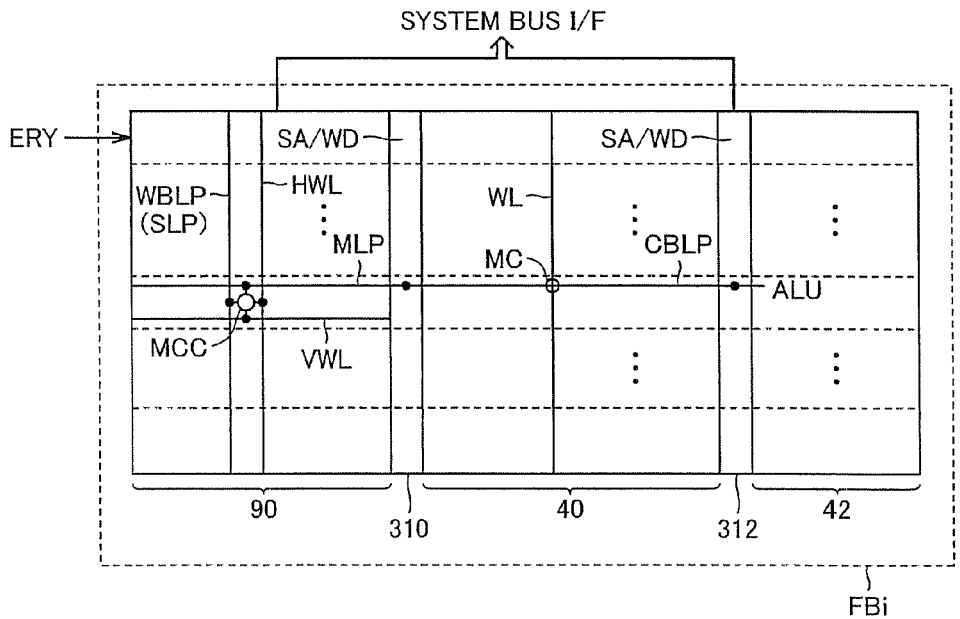
FIG. 32 schematically shows a configuration of a memory mat of main processing circuitry in accordance with a modification of Embodiment 5 of the present invention.

FIG. 32 shows a configuration of a modification of the semiconductor signal processing device in accordance with Embodiment 5 of the present invention. In FIG. 32, a configuration of a main portion of one basic operation block FBi is shown. Basic operation block FBi includes memory cell mat 40 divided into a plurality of entries, and a group of arithmetic logic units 42 including arithmetic logic units (ALUs) provided corresponding to respective entries of memory cell mat 40. Between memory cell mat 40 and the group of arithmetic logic units 42, a sense amplifier group/write driver group 312 including sense amplifiers (SA) and write drivers (WD) is arranged. A set of sense amplifier (SA) and write driver (WD) is provided corresponding to each entry ERY of memory cell mat 40.

Adjacent to memory cell mat 40, an orthogonal memory cell mat 90 is provided Memory cell mat 90 is also divided into entries in correspondence to entries ERY of memory cell mat 40, and for each entry, a match line pair MLP and a vertical word line VWL are provided. In the vertical direction of memory cell mat 90, a vertical bit line pair VBLP and a horizontal word line HWL are provided. In FIG. 32, vertical bit line pair VBLP is shown as also serving as search line pair SLP in memory cell mat 90. The vertical bit line pair VBLP and search line pair SLP may be provided separately, and as the configuration of memory cell mat 90, the configuration of memory mat described in Embodiments 1 to 4 may be used.

In orthogonal memory cell mat 90, memories (CAM cells) MCC are arranged in a matrix of rows and columns, and match line pair MLP of memory cell mat 90 is arranged and coupled to a corresponding bit line pair CBLP of memory cell mat 40. Between memory mats 90 and 40, a sense amplifier group/write driver group 310 of sense amplifiers (SA) and write drivers (WD) for writing/reading data to/from orthogonal memory cell mat 90 is provided.

In the configuration shown in FIG. 32, orthogonal memory cell mat 90 and memory cell mat 40 storing the data for arithmetic/logic operation are arranged adjacent to each other, and match line pair MLP and bit line pair CBLP are commonly coupled through sense amplifier group/write driver group 310. Therefore, interconnection distance between orthogonal memory cell mat 90 and memory cell mat 40 storing data for arithmetic/logic operation is short, enabling high speed data transfer.

Further, it is unnecessary to arrange the orthogonal memory and the memory for arithmetic/logic operation in separate areas and to connect these memories with each other, and therefore, the occupation area of the basic operation blocks can be reduced.

When the basic operation block FBi shown in FIG. 32 is used, the system configuration is given as shown in FIG. 1, and memory cell mats 90 and 40 are coupled to the system bus interface through respective interface circuits (input/output circuits).

In the configuration of basic operation block FBi shown in FIG. 32, at the time of data transfer between orthogonal memory cell mat 90 and memory cell mat 40, sense amplifier group/write driver group 310 is used, and at the time of data transfer between the group of arithmetic logic units 42 and memory cell mat 40, sense amplifier group/write driver group 312 is used.

In orthogonal memory cell mat 90, for setting an operation mask, in which a search operation is performed and an arithmetic/logic operation is executed by an arithmetic logic unit (ALU) in the group of arithmetic logic units 42 only on the matched or unmatched entry in accordance with the search result, a sense amplifier in sense amplifier group/write driver group 312 is activated, and the match detection result (signal on match line pair MLP) is stored in the mask data register of arithmetic logic unit (ALU).

As described above, according to Embodiment 5 of the present invention, the orthogonal memory for performing orthogonal transformation is provided common to a plurality of basic operation blocks, or arranged adjacent to a memory cell mat of one basic operation block on the same memory array, and hence, the orthogonal transformation circuit can be arranged at a desired position in accordance with the system configuration. When the orthogonal memory constituting the orthogonal transformation circuit is arranged common to the plurality of basic operation blocks, the chip area of the system can be reduced, and when a memory cell mat of one basic operation block is arranged adjacent thereto, data transfer between the orthogonal memory and the memory cell mat in the main processing circuitry of the basic operation block can be done at high speed.

The CAM cell according to the present invention has the orthogonal transformation function, and when applied to a semiconductor signal processing device having a memory cell mat and the arithmetic/logic processing function, efficient and high-speed data transfer becomes possible between an external host CPU and the basic operation block.

The configuration of the CAM cell (semiconductor memory device) according to the present invention, however, may simply be applied to achieve orthogonal transformation (for example, as a memory for transposing rows and columns for matrix operation), and it realizes high-speed transposing operation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor signal processing device comprising:
a first processing unit;
an internal bus; and
a plurality of operation units each comprising a memory unit, an operational block, an interface circuit, and an operational control unit,
wherein said first processing unit issues an instruction to said operation units via said internal bus,
wherein said memory unit includes a data rearranging memory mat, and receives data from said interface circuit, stores said data to said data rearranging memory mat in a first direction, reads rearranged data from said data rearranging memory mat in a second direction crossing said first direction, and provides said rearranged data to said operational block, and comprising:
a first word line;
a second word line arranged crossing said first word line;
a bit line pair arranged crossing said first word line;
a search line pair arranged parallel to said bit line pair;
a match line pair arranged crossing said bit line pair; and
a memory cell including a data storage portion for storing data and a search/read portion for driving said match line pair in accordance with signals on said search line pair and the data stored in said data storage portion, said data storage portion communicating data with said bit line pair when said first word line is selected, and said search/read portion reading the data stored in said data storage portion to said match line pair when said search line pair is selected;
wherein said operational block includes a memory array for storing said rearranged data provided from said memory unit and divided into plural entries, and a plurality of processing elements each of which corresponds to an entry of said memory array, and
wherein plural processing elements perform an operation instructed by said operational control unit using data provided from a first selected memory cell in corresponding entries in parallel and a stores result of said operation into a second selected memory cell in said corresponding entries in parallel,
wherein said memory array selects a first word line for activating said first selected memory cell of all entries, and selects a second word line for activating said second selected memory cell of all entries.

2. The semiconductor signal processing device according to claim 1, wherein said data storage portion includes a first data storage portion for storing complementary data, and a second data storage portion provided separate from said first data storage portion and storing complementary data; and
wherein said search/read portion has a first search/read gate selectively driving a first match line of said match line pair in accordance with a signal potential of a first search line of said search line pair and the data stored in said first data storage portion, and a second search/read gate selectively driving a second match line of said match line pair in accordance with the data stored in said second data storage portion and a signal potential of a second search line of said search line pair.

3. The semiconductor signal processing device according to claim 2, wherein ternary data of 1 bit is stored by using the data stored in the first and second data storage portions, and data writing at a destination receiving data of said match line pair is inhibited by storage data that sets the match lines of said match line pair to the same signal potential.

4. The semiconductor signal processing device according to claim 1, wherein said data storage portion stores complementary data signals as storage of data of 1 bit; and said memory cell further includes a mask data storage portion arranged separate from said data storage portion and storing mask data for masking a driving operation of said match line pair to be performed by said search/read portion in accordance with the data signals stored in said data storage portion.

5. The semiconductor signal processing device according to claim 4, wherein said bit line pair includes a first bit line pair provided for said data storage portion and a second bit line pair provided for said mask data storage portion; and said mask data storage portion stores, as said storage data, data transmitted through said second bit line pair, when said first word line is selected.

6. The semiconductor signal processing device according to claim 1, wherein said memory unit further comprises:
a sense circuit for amplifying respective data on match lines of said match line pair;
a gate circuit for detecting a match between logic levels of output signals from said sense circuit; and
an internal transfer circuit for selecting one of the output signals of said sense circuit and an output signal of said gate circuit and transferring a selected signal as internal data.

* * * * *